US008003449B2

(12) United States Patent
Akimoto et al.

(10) Patent No.: US 8,003,449 B2
(45) Date of Patent: Aug. 23, 2011

(54) METHOD OF MANUFACTURING A SEMICONDUCTOR DEVICE HAVING A REVERSE STAGGERED THIN FILM TRANSISTOR

(75) Inventors: Kengo Akimoto, Kanagawa (JP); Hotaka Maruyama, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 432 days.

(21) Appl. No.: 11/284,445

(22) Filed: Nov. 22, 2005

(65) Prior Publication Data

US 2006/0292726 A1    Dec. 28, 2006

(30) Foreign Application Priority Data

Nov. 26, 2004 (JP) ................. 2004-343132

(51) Int. Cl.
*H01L 21/00* (2006.01)
*H01L 21/84* (2006.01)
(52) U.S. Cl. . 438/149; 438/161; 438/166; 257/E21.295; 257/E21.414; 257/E23.159; 257/E27.111; 257/E29.117; 257/E29.294
(58) Field of Classification Search ............. 438/149, 438/476
See application file for complete search history.

(56) References Cited

U.S. PATENT DOCUMENTS

| | | | |
|---|---|---|---|
| 4,797,108 A | 1/1989 | Crowther | |
| 5,148,259 A * | 9/1992 | Kato et al. ............... | 257/771 |
| 5,595,944 A | 1/1997 | Zhang et al. | |
| 5,952,708 A | 9/1999 | Yamazaki | |
| 5,990,542 A | 11/1999 | Yamazaki | |
| 6,013,930 A | 1/2000 | Yamazaki et al. | |
| 6,057,237 A * | 5/2000 | Ding et al. ................ | 438/687 |
| 6,121,660 A | 9/2000 | Yamazaki et al. | |
| 6,197,624 B1 | 3/2001 | Yamazaki | |
| 6,218,219 B1 | 4/2001 | Yamazaki et al. | |
| 6,388,270 B1 | 5/2002 | Yamazaki et al. | |
| 6,433,842 B1 * | 8/2002 | Kaneko et al. ............. | 349/43 |
| 6,562,669 B2 | 5/2003 | Suzawa et al. | |

(Continued)

FOREIGN PATENT DOCUMENTS

JP    09-228035    9/1997

OTHER PUBLICATIONS

Katsuhiko Kumakawa, "Advancements in the Visibility of Moving Images of OCB", Nikkei Microdevice, Flat Panel Display, 2002, pp. 102-103 (Partial Translation) Oct. 2001; pp. 102-109 (English Abstract).

*Primary Examiner* — Thao Le
*Assistant Examiner* — Eric W Jones
(74) *Attorney, Agent, or Firm* — Nixon Peabody LLP; Jeffrey L. Costellia

(57) ABSTRACT

A gate electrode is formed by forming a first conductive layer containing aluminum as its main component over a substrate, forming a second conductive layer made from a material different from that used for forming the first conductive layer over the first conductive layer; and patterning the first conductive layer and the second conductive layer. Further, the first conductive layer includes one or more selected from carbon, chromium, tantalum, tungsten, molybdenum, titanium, silicon, and nickel. And the second conductive layer includes one or more selected from chromium, tantalum, tungsten, molybdenum, titanium, silicon, and nickel, or nitride of these materials.

103 Claims, 25 Drawing Sheets

U.S. PATENT DOCUMENTS

| | | | |
|---|---|---|---|
| 6,570,552 B2 * | 5/2003 | Yamazaki | 345/98 |
| 6,680,223 B1 * | 1/2004 | Yamazaki et al. | 438/149 |
| 6,709,901 B1 | 3/2004 | Yamazaki et al. | |
| 6,808,968 B2 | 10/2004 | Yamazaki et al. | |
| 6,825,497 B2 | 11/2004 | Lai | |
| 6,828,587 B2 | 12/2004 | Yamazaki et al. | |
| 6,913,956 B2 | 7/2005 | Hamada et al. | |
| 6,924,528 B2 | 8/2005 | Yamazaki et al. | |
| 7,037,779 B2 | 5/2006 | Nakajima | |
| 7,169,710 B2 | 1/2007 | Yamazaki et al. | |
| 7,232,742 B1 | 6/2007 | Maekawa | |
| 7,316,947 B2 | 1/2008 | Yamazaki et al. | |
| 2001/0010953 A1 * | 8/2001 | Kang et al. | 438/158 |
| 2001/0038127 A1 | 11/2001 | Yamazaki et al. | |
| 2001/0052950 A1 * | 12/2001 | Yamazaki et al. | 349/43 |
| 2002/0164843 A1 * | 11/2002 | Yamazaki et al. | 438/166 |
| 2003/0207513 A1 * | 11/2003 | Saitou et al. | 438/200 |
| 2004/0022664 A1 | 2/2004 | Kubota et al. | |
| 2004/0108599 A1 * | 6/2004 | Takayama et al. | 257/763 |
| 2006/0027804 A1 | 2/2006 | Yamazaki et al. | |
| 2006/0189047 A1 | 8/2006 | Yamazaki et al. | |
| 2007/0132377 A1 | 6/2007 | Yamazaki et al. | |

* cited by examiner

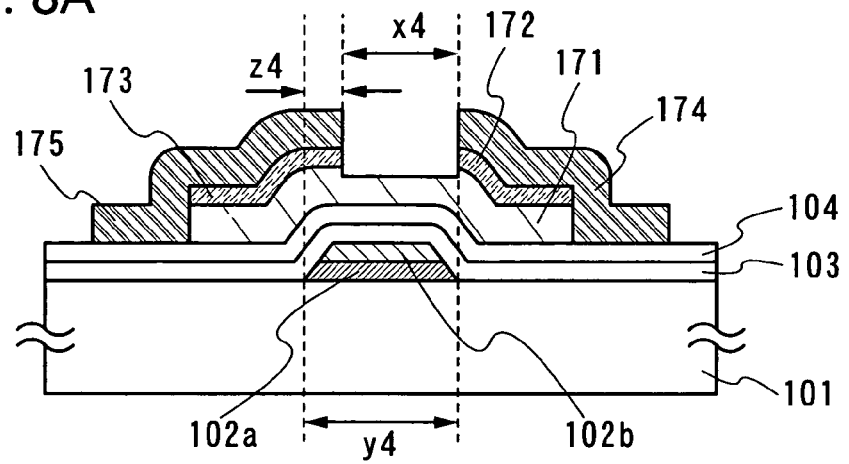
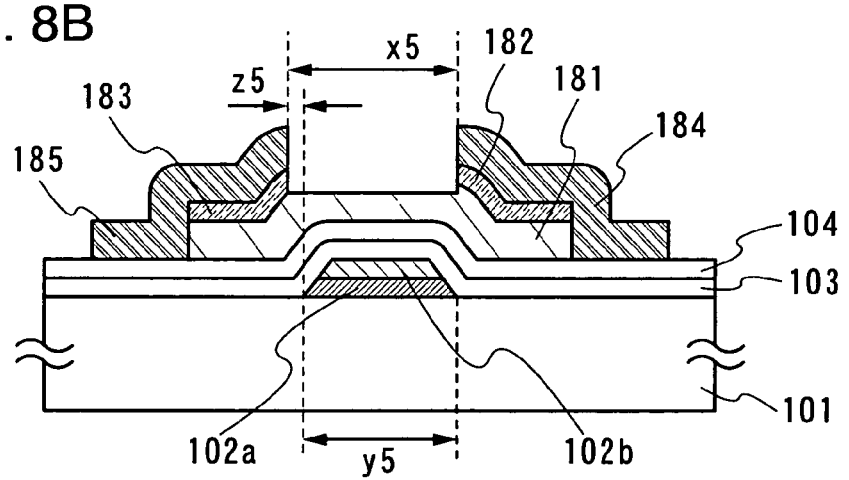
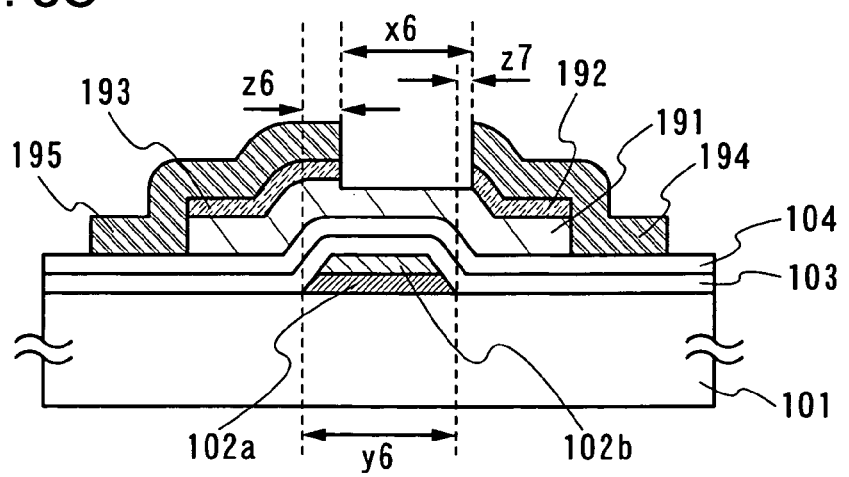

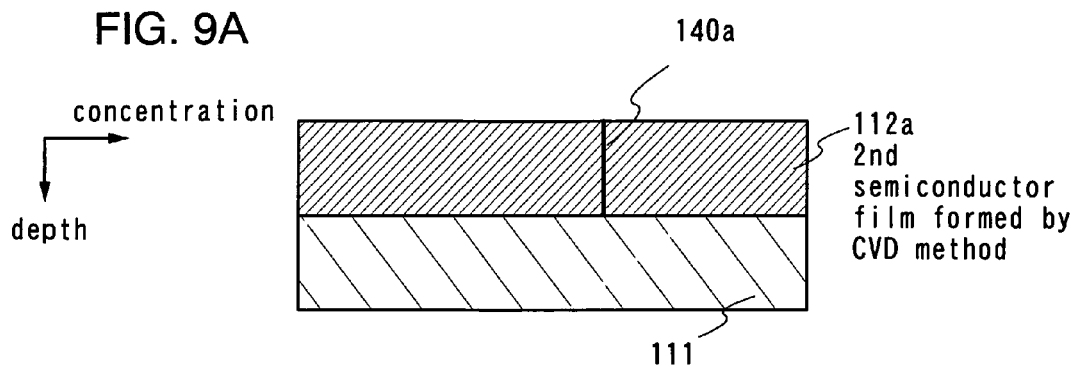
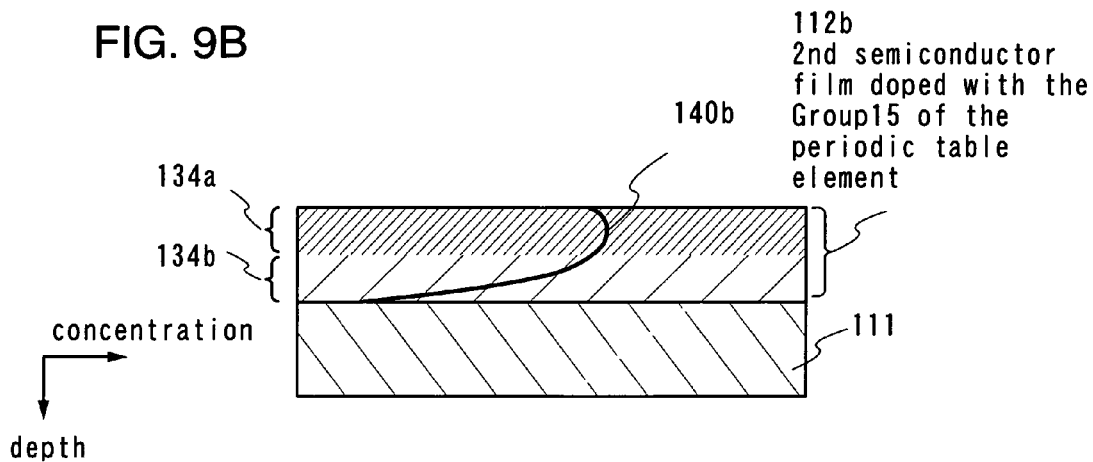

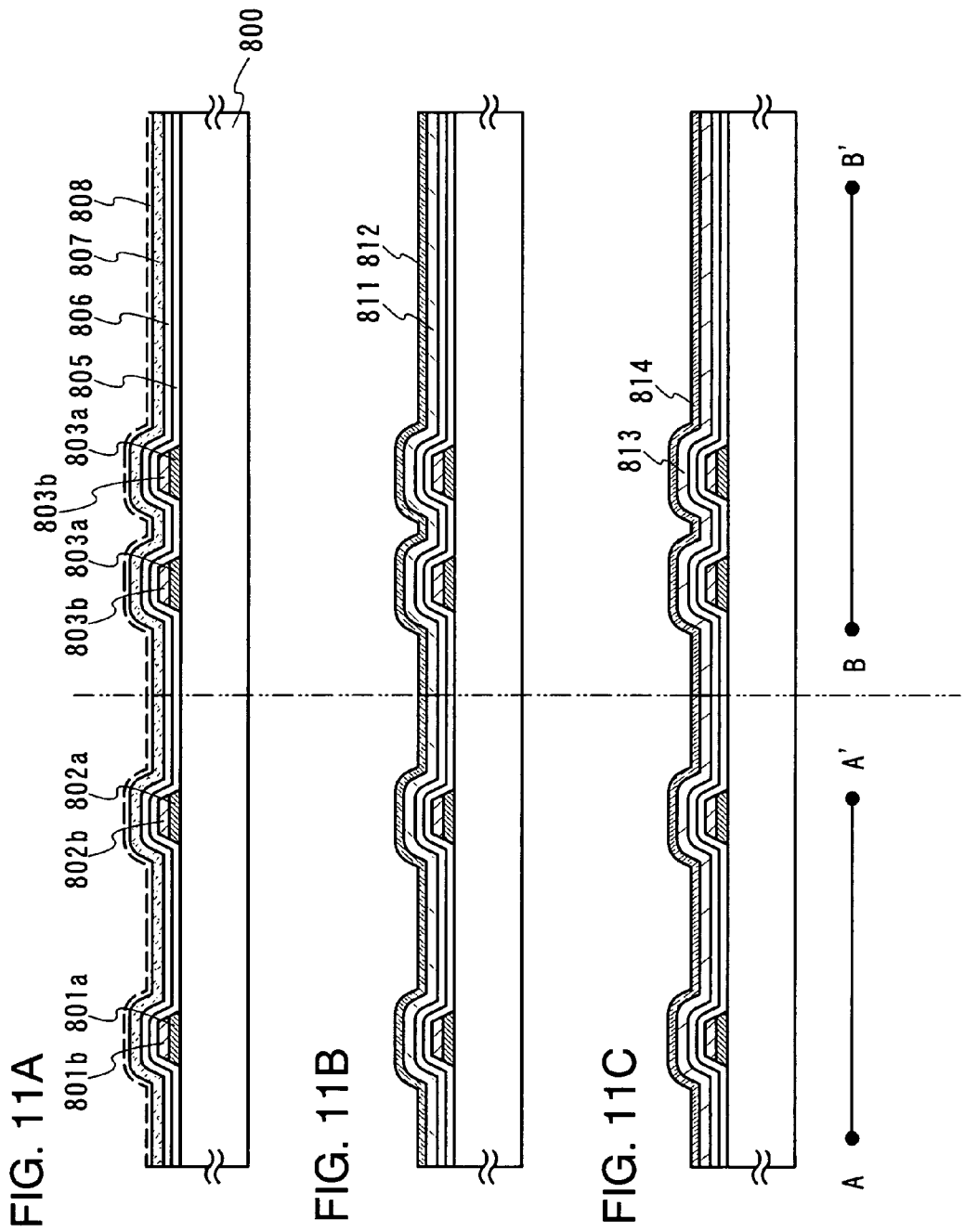

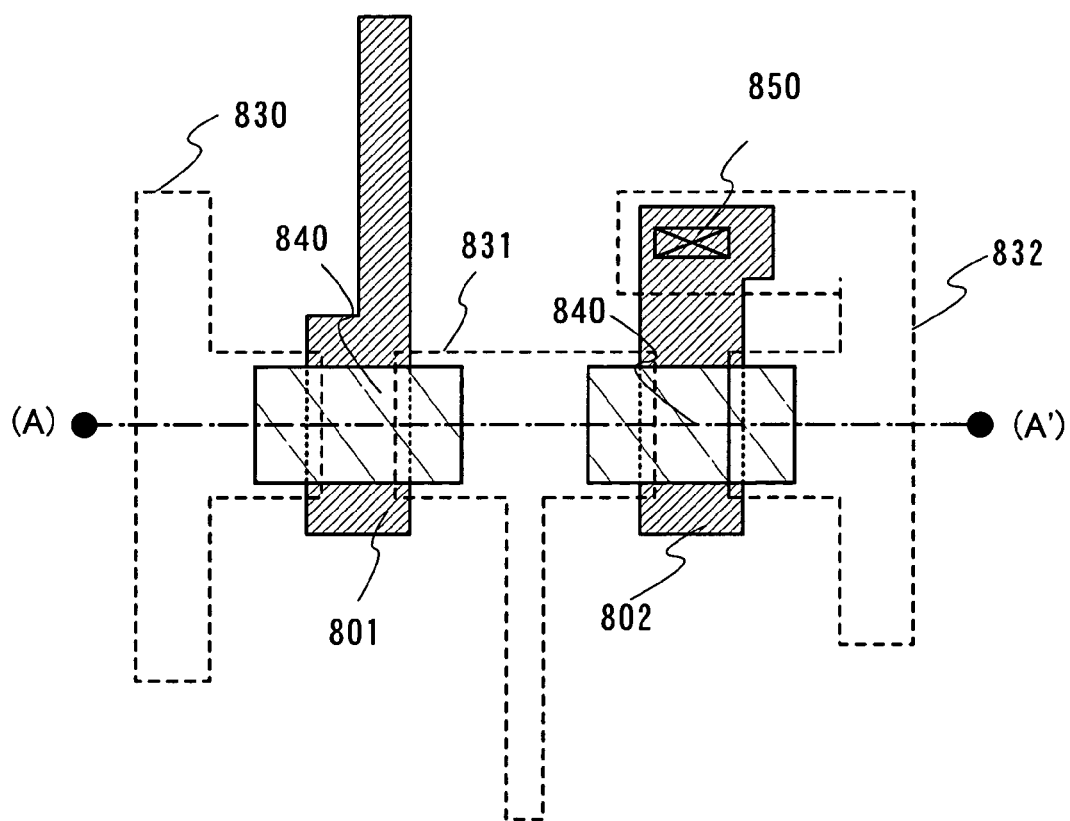

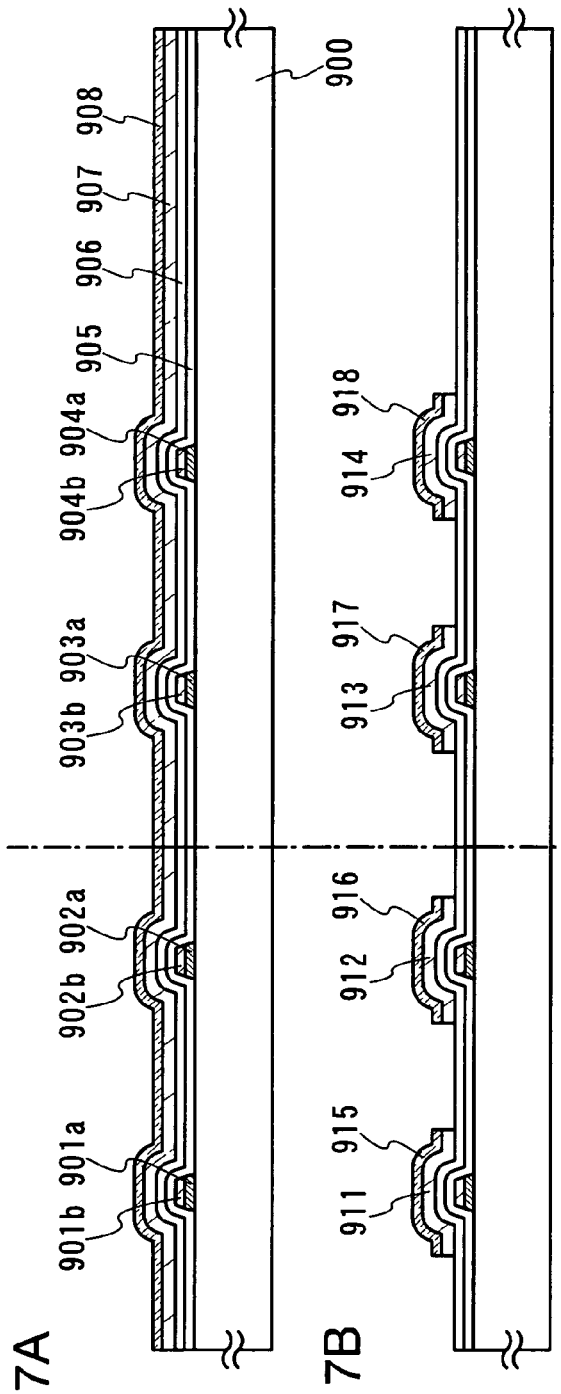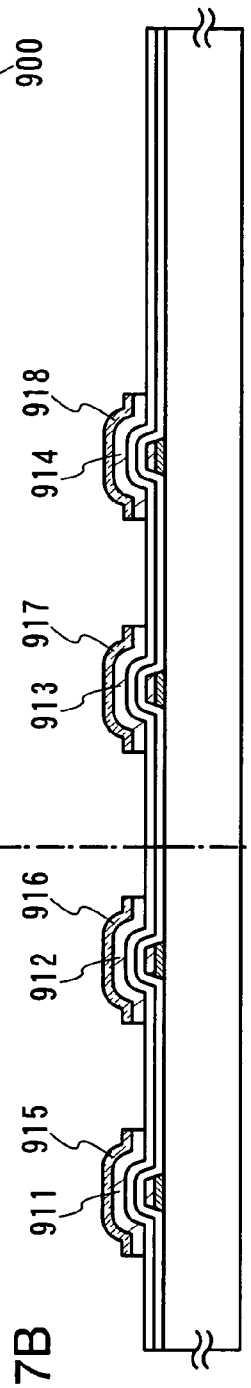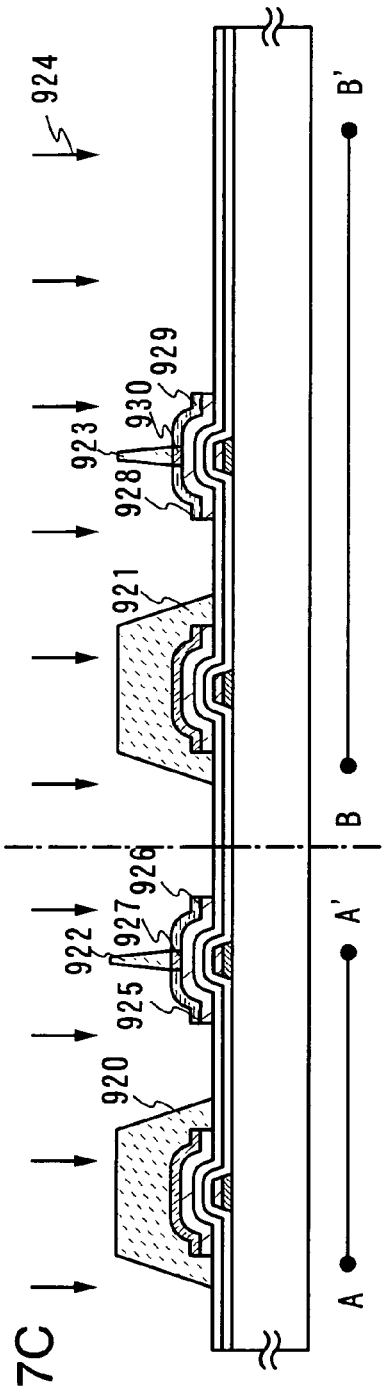

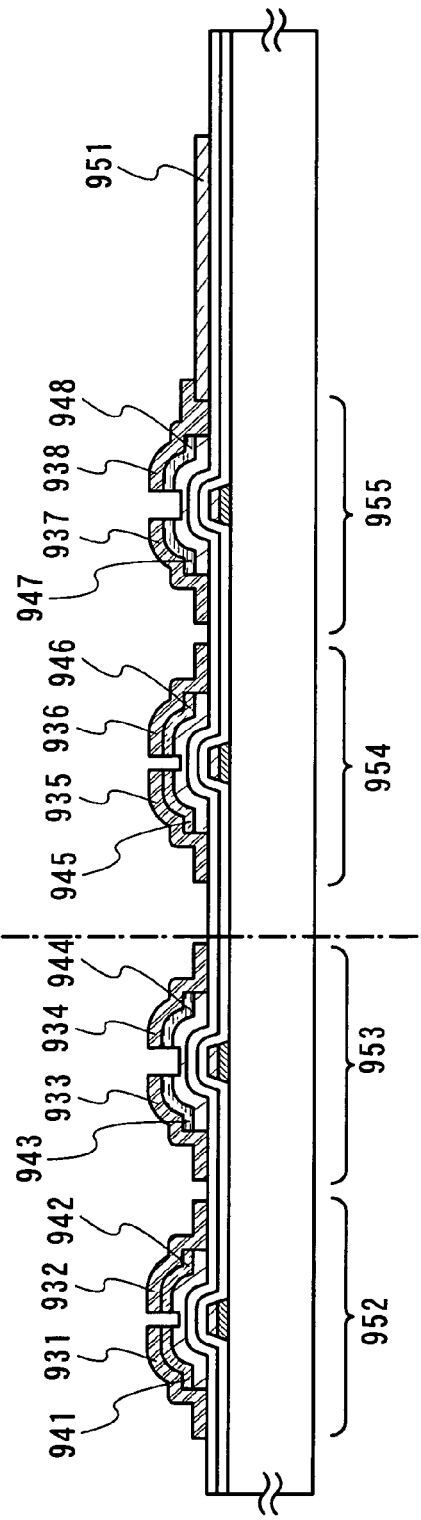
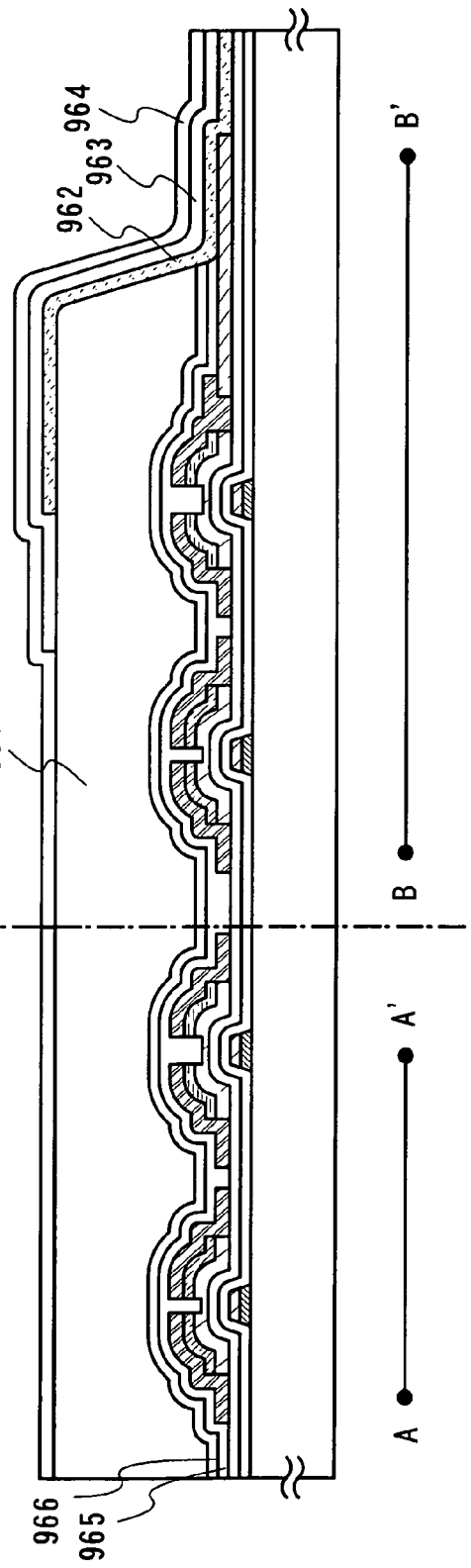
FIG. 18A
FIG. 18B

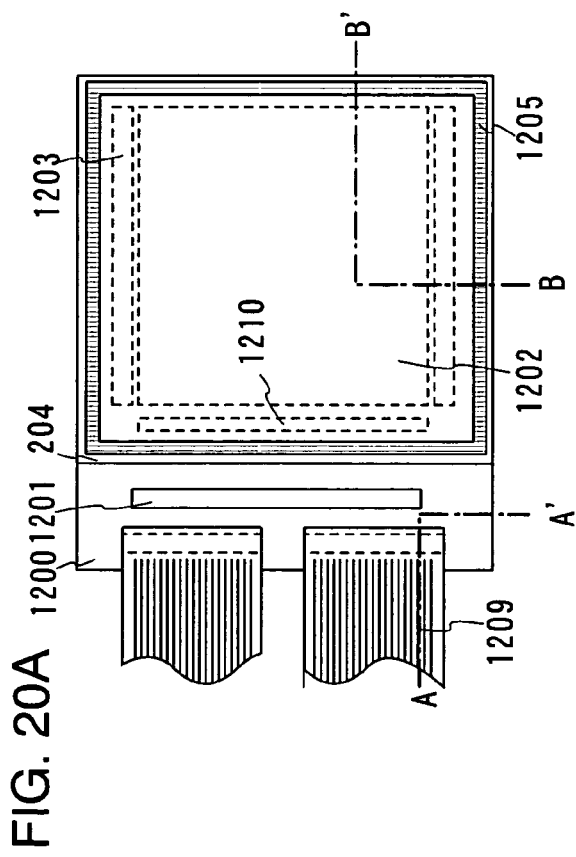
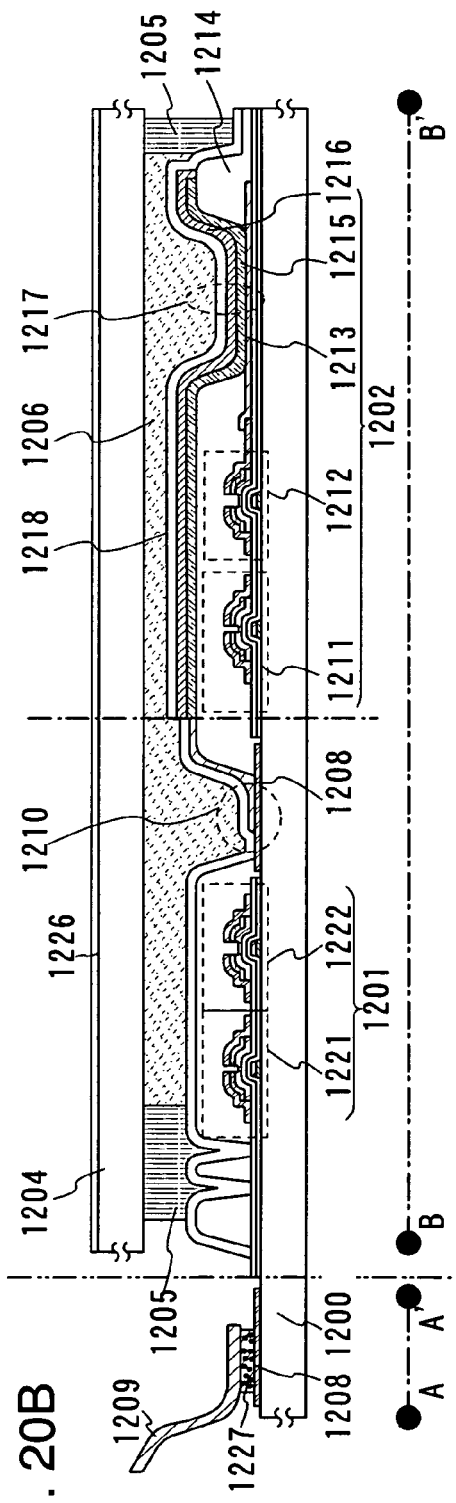
FIG. 20A
FIG. 20B

METHOD OF MANUFACTURING A SEMICONDUCTOR DEVICE HAVING A REVERSE STAGGERED THIN FILM TRANSISTOR

BACKGROUND OF THE INVENTION

1. Technical Field

The present invention relates to a method for manufacturing a semiconductor device having a reverse staggered thin film transistor including a crystalline semiconductor film.

2. Background Art

In recent years, a flat panel display (FPD) as typified by a liquid crystal display (LCD) or an EL (Electro Luminescence) display has attracted attention as a display device which can take the place of the conventional CRT. Particularly, the development of a large screen liquid crystal television mounted with an active matrix large liquid crystal panel is an important issue which should be focused by a liquid crystal panel manufacturer. A large screen EL television has been developed in recent years following the development of a liquid crystal television.

In the conventional liquid crystal display device or EL display device (hereinafter, light-emitting display device), a thin film transistor (hereinafter, TFT) using an amorphous semiconductor film (amorphous silicon) is used as a semiconductor element for driving each pixel.

With respect to the conventional liquid crystal television, there are defects such as the limits of viewing angle characteristics and the blurring of an image due to the limits of high speed operation caused by a liquid crystal material or the like. However, an OCB (Optically Compensated Bend) mode has been proposed in recent years as a novel display mode for removing the defects (for example, refer to non patent document 1).

[Non Patent Document 1] "Nikkei Micro Device Separate Volume, Flat Panel Display 2002", Edited by Yasuaki Nagahiro, Nikkei Business Publications, Inc., October 2001, pp. 102-109.

SUMMARY OF THE INVENTION

In order to improve the image quality of an LCD, a switching element capable of operating at high speed is required. However, a TFT using an amorphous semiconductor film has its limits. For example, a liquid crystal display device in an OCB mode becomes difficult to be realized.

In the case of operating a TFT using an amorphous semiconductor film by DC drive, threshold tends to deviate, accordingly, characteristics of the TFT tend to vary. Therefore, a light-emitting display device which uses a TFT using an amorphous semiconductor film as switching for pixels has non-uniform luminance. Such the phenomenon appears prominently in a large screen TV having an opposing corner of 30 inches or more (typically, 40 inches or more). There arises a serious problem of deterioration of image quality.

In the conventional TFT, aluminum has been actively tried to be used for a gate electrode. Aluminum has characteristics of having a low resistance value and good adhesiveness to a silicon oxide film. Further, aluminum has an advantage of being extremely inexpensive.

However, aluminum has the problem of heat resistance. For example, there is possibility of generating protrusions or vermiculate holes referred to as hillock or void by conducting heat treatment at 250° C. or more in a TFT process. Generation of the hillock (void) causes short-circuit between wirings or breaking of wirings and deterioration of reliability.

In view of the foregoing, it is an object of the present invention to provide a method for manufacturing a semiconductor device which can meet a device having a large area by forming a gate electrode or a wiring by a metallic film having low resistance. It is another object of the present invention to provide a method for manufacturing a semiconductor device having a TFT capable of operating at high speed and a TFT whose characteristics is hard to disperse. It is further another object of the present invention to provide a method for manufacturing a semiconductor device having a TFT with a few photomask. It is still further another object of the present invention to provide a method for manufacturing a semiconductor device having a high switching property and being capable of displaying an image with high contrast.

Means for Solving the Problem

In the present invention, as a gate electrode of a TFT, a laminated structure formed of a conductive film mainly containing Al (or a metal film) and a cap film formed over the conductive film is applied, and a reverse staggered TFT is formed by technique to crystallizing an amorphous semiconductor film using a catalytic element and technique to gettering a catalytic element after crystallizing the amorphous semiconductor film.

A conductive film mainly containing Al, in particular, aluminum containing carbon (C), or aluminum containing carbon and any one or a plurality of Cr, Ta, W, Mo, Ti, Si, and Ni can be used.

Note that, in this specification, "a cap film" means a conductive film (or a metal film) for restraining generation of hillock of the conductive film containing Al as its main component. As the cap film, in concrete terms, Cr, Ta, W, Mo, Ti, Si, and Ni, and nitride of these materials can be used.

The present invention concerning a method for manufacturing a semiconductor device disclosed in this specification is comprised of:

forming a first conductive layer made from aluminum as its main component over a substrate;

forming a second conductive layer made from a material different from that used for forming the first conductive layer over the first conductive layer;

forming a gate electrode by patterning the first conductive layer and the second conductive layer;

forming a gate insulating film over the gate electrode;

forming a first semiconductor film over the gate insulating film;

heating the first semiconductor film after introducing a catalytic element into the first semiconductor film;

heating the first semiconductor film and a second semiconductor film after forming the second semiconductor film including a first impurity element over the first semiconductor film;

forming an island-shaped semiconductor region by patterning the first semiconductor film and the second semiconductor film;

forming a third conductive layer over the island-shaped semiconductor region;

forming a source electrode and a drain electrode by patterning the third conductive layer; and exposing a part of the first semiconductor film and forming a source region and a drain region by etching the second semiconductor film with the source electrode and the drain electrode as masks within the island-shaped semiconductor region.

The present invention concerning a method for manufacturing a semiconductor device disclosed in this specification is comprised of:

forming a first conductive layer made from aluminum as its main component over a substrate;

forming a second conductive layer made from a material different from that used for forming the first conductive layer over the first conductive layer;

forming a gate electrode by patterning the first conductive layer and the second conductive layer;

forming a gate insulating film over the gate electrode;

forming a first semiconductor film over the gate insulating film;

heating the first semiconductor film after introducing a catalytic element into the first semiconductor film;

heating the first semiconductor film and a second semiconductor film after forming the second semiconductor film including a first impurity element over the first semiconductor film;

forming an island-shaped semiconductor region by patterning the first semiconductor film and the second semiconductor film;

forming a source region and a drain region by etching the second semiconductor film in the island-shaped semiconductor region; and forming a source electrode and a drain electrode on the source region and the drain region.

The present invention concerning a method for manufacturing a semiconductor device disclosed in this specification is comprised of:

forming a first conductive layer made from aluminum as its main component over a substrate;

forming a second conductive layer made from a material different from that used for forming the first conductive layer over the first conductive layer;

forming a gate electrode by patterning the first conductive layer and the second conductive layer;

forming a gate insulating film over the gate electrode;

forming a first semiconductor film over the gate insulating film;

heating the first semiconductor film after introducing a catalytic element into the first semiconductor film;

heating the first semiconductor film and a second semiconductor film after forming the second semiconductor film including a rare gas element over the first semiconductor film;

removing the second semiconductor film;

forming a third semiconductor film having conductivity over the first semiconductor film;

forming a first island-shaped semiconductor film and a second island-shaped semiconductor film by patterning the first semiconductor film and the third semiconductor film;

forming a third conductive layer over the second island-shaped semiconductor film;

forming a source electrode and a drain electrode by etching a part of the third conductive layer; and exposing a part of the first island-shaped semiconductor film, and forming a source region and a drain region by etching the second island-shaped semiconductor film with the source electrode and the drain electrode as masks.

The present invention concerning a method for manufacturing a semiconductor device disclosed in this specification is comprised of:

forming a first conductive layer made from aluminum as its main component over a substrate;

forming a second conductive layer made from a material different from that used for forming the first conductive layer over the first conductive layer;

forming a gate electrode by patterning the first conductive layer and the second conductive layer;

forming a gate insulating film over the gate electrode;

forming a first semiconductor film over the gate insulating film;

heating the first semiconductor film after introducing a catalytic element into the first semiconductor film;

heating the first semiconductor film and a second semiconductor film after forming the second semiconductor film including a rare gas element over the first semiconductor film;

removing the second semiconductor film;

forming a third semiconductor film having conductivity over the first semiconductor film;

forming an island-shaped semiconductor region by patterning the first semiconductor film and the third semiconductor film;

forming a source region and a drain region by etching the third semiconductor film in the island-shaped semiconductor region; and forming a source electrode and a drain electrode on the source region and the drain region.

The present invention concerning a method for manufacturing a semiconductor device disclosed in this specification is comprised of:

forming a first conductive layer made from aluminum as its main component over a substrate;

forming a second conductive layer made from a material different from that used for forming the first conductive layer over the first conductive layer;

forming a first gate electrode and a second gate electrode by patterning the first conductive layer and the second conductive layer;

forming a gate insulating film over the first gate electrode and the second gate electrode;

forming a first semiconductor film over the gate insulating film;

heating the first semiconductor film after introducing a catalytic element into the first semiconductor film;

heating the first semiconductor film and a second semiconductor film after forming the second semiconductor film including a first impurity element over the first semiconductor film;

forming a first island-shaped semiconductor region and a second island-shaped semiconductor region by patterning the first semiconductor film and the second semiconductor film;

doping selectively a second impurity element after covering the first island-shaped semiconductor region with a first mask and covering a part of the second island-shaped semiconductor region with a second mask;

removing the first mask and the second mask;

forming a third conductive layer over the first island-shaped semiconductor region and the second island-shaped semiconductor region;

forming a source electrode and a drain electrode, each of which has contact with the second semiconductor film of the first island-shaped semiconductor region, and a source electrode and a drain electrode, each of which has contact with the second semiconductor film of the second island-shaped semiconductor region by patterning the third conductive layer;

forming a first source region and first drain region by etching an exposed portion of the second semiconductor film of the first island-shaped semiconductor region; and forming a second source region and a second drain region by etching an exposed portion of the second semiconductor film of the second island-shaped semiconductor region.

The present invention concerning a method for manufacturing a semiconductor device disclosed in this specification is comprised of:

forming a first conductive layer made from aluminum as its main component over a substrate;

forming a second conductive layer made from a material different from that used for forming the first conductive layer over the first conductive layer;

forming a first gate electrode and a second gate electrode by patterning the first conductive layer and the second conductive layer;

forming a gate insulating film over the first gate electrode and the second gate electrode;

forming a first semiconductor film over the gate insulating film;

heating the first semiconductor film after introducing a catalytic element into the first semiconductor film;

heating the first semiconductor film and a second semiconductor film after forming the second semiconductor film including a first impurity element over the first semiconductor film;

forming a first island-shaped semiconductor region and a second island-shaped semiconductor region by patterning the first semiconductor film and the second semiconductor film;

doping selectively a second impurity element after covering the first island-shaped semiconductor region with a first mask and covering a part of the second island-shaped semiconductor region with a second mask;

removing the first mask and the second mask;

forming a first source region and a first drain region by etching the second semiconductor film in the first island-shaped semiconductor region, simultaneously, forming a second source region and a second drain region by etching the second semiconductor film in the second island-shaped semiconductor region; and forming a first source electrode and a first drain electrode on the first source region and the first drain region, simultaneously, forming a second source electrode and a second drain electrode on the second source region and the second drain region.

The present invention concerning a method for manufacturing a semiconductor device disclosed in this specification is comprised of:

forming a first conductive layer made from aluminum as its main component over a substrate;

forming a second conductive layer made from a material different from that used for forming the first conductive layer over the first conductive layer;

forming a first gate electrode and a second gate electrode by patterning the first conductive layer and the second conductive layer;

forming a gate insulating film over the first gate electrode and the second gate electrode;

forming a first semiconductor film over the gate insulating film;

heating the first semiconductor film after introducing a catalytic element into the first semiconductor film;

forming a first island-shaped semiconductor region and a second island-shaped semiconductor region by patterning the first semiconductor film;

doping selectively a first impurity element after covering a part of the first island-shaped semiconductor region with a first mask and covering a part of the second island-shaped semiconductor region with a second mask;

removing the first mask and the second mask;

heating the first island-shaped semiconductor region and the second island-shaped region;

doping selectively a second impurity element after covering the first island-shaped semiconductor region with a third mask and covering a part of the second island-shaped semiconductor region with a fourth mask;

removing the third mask and the fourth mask; and forming a third conductive layer over the first island-shaped semiconductor region and the second island-shaped semiconductor region;

forming a source electrode and a drain electrode, each of which has contact with the first island-shaped semiconductor region, and a source electrode and a drain electrode, each of which has contact with the second island-shaped semiconductor region by patterning the third conductive layer.

The present invention concerning a method for manufacturing a semiconductor device disclosed in this specification is comprised of:

forming a first conductive layer made from aluminum as its main component over a substrate;

forming a second conductive layer made from a material different from that used for forming the first conductive layer over the first conductive layer;

forming a first gate electrode and a second gate electrode by patterning the first conductive layer and the second conductive layer;

forming a gate insulating film over the first gate electrode and the second gate electrode;

forming a first semiconductor film over the gate insulating film;

heating the first semiconductor film after introducing a catalytic element into the first semiconductor film;

forming a second semiconductor film including a rare gas element over the first semiconductor film;

heating the first semiconductor film and the second semiconductor film;

removing the second semiconductor film;

forming a first island-shaped semiconductor region and a second island-shaped semiconductor region by patterning the first semiconductor film;

doping selectively a first impurity element after covering a part of the first island-shaped semiconductor region with a first mask and covering the second island-shaped semiconductor region with a second mask;

removing the first mask and the second mask;

doping selectively a second impurity element after covering the first island-shaped semiconductor region with a third mask and covering a part of the second island-shaped semiconductor region with a fourth mask;

removing the third mask and the fourth mask;

forming a third conducive layer over the first island-shaped semiconductor region and the second first island-shaped semiconductor region and;

forming a source electrode and a drain electrode, each of which has contact with the first island-shaped semiconductor region, and a source electrode and a drain electrode, each of which is contact with the second island-shaped semiconductor region by patterning the third conductive layer.

The present invention concerning a method for manufacturing a semiconductor device disclosed in this specification is comprised of:

forming a first conductive layer made from aluminum as its main component over a substrate;

forming a second conductive layer made from a material different from that used for forming the first conductive layer over the first conductive layer;

forming a first gate electrode and a second gate electrode by patterning the first conductive layer and the second conductive layer;

forming a gate insulating film over the first gate electrode and the second gate electrode;

forming a first semiconductor film over the gate insulating film;

heating the first semiconductor film after introducing a catalytic element into the first semiconductor film;

heating the first semiconductor film and a second semiconductor film after forming the second semiconductor film including a first impurity element over the first semiconductor film;

forming a first island-shaped semiconductor region and a second island-shaped semiconductor region by patterning the first island-shaped semiconductor film and the second island-shaped island semiconductor film;

doping a second impurity element into the second island-shaped semiconductor region after covering the first island semiconductor film with a mask;

removing the mask;

forming a third conductive layer over the first island-shaped semiconductor region and the second island-shaped semiconductor region;

forming a source electrode and a drain electrode, each of which has contact with the second semiconductor film of the first island-shaped semiconductor region, and a source electrode and a drain electrode, each of which has contact with the second semiconductor film of the second island-shaped semiconductor region by patterning the third conductive layer; and forming a source region and a drain region by etching an exposed portion of the second semiconductor film of the first island-shaped semiconductor region and an exposed portion of the second semiconductor film of the first island-shaped semiconductor region.

The present invention concerning a method for manufacturing a semiconductor device disclosed in this specification is comprised of:

forming a first conductive layer made from aluminum as its main component over a substrate;

forming a second conductive layer made from a material different from that used for forming the first conductive layer over the first conductive layer;

forming a first gate electrode and a second gate electrode by patterning the first conductive layer and the second conductive layer;

forming a gate insulating film over the first gate electrode and the second gate electrode;

forming a first semiconductor film over the gate insulating film;

heating the first semiconductor film after introducing a catalytic element into the first semiconductor film;

heating the first semiconductor film and a second semiconductor film after forming the second semiconductor film including a first impurity element over the first semiconductor film;

forming a first island-shaped semiconductor region and a second island-shaped semiconductor region by patterning the first semiconductor film and the second semiconductor film;

doping a second impurity element into the second island-shaped semiconductor region after covering the first island-shaped semiconductor film with a mask;

removing the mask;

forming a first source region and a first drain region by etching the second semiconductor film in the first island-shaped semiconductor region, simultaneously, forming a second source region and a second drain region by etching the second semiconductor film in the second island-shaped semiconductor region; and forming a first source electrode and a first source electrode on the first source region and the first drain region, simultaneously, forming a second source electrode and a second drain electrode on the second source region and a second drain region.

In the above-mentioned structure according to the invention, the heating is performed by Rapid Thermal Annealing (RTA).

In the above-mentioned structure according to the invention, the rare gas element is one or more selected from He, Ne, Ar, Kr, and Xe.

In the above-mentioned structure according to the invention, the first impurity element is one or more selected from phosphorus, nitrogen, arsenic, antimony, and bismuth.

In the above-mentioned structure according to the invention, the second impurity element is boron.

In the above-mentioned structure according to the invention, the catalytic element is one or more selected from tungsten, molybdenum, zirconium, hafnium, vanadium, niobium, tantalum, chromium, cobalt, nickel, and platinum.

In the above-mentioned structure according to the invention, the first conductive layer includes one or more of carbon, chromium, tantalum, tungsten, molybdenum, titanium, silicon, and nickel.

In the above-mentioned structure according to the invention, the carbon of 0.1 to 10 atomic % is included.

In the above-mentioned structure according to the invention, the second conductive layer includes one or more of chromium, tantalum, tungsten, molybdenum, titanium, and nickel, or nitride of these materials. Further, silicon can be also used.

Another structure of the invention concerning a method for manufacturing a semiconductor device disclosed in the specification is liquid crystal television or EL television including the semiconductor device.

Furthermore, in the invention, an integrated circuit, a display device, a wireless tag, an IC tag, or the like constituted by a semiconductor element can be nominated as a semiconductor device. As a display device, a liquid crystal display device, a light emitting display device, a DMD (Digital Micro mirror Device), a PDP (Plasma Display Panel), a FED (Field Emission Display), an electrophoresis display device (electronic paper), and the like can be nominated typically.

In the invention, a display device means a device using a display element, namely, an image display device. Further, a module in which a connector, for example, a flexible printed circuit (FPC), a TAB (Tape Automated Bonding) tape, or a TCP (Tape Carrier Package) is installed over a display panel; a module in which a printed wiring board is installed in the tip of the TAB tape or TCP, and a module in which an IC (integrated circuit) or a CPU is installed over a display element by a COG (Chip On Glass) method are all included in the display device.

In the specification, "patterning" means etching an object into a desired shape.

Effect of the Invention

Although heat-resistance and effect of hillock suppression can not be adequately obtained by a conventional single layer structure of a film containing aluminum as its main component (including a film containing carbon and the like), the problem can be solved according to the present invention by forming another conductive film over the film containing aluminum as its main component. That is, a reverse staggered TFT having a crystalline semiconductor film can be formed using a gate electrode with low resistance, high reliability, and low cost, and can be provided for a large area device.

According to the invention, a TFT can be formed with a few masks. Since the TFT of the invention is formed of a crystalline semiconductor film, the TFT has high mobility compared to a reverse staggered TFT formed of an amorphous semiconductor film. Further, a source region and a drain region include a catalytic element in addition to an acceptor-type element and a donor-type element. Therefore, a source region and a drain region with low resistivity can be formed. As a result, a semiconductor device which requires high-speed operation can be manufactured. A liquid crystal display device capable of high response speed and display with a large viewing angle, such as an OCB mode can be manufactured.

Furthermore, variation in characteristics of the TFT can be reduced since deviation of threshold is hard to occur compared with a TFT formed of an amorphous semiconductor film. Accordingly, image irregularity can be reduced compared with an EL display device using the TFT formed of the amorphous semiconductor film as a switching element; thereby a semiconductor device with higher reliability can be manufactured.

Moreover, since a metal element mixed into a semiconductor film in a film formation stage is also gettered by a gettering process, off current can be reduced. Therefore, contrast can be improved by using such a TFT as a switching element of a display device, for example, a liquid crystal display device.

Liquid crystal television and EL television having a semiconductor device formed by the above mentioned manufacturing steps can be manufactured with higher throughput and yield, and lower cost.

Hereinafter, the best modes for carrying out the invention are described with reference to drawings. However, the present invention can be carried out in many different modes, and it is easily understood by those of ordinary skill in the art that the modes and the detail can be changed variously unless otherwise such changes and modifications depart from the scope of the present invention. Note that, portions identical to each other are denoted by same reference numerals in each drawing, and will not be further explained.

BRIEF DESCRIPTION OF DRAWINGS

FIGS. 8A to 8C are explanatory cross-sectional views for showing a structure of a semiconductor device according to the present invention;

FIGS. 9A and 9B are explanatory cross-sectional views for showing an element profile within a semiconductor film in a semiconductor device according to the present invention;

FIGS. 11A to 11C are explanatory cross-sectional views for showing a manufacturing process of a semiconductor device according to the present invention;

FIG. 16 is an explanatory top view for showing a driver circuit which can be adapted to the present invention;

FIGS. 17A to 17C are explanatory cross-sectional views for showing a manufacturing process of a semiconductor device according to the present invention;

FIGS. 18A to 18B are explanatory cross-sectional views for showing a manufacturing process of a semiconductor device according to the present invention;

FIGS. 20A and 20B are explanatory top and cross-sectional views for showing a structure of a semiconductor device according to the present invention;

DETAILED DESCRIPTION OF THE PREFERRED EMBODIMENTS

Embodiment Mode 1

In this embodiment mode, manufacturing steps of a reverse staggered TFT having a crystalline semiconductor film is described with reference to FIGS. 1A to 1E.

Figure 1A:
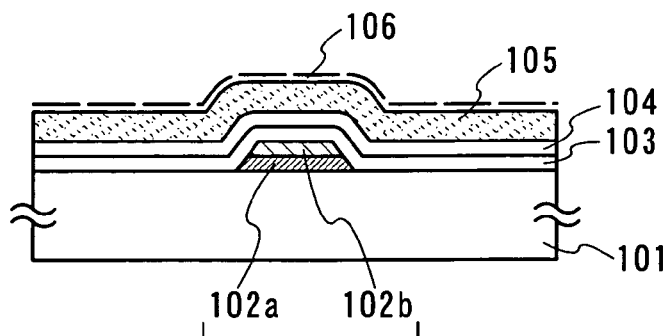
FIGS. 1A to 1E are explanatory cross-sectional views for showing a manufacturing process of a semiconductor device according to the present invention.

As shown in FIG. 1A, a first conductive film 102a is formed over a substrate 101, and a second conductive film 102b is formed thereover. Then, a first insulating film 103 and a second insulating film 104 are formed over the second conductive film 102b. A first semiconductor film 105 is formed over the second insulating film 104, and a layer 106 including a catalytic element is formed over the first semiconductor film 105.

Note that a base film may be formed between the substrate 101 and the first conducive film 102a if necessary so as to prevent impurities from a substrate side and the like from being diffused. As the base film, silicon oxide (SiOx), silicon nitride (SiNx), silicon oxynitride (SiOxNy(x>y)), silicon nitride oxide (SiNxOy(x>y)), or the like can be used appropriately.

As the substrate 101, a glass substrate, a quartz substrate, a substrate formed of an insulator like ceramic such as alumina, a silicon wafer, a metal plate, or the like can be used. In this invention, a large area substrate such as 320 mm×400 mm, 370 mm×470 mm, 550 mm×650 mm, 600 mm×720 mm, 680 mm×880 mm, 1000 mm×1200 mm, 1100 mm×1250 mm, 1150 mm×1300 mm can be used for the substrate 101.

The first conductive film 102a and the second conductive film 102b function as a gate electrode. The first conductive film 102a and the second conductive film 102b are formed by forming a mask with a photolithography process after forming the first conductive layer and the second conductive layer sequentially, and patterning (etching) the films using the mask at the same time. In this case, mask processing is required only once, and therefore, there is an advantage in reducing the number of steps. Further, in this embodiment mode, the first conductive film 102a and the second conductive film 102b are formed to have the same taper angle, however, the taper angle of the first conductive film 102a and the second conductive film 102b may be changed. If coverage (step coverage) does not cause a problem, it is not necessity to form it in a taper shape. Further, a side face of the first conductive film 102a may be oxidized after forming the second conductive film 102b.

As the structure of the gate electrode, the second conductive film 102b may be formed so as to cover the first conductive film 102a. To be concrete, after forming the first conductive layer, patterning is conducted; thereby the first conductive film 102a is formed. At this time, it is preferable to form it in a taper shape by taking the coverage (step coverage) into consideration. Then, after the second conductive layer is formed so as to cover the surface of the first conductive film 102a, patterning is performed to form the second conductive film 102b. At this time, the second conductive film 102b may be formed to have the same tapered angle as the first conductive film 102a, or a different tapered angle from the first conductive film 102a. By forming the second conductive film 102b to cover the first conductive film 102a, an effect to suppress hillock of the first conductive film 102a including aluminum as its main component can be obtained apparently.

Moreover, the first conductive film 102a and the second conductive film 102b are formed by a known method such as a printing method, an electric field plating method, a PVD (Physical Vapor Deposition) method, a CVD (Chemical Vapor Deposition) method, or an evaporation method.

The first conductive film 102a can be formed with a material including aluminum as its main component, and carbon and any one or more selected from chromium, tantalum, tungsten, molybdenum, titanium, silicon, and nickel. In particular, 0.1 to 10 atomic % of carbon is preferably included. By using the film composed of such a material as the first conductive film 102a, effect of higher heat-resistance properties than pure aluminum can be obtained while taking advantage of aluminum which has low resistivity and is low cost.

If generation of hillock caused by high-temperature heating, which is a problem in a conductive film including aluminum as its main component, can be suppressed sufficiently by the second conductive film 102b shown below, a film in which aluminum is a main component, which only includes carbon (preferably, 0.1 to 10% atom %) may be used as the first conductive film 102a.

As the second conductive film 102b, it is required to have functions of suppressing the generation of hillock in the first conductive film 102a including aluminum, and improving heat-resistance properties further. As the material having the functions, chromium, tantalum, tungsten, molybdenum, titanium, or nickel, or nitride containing any one or more of these materials can be nominated. In addition, silicon can be also used.

Moreover, in order to suppress the generation of the hillock of the first conductive film including aluminum, after forming the first conductive layer and forming the first conductive film 102a by patterning, the second conductive film 102b is formed so as to cover the whole surface of the first conductive film 102a.

Although process number is increased, a gate electrode may be formed so as to cover the film including aluminum as its main component with the upper and lower conductive films entirely. As an example for a specific formation method, a first conductive layer serving as a cap film and a layer including aluminum as its main component are formed with a known film-formation method, and then patterning is conducted simultaneously. Then, a second conductive layer serving as a cap film is formed to cover the first conductive layer and the layer including aluminum as its main component which have been patterned, and then etched into a desired shape. Since the gate electrode which is formed of three layers in this manner has a structure in which the upper and lower portions of the film including aluminum as its main component is covered with the cap film, the effect of preventing the generation of hillock can be sufficiently obtained.

The first insulating film 103 and the second insulating film 104 function as a gate insulating film. As the first insulating film 103 and the second insulating film 104, silicon oxide (SiOx), silicon nitride (SiNx), silicon oxynitride (SiOxNy (x>y)), silicon nitride oxide (SiNxOy(x>y)), or the like can be properly used. In order to prevent diffusion of impurities and the like from the substrate side, it is preferable to form the first insulating film 103 using silicon nitride (SiNx), silicon nitride oxide (SiNxOy (x>y)), or the like. As the second insulating film, silicon oxide (SiOx) and silicon oxynitride (SiOxNy ((x>y)) are desirably used in consideration of interface properties with a first semiconductor film 105 formed afterward. However, it is not limited to this process, and a single layer formed of any one of silicon oxide (SiOx), silicon nitride (SiNx), silicon oxynitride (SiOxNy (x>y)), silicon nitride oxide (SiNxOy(x>y)), and the like may be used for the film formation. Note that hydrogen is included in the second insulating film.

The first semiconductor film 105 is formed of a film having any states selected from an amorphous semiconductor, a semi-amorphous semiconductor (also referred to as SAS) in which an amorphous state and a crystalline state are mixed, a microcrystalline semiconductor in which crystal grains of 0.5 nm to 20 nm can be observed in an amorphous semiconductor, and a crystalline semiconductor. In particular, a microcrystal state in which crystal grains of 0.5 nm to 20 nm can be observed is referred to as so-called micro crystal (μc). A semiconductor film including any of silicon, silicon germanium, and the like, which has a film thickness of 10 to 200 nm, preferably, 50 to 100 nm can be used.

In order to obtain a semiconductor film having a high-quality crystalline structure in subsequent crystallization, the concentration of impurities such as oxygen, nitrogen, and the like included in the first semiconductor film 105 is preferably reduced equal to or less than $5\times10^{18}/cm^3$ (hereafter, the concentration is shown as an atomic concentration measured by secondary ion mass spectrometory (SIMS)). These impurities easily react with a catalytic element, and become a factor to interfere with subsequent crystallization and to increase density of a trapping center and a recombination center even after the crystallization.

The layer 106 containing a catalytic element can be formed by forming a thin film containing a catalytic element or a silicide of a catalytic element over the surface of the first semiconductor film 105 by a PVD method, a CVD method, an evaporation method, or the like, or by applying a solution including a catalytic element over the surface of the first semiconductor film 105, and the like. The catalytic element can be formed using one or more of tungsten (W), molybdenum (Mo), zirconium (Zr), hafnium (Hf), vanadium (V), niobium (Nb), tantalum (Ta), chromium (Cr), cobalt (Co), nickel (Ni), platina (Pt), and the like. Further, the catalytic element can be directly added into the semiconductor film by an ion doping method or an ion implantation method. Furthermore, plasma treatment may be performed over the surface of the semiconductor film using an electrode formed of the catalytic element. Note that the catalytic element here is an element to advance and promote the crystallization of the semiconductor film.

Figure 1B:
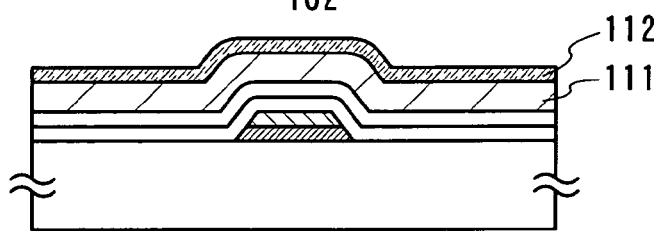

Subsequently, the first semiconductor film 105 is heated to form a first crystalline semiconductor film 111 as shown in FIG. 1B. In this case, in crystallization, silicide is formed at a portion of a semiconductor film with which a metal element promoting crystallization of the semiconductor film is in contact, thereby preceding the crystallization with the silicide as a nucleus. As a method for crystallization, heat treatment using electric-furnace (furnace anneal method) after performing heat treatment for dehydrogenation can be nominated. Heat condition is preferably set at 550° C. to 650° C. for 4 to 24 hours. More preferably, it is preferable to perform crystallization by a Rapid Thermal Annealing (hereinafter referred to as RTA) method using a gas or halogen lamp or an electron beam as a heat source. In this embodiment mode, crystallization is performed by the RTA. The heat condition is preferably set at 500 to 700° C. for 3 to 10 minutes.

By crystallizing the semiconductor film without using laser light as heating means, variation of crystallinity can be reduced and variation of subsequently formed TFTs can be suppressed. RTA has a characteristic that, the semiconductor film can be heated for a short period by using the RTA compared with the period using furnace anneal. Therefore, by forming the first crystalline semiconductor film 111 of the semiconductor film by the RTA in addition to the formation of the second conductive film 102b over the first conductive film 102a like in this embodiment mode, a synergistic effect of suppressing the generation of hillock in the first conductive film 102a including aluminum as its main component can be obtained.

Then, a channel doping process to add a p-type or n-type impurity element into a region to be a channel formation region of a TFT at low concentration is conducted entirely or selectively. The channel doping process is a process to suppress a TFT threshold voltage. Note that boron is added by an ion doping method in which diborane ($B_2H_6$) is plasma-excited without being mass-separated. Note that an ion implantation method where mass-separation is conducted may be used. A channel doping process may be performed before the process of the crystallization.

Then, a second semiconductor film 112 including Group 15 element (hereinafter referred to as "donor-type element") is formed over the first crystalline semiconductor film 111. The second semiconductor film 112 may be formed by a plasma CVD method in which a gas including a donor-type element such as phosphorus and arsenic is added to a silicide gas. By forming the second semiconductor film using such a manner, an interface of the first crystalline semiconductor film and the second semiconductor film can be formed. Furthermore, the second semiconductor film 112 including a donor-type element can be formed by forming the similar semiconductor film to the first semiconductor film, and then adding a donor-type element by an ion doping method or an ion implantation method. At this time, the concentration of phosphorus in the second semiconductor film 112 is preferably $1\times10^{19}$ to $3\times10^{21}/cm^3$.

A model diagram (it is not a diagram showing an actual measured result) of a profile of impurities in the second semiconductor film in which the donor-type element is included is shown in FIGS. 9A and 9B. FIG. 9A shows a profile 140a of the donor-type element when the second semiconductor film including the donor-type element is formed over the first crystalline semiconductor film 111 by a plasma CVD method. The donor-type element is distributed at a constant concentration with respect to the depth direction of the film.

Meanwhile, FIG. 9B shows a profile 140b of the donor-type element when a semiconductor film having any state selected from an amorphous semiconductor, SAS, microcrystal semiconductor, and crystalline semiconductor is formed over the first crystalline semiconductor film 111, a donor-type element is added into the semiconductor film by an ion doping method or an ion implantation method to form the second semiconductor film. As shown in FIG. 9B, a vicinity of the surface of the second semiconductor film has a relatively high concentration of the donor-type element. The region having the donor-type element concentration at equal to or more than $1\times10^{19}/cm^3$ is shown as an n+ region 134a. Meanwhile, the concentration of the donor-type element is relatively reduced as it approaches the first crystalline semiconductor film 111. The region having the donor-type element concentration at $5\times10^{17}$ to $1\times10^{19}/cm^3$ is shown as an n− region 134b. The n+ region 134a functions as a source region or a drain region, and the n− region 134b functions as an LDD region. Note that the interface of each of the n+ region and the n− region does not exist and it is changed according to the relative concentration of the donor-type element. As described thus, the second semiconductor film including a donor-type element formed by the ion doping method or the ion implantation method can control the concentration profile by a doping condition, and the film thickness of the $n^+$ region and the n− region can be properly controlled.

Figure 1C:
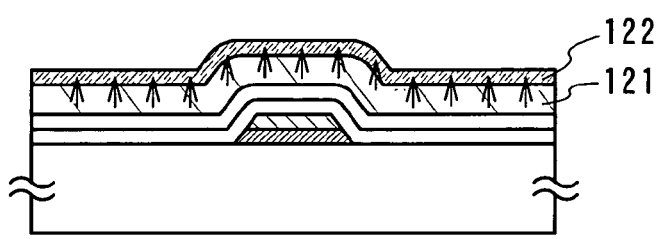

Subsequently, the first crystalline semiconductor film 111 and the second semiconductor film 112 are heated, and a catalytic element included in the first crystalline semiconductor film 111 is moved to the second semiconductor film 112 as shown by arrows in FIG. 1C to conduct gettering of the catalytic element. By this step, the concentration at which a catalytic element in the first crystalline semiconductor film does not affect a device characteristic, namely, the nickel concentration in the film, can be equal to or less than $1\times10^{18}/cm^3$, desirably, equal to or less than $1\times10^{17}/cm^3$. Such a film can be hereinafter shown as a second crystalline semiconductor film 121. Since the second semiconductor film 112 to which a metal catalyst after being gettered is moved is similarly crystallized, it is hereinafter shown as a third crystalline semiconductor film 122. In this embodiment mode, activation of the donor-type element in the third crystalline semiconductor film 122 is conducted along with a gettering process.

Figure 1D:
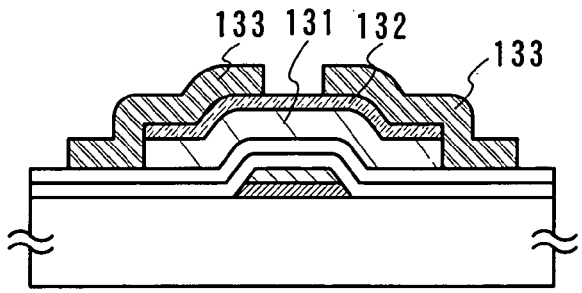

As shown in FIG. 1D, by using a mask formed by a photolithography process, the second crystalline semiconductor film 121 and the third crystalline semiconductor film 122 are etched to form a first semiconductor region 131 and a second semiconductor region 132. Note that the second crystalline semiconductor film 121 and the third crystalline semiconductor film 122 can be etched by a chlorine-based gas typified by $Cl_2$, $BCl_3$, $SiCl_4$, or $CCl_4$, a fluorine-based gas typified by $CF_4$, $SF_6$, $NF_3$, or $CHF_3$, or $O_2$.

In the photolithography process in the following embodiment modes and embodiments, an insulating film with about several nm thick is preferably formed over the surface of the semiconductor film 122. According to the process, the semiconductor film can be prevented from having direct contact with resist; thus the semiconductor film can be prevented from being penetrated by impurities. As a method for forming the insulating film, a method of applying a solution having oxidizability such as ozone water, a method of irradiating with oxygen plasma or ozone plasma, and the like can be nominated.

A third conductive layer is formed next. A mask is formed over the third conductive layer by a photolithography process. Then, the third conductive layer is etched into a desired shape using the mask to form a third conductive film 133. The third conductive film 133 functions as a source electrode and a drain electrode.

In the conductive film formation process in the following embodiment modes and embodiments, when an insulating film is formed over the surface of the semiconductor film in the photolithography process, the insulating film is preferably etched before forming the conductive film.

As a material for the third conductive film, a metal such as Al, Ti, Mo, or W, or the alloy thereof can be used. Further, a single layer or a multilayer structure thereof can be used. Typically, a structure in which Ti, Al, and Ti are sequentially laminated from a substrate side may be applied, or a structure in which Mo, Al, and Mo are sequentially laminated may be applied.

Figure 1E:
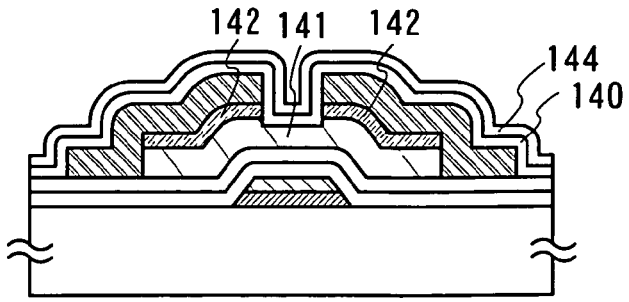

Then, as shown in FIG. 1E, an exposed portion of a second semiconductor region is etched using the third conductive film 133 as a mask, thereby forming a source region and a drain region 142. At this time, one part of the first semiconductor region 131 may be over-etched. The first semiconductor region which is over-etched is hereinafter referred to as a third semiconductor region 141. The third semiconductor region 141 functions as a channel formation region.

Then, a passivation film is preferably formed on the surface of the third conductive film 133 and the third semiconductor region 141. The passivation film can be formed using silicon nitride, silicon oxide, silicon nitride oxide, silicon oxynitride, aluminum oxynitride, aluminum oxide, diamond-like carbon (DLC), or carbon including nitrogen, or other insulating materials, by a thin film formation method such as a plasma CVD method or a sputtering method. The passivation film can be a single layer structure or a laminated structure. Here, silicon oxide or silicon oxynitride is preferably used as a third insulating film 140 in consideration of the interface characteristic of the third semiconductor region 141. In order to prevent intrusion of impurities into a semiconductor element from outside, a fourth insulating film 144 is preferably formed of silicon nitride or silicon nitride oxide.

Hereafter, the third semiconductor region 141 is preferably hydrogenated by heating the third semiconductor region 141 in a hydrogen atmosphere or a nitrogen atmosphere. When heating in the nitrogen atmosphere, an insulating film including hydrogen is preferably used for the third insulating film or the fourth insulating film.

According to the steps mentioned above, a reverse staggered TFT having a crystalline semiconductor film can be formed. A reverse staggered TFT having a crystalline semiconductor film can be formed using a gate electrode which is a metal film with low resistance and wirings as the TFT formed in this embodiment mode, which can correspond to a device with large area. Furthermore, the TFT formed in this embodiment has high mobility since it is formed of a crystalline semiconductor film, compared to a TFT formed of an amorphous semiconductor film. The source region and the drain region include a catalytic element in addition to a donor-type element. Therefore, a source region and a drain region with low resistivity can be formed. As a result, a semiconductor device in which high speed operation is required can be manufactured. Typically, a liquid crystal display device having high response speed and a large viewing angle, such as an OCB mode can be manufactured.

Furthermore, variation in TFT characteristics can be reduced since deviation of threshold is hard to occur compared with a TFT formed of an amorphous semiconductor film. Accordingly, image irregularity can be reduced compared with an EL display device using the TFT formed of the amorphous semiconductor film as a switching element; thereby a semiconductor device with higher reliability can be manufactured.

Moreover, since gettering is also performed to a metal element mixed into a semiconductor film in a film formation stage by a gettering process, off current can be reduced. Therefore, contrast can be improved by using such a TFT as a switching element of a display device, for example, a liquid crystal display device.

Embodiment Mode 2

In this embodiment mode, a step of forming a TFT by conducting gettering to a catalytic element using a semiconductor film including an inert gas element as a substitute for a semiconductor film having a donor-type element is described with reference to FIGS. 2A to 2F.

Figure 2A:
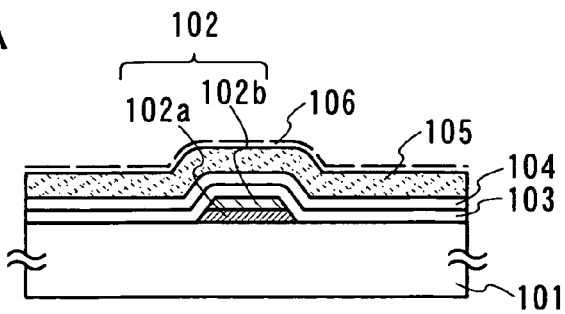
FIGS. 2A to 2F are explanatory cross-sectional views for showing a manufacturing process of a semiconductor device according to the present invention.
Figure 2B:
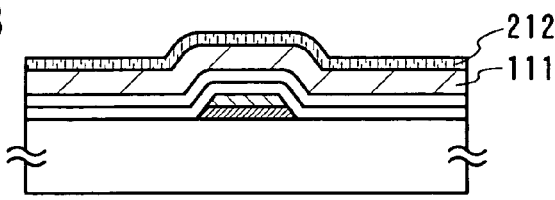

As shown in FIGS. 2A and 2B, a first crystalline semiconductor film 111 is formed using the similar step to Embodiment Mode 1. Hereafter, a channel doping step may be conducted. Then, an oxide film with a film thickness of 1 to 5 nm may be formed on the surface of the first crystalline semiconductor film. Here, an oxide film is formed by applying ozone water over the surface of the crystalline semiconductor film.

Then, a second semiconductor film 212 having a rare gas element is formed over the first crystalline semiconductor film 111 by a known method such as a PVD method or a CVD method. As the second semiconductor film 212, an amorphous semiconductor film is preferably used.

Figure 2C:
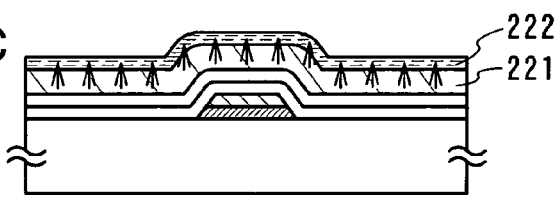

Subsequently, the first crystalline semiconductor film 111 and the second semiconductor film 212 are heated by the similar manner to Embodiment Mode 1, and a catalytic element included in the first crystalline semiconductor film 111 is moved to the second semiconductor film 212 as shown by arrows in FIG. 2C to conduct gettering of the catalytic element. By this step, the concentration at which a catalytic element in the first crystalline semiconductor film does not affect a device characteristic, namely, the catalytic element concentration in the film, can be equal to or less than $1 \times 10^{18}/cm^3$, desirably, equal to or less than $1 \times 10^{17}/cm^3$. Such a film can be hereinafter shown as a second crystalline semiconductor film 221. Since the second semiconductor film to which a metal catalyst after being gettered is moved is similarly crystallized, it is hereinafter shown as a third crystalline semiconductor film 222.

Figure 2D:
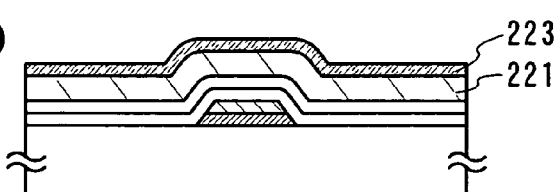

As shown in FIG. 2D, a second semiconductor film 223 having conductivity is formed after removing the third crystalline semiconductor film 222. Here, the second semiconductor film is formed of a silicide gas to which a gas added with Group 13 element or Group 15 element, such as boron, phosphorous, or arsenic is added, by a plasma CVD method. Note that the second semiconductor film is formed of a film having any states selected from an amorphous semiconductor, SAS, crystalline semiconductor, and micro-crystal semiconductor (μc). When the second semiconductor film is any one of amorphous semiconductor film having conductivity, SAS, and crystalline semiconductor (μc), heat treatment to activate impurities is conducted hereafter. Alternatively, when the second semiconductor film is a crystalline semiconductor having conductivity, heat treatment is not necessarily to be conducted. Here, an amorphous silicon film including phosphorus is formed with a film thickness of 100 nm by the plasma CVD method, and then heated at 550° C. for two hours, thereby activating the impurities.

Figure 2E:
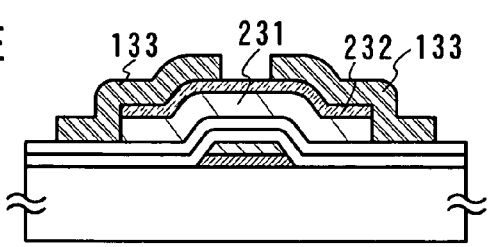

As shown in FIG. 2E, a first semiconductor region 232 and a second semiconductor region 231 are formed by the similar step to Embodiment Mode 1.

Figure 2F:
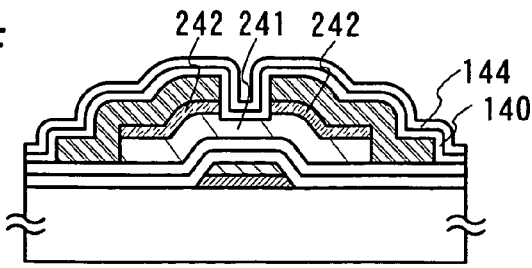

Then, a source electrode and a drain electrode 133 is formed as shown in FIG. 2F. A source region and drain region 242, and a third semiconductor region 241 serving as a channel formation region can be formed by etching the first semiconductor region using the similar step to Embodiment Mode 1.

Hereinafter, a reverse staggered TFT can be formed using the similar step to Embodiment Mode 1. By using the TFT formed in this embodiment mode, the similar effect to Embodiment Mode 1 can be obtained.

Embodiment Mode 3

In this embodiment mode, a step of forming an n-channel TFT and a p-channel TFT over the same substrate is described with reference to FIGS. 3A to 3D.

Figure 3A:
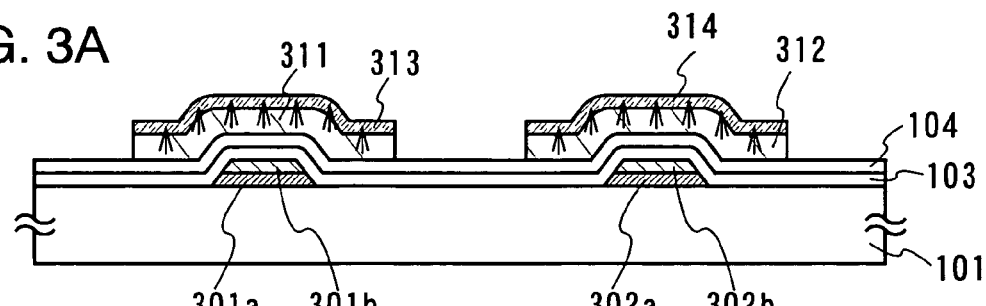
FIGS. 3A to 3D are explanatory cross-sectional views for showing a manufacturing process of a semiconductor device according to the present invention.

As shown in FIG. 3A, as with Embodiment Mode 1, a gate electrode 301 (which is formed of a first conductive film 301*a* and a second conductive film 301*b*) and a gate electrode 302 (which is formed of a first conductive film 302*a* and a second conductive film 302*b*) are formed over a substrate 101, and a first insulating film 103 and a second insulating film 104 are formed over the gate electrode 301 and the gate electrode 302. Using the same steps as Embodiment Mode 1, a first crystalline semiconductor film is formed and a second semiconductor film including a donor-type element is formed thereover. Using a mask formed by a photolithography process, the first crystalline semiconductor film is etched into a desired shape to form a first semiconductor region, and a second semiconductor film is etched into a desired shape to form a second semiconductor region.

Then, the first semiconductor region and the second semiconductor region are heated, and a catalytic element included in the first semiconductor region is moved to the second semiconductor region to be gettered as shown by arrows in FIG. 3A. Here, the first semiconductor region of which metal element concentration is reduced is shown as third semiconductor regions 311 and 312, and the second semiconductor region to which the catalytic element after being gettered is moved is shown as fourth semiconductor regions 313 and 314. Note that each of the third semiconductor region and the fourth semiconductor region is crystallized by heating in a gettering process respectively.

In this embodiment mode, a gettering process is conducted after forming each semiconductor region; however, the semiconductor films may be etched into a desired shape to form each semiconductor region after conducting the gettering process of each semiconductor film.

Figure 3B:
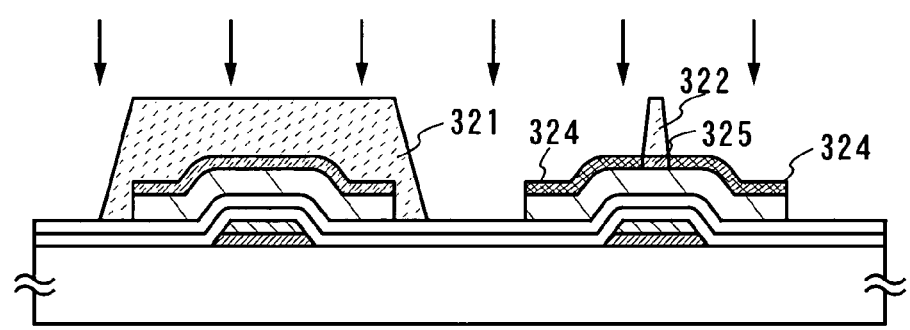

Next, after forming an oxide film over the surface of the third semiconductor regions 311 and 312 and the fourth semiconductor regions 313 and 314, masks 321 and 322 are formed by a photolithography process as shown in FIG. 3B. The mask 321 entirely covers the third semiconductor region 311 and the fourth semiconductor region 313 which become an n-channel TFT latterly. Meanwhile, the mask 322 covers one part of the fourth semiconductor region 314 which becomes a p-channel TFT latterly. At this time, it is preferable that the first mask 322 has narrower length than a channel length of the p-channel TFT which is formed latterly.

The exposed portion of the fourth semiconductor region 314 is doped with a Group 13 element (hereinafter referred to as an "acceptor-type element") to form a p-type impurity region 324. The region covered with the mask 322 is left as an n-type impurity region 325. By doping the exposed portion of the fourth semiconductor region 314 with the acceptor-type element so as to have a concentration which is 2 to 10 times that in the fourth semiconductor region 314 having a donor-type element, a p-type impurity region can be formed.

Figure 10A:
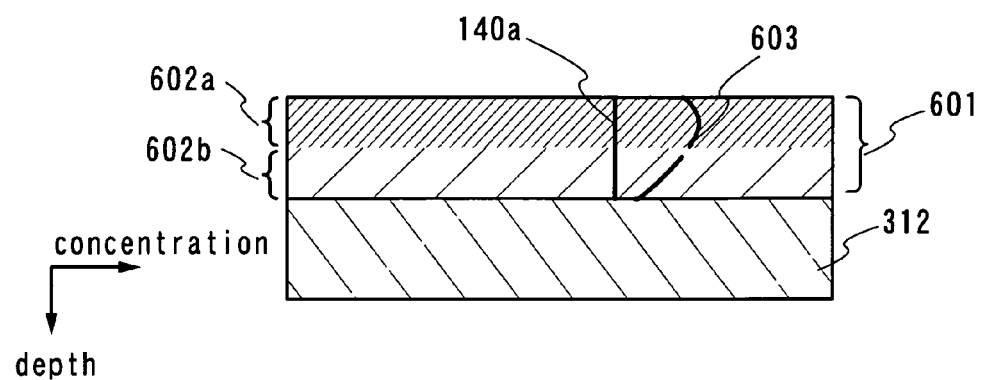
FIGS. 10A and 10B are explanatory cross-sectional views for showing an element profile within a semiconductor film in a semiconductor device according to the present invention.
Figure 10B:
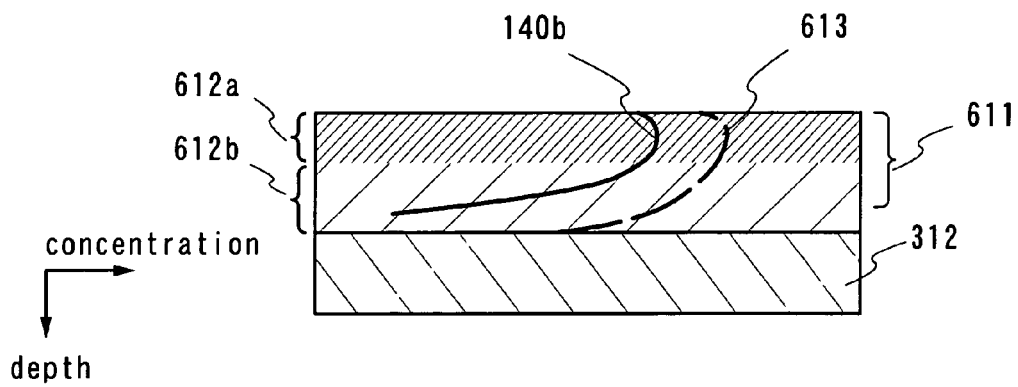

In FIGS. 10A and 10B, a model diagram of a profile of an impurity element in the p-type impurity region is shown. FIG. 10A shows a profile of each element in the p-type impurity region 601 when an acceptor-type element (boron is used in this embodiment mode) is added after forming the second semiconductor film including a donor-type element and conducting a gettering process thereto. A profile 140*a* of the donor-type element shows a constant concentration with respect to a depth direction of the region as with that in FIG. 9A. Further, a profile 603 of the acceptor-type element has high concentration in the vicinity of the surface of the p-type impurity region 601, and the concentration is lowered as it approaches the fourth semiconductor region 312. Note that a region having an acceptor-type element which is 2 to 10 times the concentration of the donor-type element included in an n+ region is shown as a p+ region 602*a* and a region having an acceptor-type element which is 2 to 10 times the concentration of the donor-type element included in an n− region is shown as a p− region 602*b*.

FIG. 10B shows a profile of each element in a p-type impurity region 611 when a semiconductor film of a film having any one of states selected from an amorphous semiconductor, SAS, microcrystalline semiconductor, and crystalline semiconductor is formed, and a donor-type element is added into the semiconductor film by an ion doping method or an ion implantation method so that a second semiconductor film is formed, a gettering process is conducted, and then an acceptor-type element is added. The profile 140*b* of the donor-type element is similar to the profile 140*b* of the donor-type element in FIG. 9B. Further, the profile 613 of the acceptor-type element has a similar tendency to the profile 603 of the acceptor-type element in FIG. 10A. The concentration in the vicinity of the surface of the p-type impurity region 611 is high, and the concentration is lowered as it approaches the fourth semiconductor region 312. Note that a region having an acceptor-type element which is 2 to 10 times the concentration of the donor-type element included in the n+ region is shown as a p+ region 612*a* and a region having an acceptor-type element which is 2 to 10 times the concentration of the donor-type element included in the n– region is shown as a p– region 612b.

The distortion of a crystal lattice is formed by adding a rare gas element (typically, argon) in the second semiconductor film including the donor-type element. In the gettering process which is conducted later, the catalytic element can be gettered further.

After removing the first masks 321 and 322, the third semiconductor region 313 and the first semiconductor region 314 to which an acceptor-type element is added are heated, thereby activating an impurity element. As a method for heating, Rapid Thermal Annealing (RTA) using a gas, a halogen lamp, or an electric beam as a heating source, furnace annealing, or the like can be appropriately used. Here, RTA is used to heat at 675° C. for three minutes.

Figure 3C:
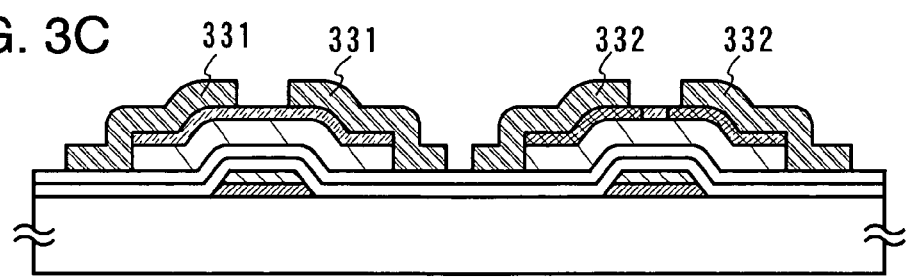
Figure 3D:
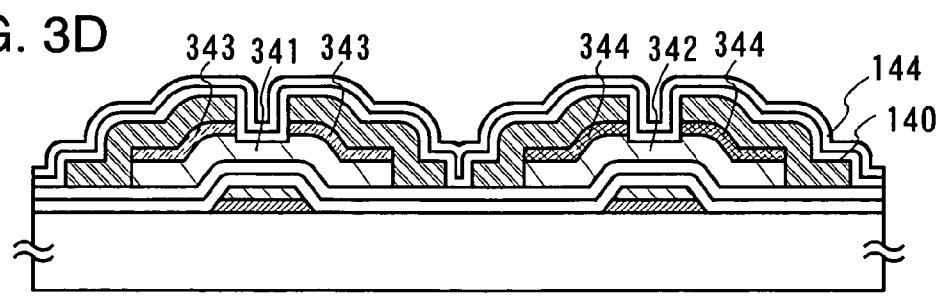

Then, third conductive films 331 and 332 are formed as well as Embodiment Mode 1 as shown in FIG. 3C. Then, a source region and a drain region 343 and 344 are formed using the third conductive films 331 and 332 as masks. Passivation films 140 and 144 are preferably formed over the surface of the third conductive films 331 and 332 and the fifth semiconductor regions 341 and 342.

According to the steps mentioned above, an n-channel TFT and a p-channel TFT can be formed over the same substrate. The same effect as that in Embodiment Mode 1 can be obtained by using the TFT formed by this embodiment mode. In comparison to a driver circuit formed of a single channel TFT, a CMOS capable of low voltage drive can be formed. Further, since the atomic radius of the acceptor-type element (e.g. boron) is small as compared with that of a donor-type element (e.g. phosphorus), an acceptor-type element can be added in the semiconductor film at comparatively low accelerating voltage and concentration.

Embodiment Mode 4

In this embodiment mode, a manufacturing step of an n-channel TFT and a p-channel TFT including a crystalline semiconductor film formed by a gettering process which is different from the one in Embodiment Mode 3 is described with reference to FIGS. 4A to 4E.

In accordance with Embodiment Mode 1, a gate electrode 301 (which is formed of a first conductive film 301a and a second conductive film 301b), and a gate electrode 302 (which is formed of a first conductive film 302a and a second conductive film 302b) are formed over a substrate 101. Then, in accordance with Embodiment Mode 1, a several nm insulating film is formed over a surface of a first crystalline semiconductor film after forming the first crystalline semiconductor film including a catalytic element, as shown in FIG. 1B. A first mask is formed by a photolithography process, and the first crystalline semiconductor film is etched into a desired shape, thereby forming first semiconductor regions 401 and 402.

Figure 4A:
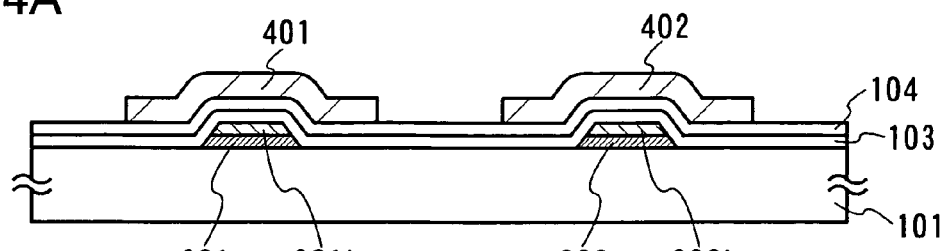
FIGS. 4A to 4E are explanatory cross-sectional views for showing a manufacturing process of a semiconductor device according to the present invention.
Figure 4B:
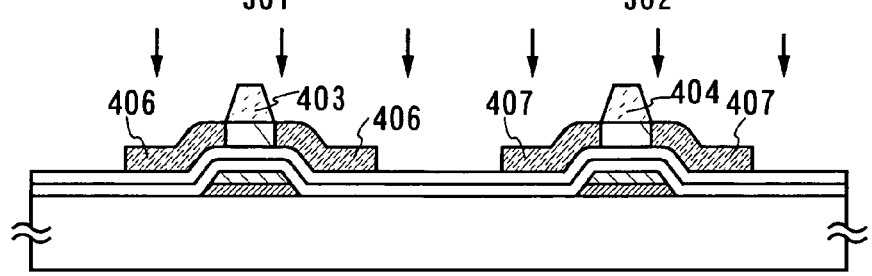

As shown in FIG. 4B, after forming second masks 403 and 404 over the first semiconductor regions 401 and 402 by a photolithography process, a donor-type element is added to an exposed portion of the first semiconductor region. At this time, the region doped with the donor-type element is referred to as n-type impurity regions 406 and 407. Here, phosphorus is added by an ion doping method. The first semiconductor region covered with the second mask does not include phosphorus, but include a catalytic element.

Figure 4C:
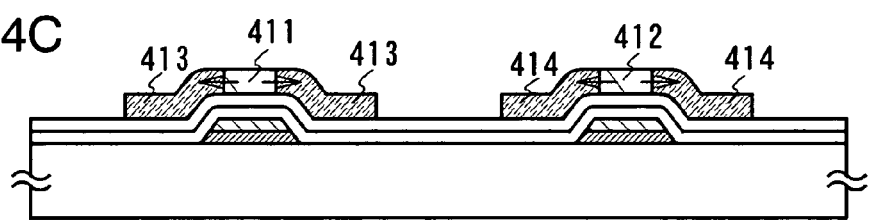

Subsequently, as shown with arrows in FIG. 4C, the first semiconductor region is heated and the catalytic element is moved to the n-type impurity regions 406 and 407 to getter the catalytic element. Here, a first semiconductor region to which the catalytic element after being gettered is moved is shown as a source region and a drain region 413 and 414, and a first semiconductor region in which the concentration of the metal element is reduced is shown as a channel formation region 411. Note that the third semiconductor region and the fourth semiconductor region are crystallized by being heated in a gettering process, and the donor-type element included in the n-type impurity regions 406 and 407 are activated.

Figure 4D:
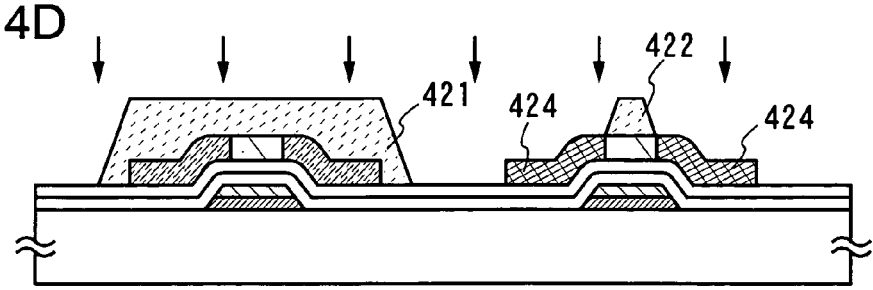
Figure 4E:
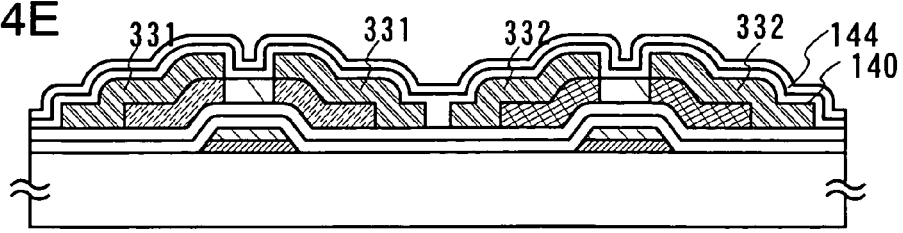

Next, as shown in FIG. 4D, third masks 421 and 422 are formed by a photolithography process. The third mask 421 entirely covers the channel formation region 411 and n-type impurity region 413 which become an n-channel TFT latterly. Meanwhile, the third mask 422 partly or entirely covers the channel formation region 412 which become a p-channel TFT latterly. At this time, it is preferable that the third mask 422 has narrower length than a channel length of the p-channel TFT which is formed afterward.

Then, the exposed portion of the n-type impurity region 414 and the channel formation region 412 is doped with an acceptor-type element, thereby forming a p-type impurity region 424. At this time, by adding an acceptor-type element so as to have 2 to 10 times the concentration of that in the n-type impurity region 414, a p-type impurity region can be formed.

After removing the third masks 421 and 422, the n-type impurity region 414 and the p-type impurity region 424 are heated, thereby activating the impurity element. As a method for heating, Rapid Thermal Annealing (RTA) using a gas, a halogen lamp, or an electric beam as a heating source, furnace anneal, or the like can be properly used. Here, RTA is used, and heating at 675° C. for 3 minutes is conducted.

As shown in FIG. 4D, third conductive films 331 and 332 are formed as well as Embodiment Mode 1. One part of the channel formation regions 441 and 412 may be etched afterward. It is preferable to form passivation films 140 and 144 over the surface of the third conductive films 331 and 332, and the channel formation regions 411 and 412.

According to the steps mentioned above, an n-channel TFT and a p-channel TFT can be formed over the same substrate. The similar effect to that in Embodiment Mode 1 can be obtained by using the TFT formed in this embodiment mode. Throughput can be improved since formation processes can be reduced compared with the one in Embodiment Mode 3.

Embodiment Mode 5

In this embodiment mode, a step of forming an n-channel TFT and a p-channel TFT over the same substrate using a crystalline semiconductor film to which a gettering process is conducted using Embodiment Mode 2 is described with reference to FIGS. 5A to 5D.

In accordance with the steps in Embodiment Mode 1, gate electrodes 301 (which is formed of a first conductive film 301a and a second conductive film 301b) and 302 (which is formed of a first conductive film 302a and a second conductive film 302b) are formed over a substrate 101. In accordance with the step of Embodiment Mode 2, a first crystalline semiconductor film and a second semiconductor film including a rare gas element are formed. Next, the first crystalline semiconductor film and the second semiconductor film are heated by the similar manner to the one in Embodiment Mode 1, and a catalytic element included in the first crystalline semiconductor film is moved to the second semiconductor film as shown by arrows in FIG. 5A, thereby gettering the catalytic element. The first crystalline semiconductor film in which the catalytic element is gettered is shown as a second crystalline semiconductor film 501. Since the second semiconductor film to which the catalytic element is moved after the gettering, is crystallized similarly, it is shown as a third crystalline semiconductor film 502.

Figure 5A:
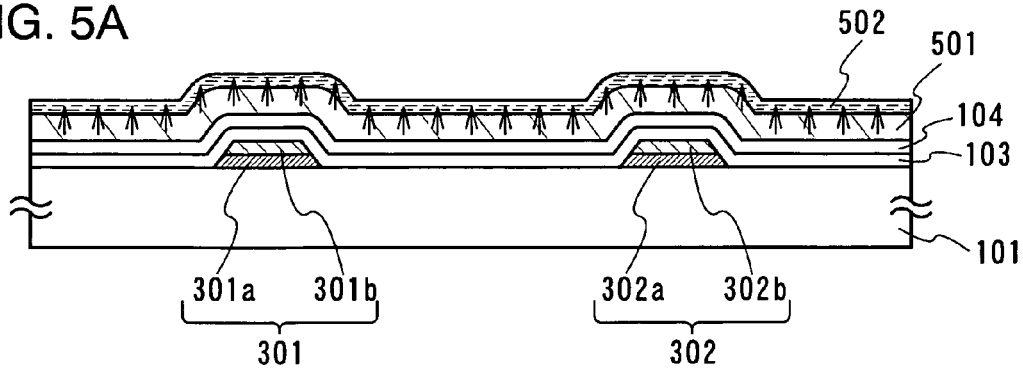
FIGS. 5A to 5D are explanatory cross-sectional views for showing a manufacturing process of a semiconductor device according to the present invention.
Figure 5B:
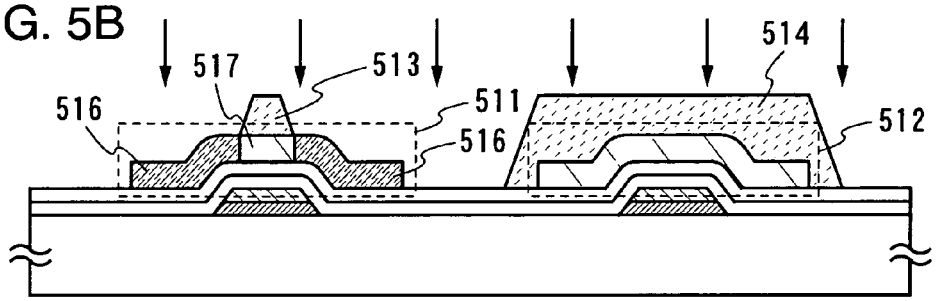
Figure 5C:
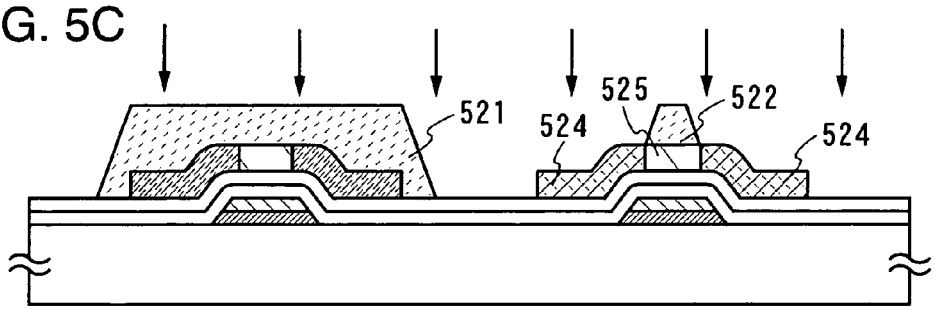

Next, as shown in FIG. 5B, after etching the third crystalline semiconductor film 502, an insulating film with several nm is formed over the surface of the second crystalline semiconductor film 501. Next, by a photolithography process, a first mask is formed, the second crystalline semiconductor film is etched, and first semiconductor regions 511 and 512 are formed. Then, second masks 513 and 514 are formed by the photolithography process. The second mask 513 covers a part which becomes an n-channel TFT afterward. Meanwhile, the second mask 514 entirely covers the first semiconductor region 512 which becomes a p-channel TFT afterward. A donor-type element is added into an exposed portion of the first semiconductor region 511. At this time, a region doped with the donor-type element is shown as an n-type impurity region 516. The region covered with the second mask 513 functions as a channel formation region 517.

Next, after etching the second masks 513 and 514, third masks 521 and 522 are formed newly. The third mask 521 entirely covers the channel formation region 411 and n-type impurity region 413 which become an n-channel TFT afterward. Meanwhile, the third mask 422 covers a region which becomes a channel formation region of a p-channel TFT afterward.

Then, an acceptor-type element is added into the exposed portion of the semiconductor region 512, thereby forming a p-type impurity region 524. The region covered with the third mask 522 functions as a channel formation region 525. Subsequently, after removing the third masks 521 and 522, the n-type impurity region 516 and the p-type impurity region 524 are heated, thereby activating the impurity element. As a method for heating, Rapid Thermal Annealing (RTA) using a gas, a halogen lamp, or an electric beam as a heating source, furnace annealing, or the like can be appropriately used.

Figure 5D:
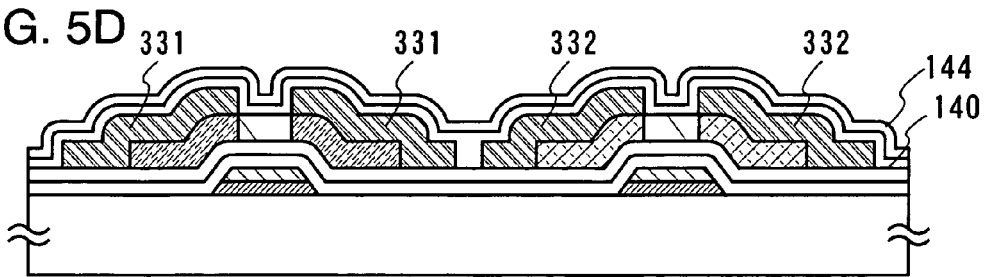

As shown in FIG. 5D, third conductive films 331 and 332 are formed as well as Embodiment Mode 1. Then, one part of the channel formation regions 517 and 525 may be etched. Next, passivation films 140 and 144 are preferably formed over the surface of the third conductive films 331 and 332, and the channel formation regions 517 and 525.

According to the steps mentioned above, an n-channel TFT and a p-channel TFT can be formed over the same substrate. The similar effect to that in Embodiment Mode 1 can be obtained by using the TFT formed in this embodiment mode.

Embodiment Mode 6

Using a deformation example of Embodiment Mode 3, a step of forming an n-channel TFT and a p-channel TFT over the same substrate is described with reference to FIGS. 6A to 6D in this embodiment mode.

Figure 6A:
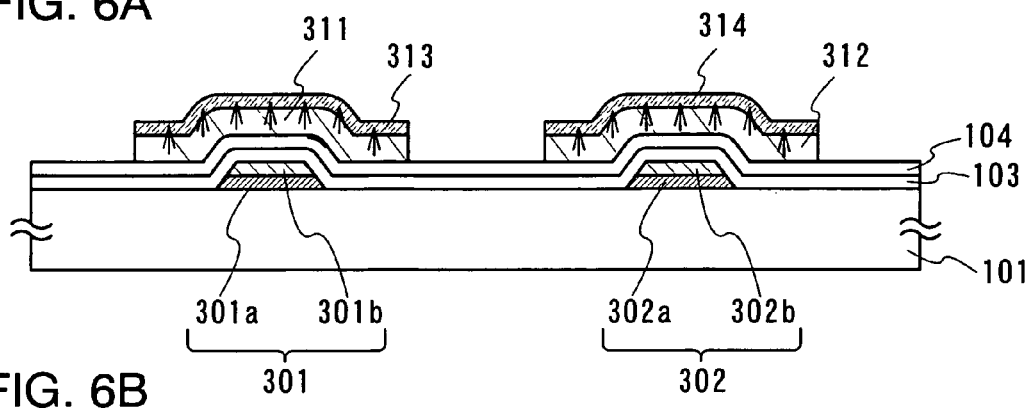
FIGS. 6A to 6D are explanatory cross-sectional views for showing a manufacturing process of a semiconductor device according to the present invention.
Figure 6B:
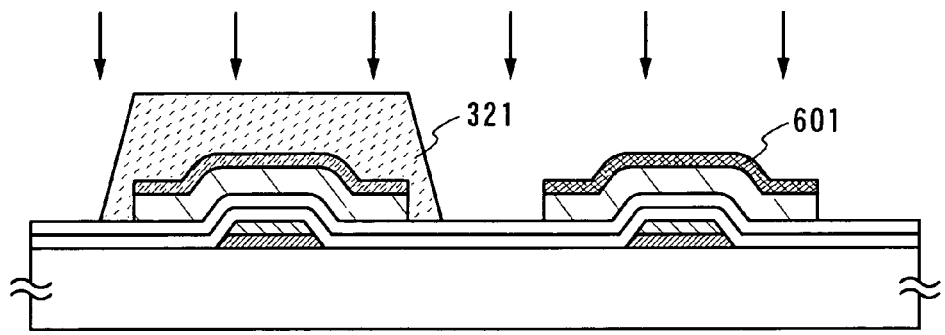
Figure 6C:
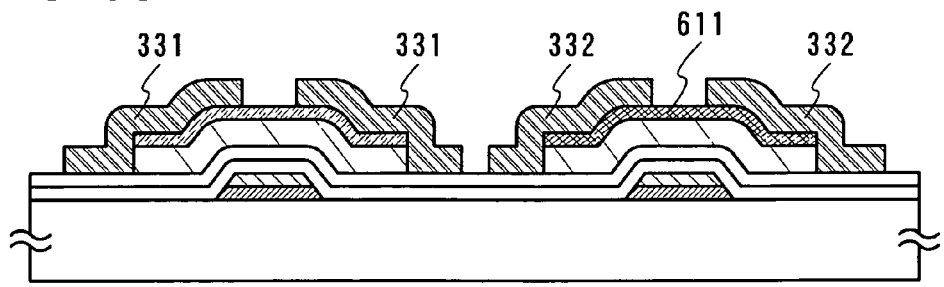

In accordance with Embodiment Mode 3, third semiconductor regions 313 and 314 and fourth semiconductor regions 311 and 312 which include a catalytic element and a donor-type element are formed as shown in FIG. 6A. Next, as shown in FIG. 6B, after forming a first mask 321, an acceptor-type element is added into the third semiconductor region 314 to form a p-type impurity region 601. At this time, by adding the acceptor-type element so as to have 2 to 10 times the concentration of that in the n-type impurity region 314, a p-type impurity region can be formed. When boron is used as an acceptor-type element, it is doped more deeply into the third semiconductor region since the molecular radius is small. Therefore, the upper portions of the fourth semiconductor regions 311 and 312 are doped with boron by its doping condition. Then, the third semiconductor region 313 and p-type impurity region 601 are heated, thereby activating the acceptor-type element and the donor-type element.

Figure 6D:
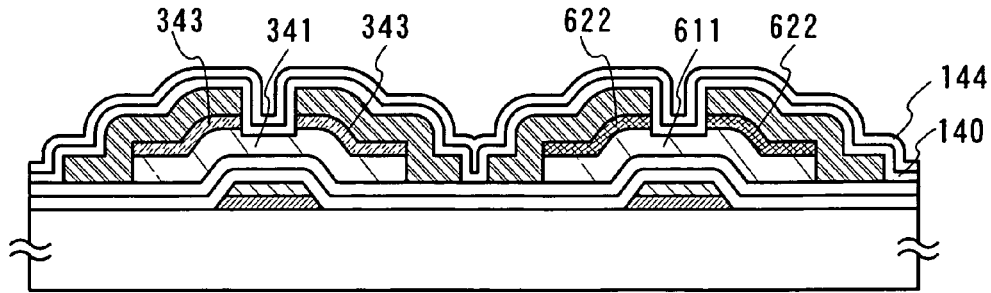

In accordance with Embodiment Mode 3, the third conductive films 311 and 312 are formed. Using the third conductive films 331 and 332 as masks, the exposed portion of the third semiconductor region 313 and the p-type impurity region 601 is etched, and then a source region and a drain region 343 and 622 and fifth semiconductor regions 341 and 611 functioning as channel formation regions as shown in FIG. 6D can be formed. Thereafter, passivation films 140 and 144 are preferably formed over the surface of the third conductive films 331 and 332, and the channel formation regions 341 and 611.o According to the steps mentioned above, an n-channel TFT and a p-channel TFT can be formed over the same substrate. By using the TFT formed in this embodiment mode, the similar effect to that in Embodiment Mode 1 can be obtained.

Embodiment Mode 7

In this embodiment mode, a positional relationship at edge portions of a gate electrode, and a source electrode and a drain electrode, or a relationship between the width of the gate electrode and a channel length are described with reference to FIGS. 7A to 7C, and FIGS. 8A to 8C.

Figure 7A:
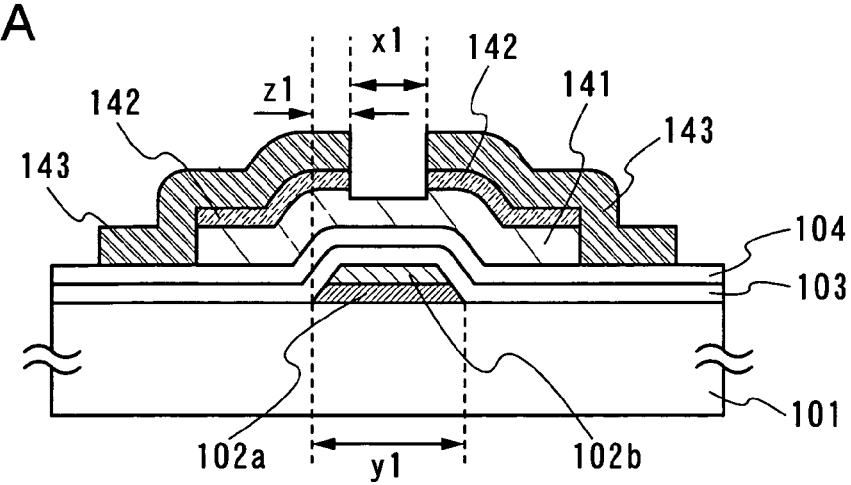
FIGS. 7A to 7C are explanatory cross-sectional views for showing a structure of a semiconductor device according to the present invention.

In FIG. 7A, edge portions of the source electrode and the drain electrode are overlapped over the gate electrode 102 only by z1. Here, the region where the gate electrode 102 is overlapped with the source electrode and the drain electrode is referred to as an overlapped region. Namely, the width $y_1$ of the gate electrode is larger than the channel length x1. The width z1 of the overlapped region is shown as (y1−x1)/2. The n-channel TFT having such an overlapped region preferably includes an n+ region 134a and an n− region 134b shown in FIG. 9B between the source electrode and the drain electrode, and the semiconductor region. By applying this structure, the relaxation effect of the electric field is increased, and hot carrier resistance can be improved.

Figure 7B:
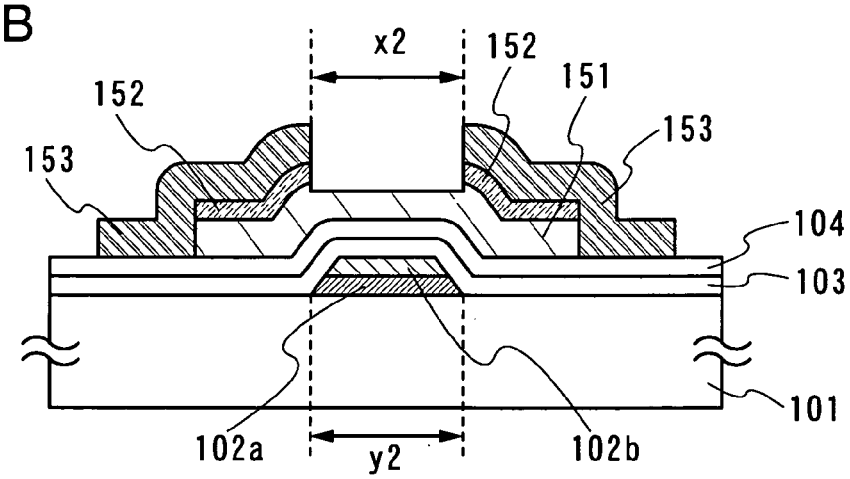

In FIG. 7B, the edge portions of the gate electrode 102 is coincided with edge portions of the source electrode and the drain electrode. Namely, the width y2 of the gate electrode and channel length $x_2$ is equivalent.

Figure 7C:
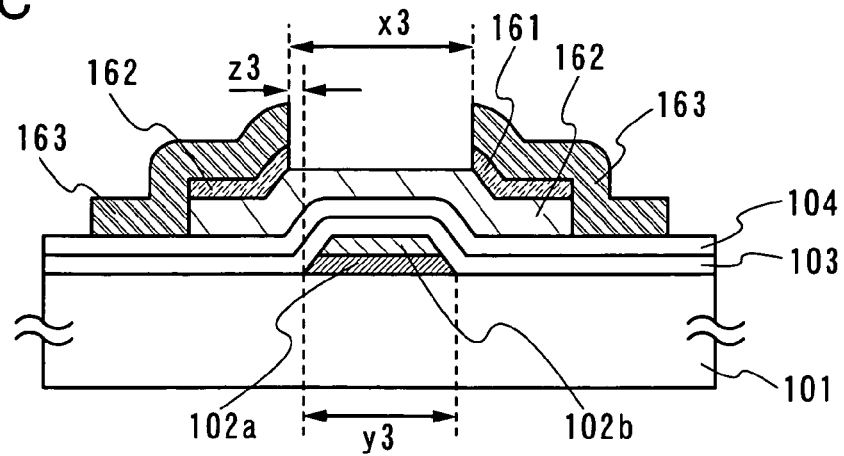

In FIG. 7C, the edge portions of the gate electrode 102 and the source and drain electrodes are separated by z3. Here, a region where the gate electrode 102 and the source and drain electrodes are separated is referred to as an off-set region. Namely, the width y3 of the gate electrode is smaller than the channel length x3. The width z3 of the off-set region is represented by (x3−y3)/2. Off-current can be reduced by using the TFT having such a structure; therefore, contrast can be improved when using the TFT as a switching element of a display device.

In FIG. 8A, the width y4 of the gate electrode is larger than the channel length x4. A first edge portion of the gate electrode 102 corresponds to an edge portion of one of the source or the drain electrode, and a second edge portion of the gate electrode 102 only corresponds by z4 to an edge portion of the other one of the source and the drain electrode. The width z4 of the overlapped region is designated by (y4−x4).

In FIG. 8B, the width y5 of the gate electrode is smaller than the channel length x5. Further, the first edge portion of the gate electrode 102 corresponds to an edge portion of one of a source or a drain electrode, and the second edge portion of the gate electrode 102 separates by z5 from the edge portion of the other one of the source or the drain electrode. The width z5 of the off-set region is designated by (x5−y5).

The electrode of which edge portion corresponds to the first edge of the gate electrode 102 is to be a source electrode and the electrode having an off-set region is to be a drain electrode, thereby an electric field relaxation in the vicinity of the drain electrode becomes possible.

In FIG. 8C, the first edge portion of the gate electrode 102 is overlapped by z6 with an edge portion of one of a source or a drain electrode, and the second edge portion of the gate electrode 102 is separated by z7 from an edge portion of the other one of the source or the drain electrode. An electrode having an overlapped region with the gate electrode 102 is to be a source electrode and an electrode having an off-set region is to be a drain electrode, thereby an electric field relaxation in the vicinity of the drain electrode becomes possible.

Furthermore, a TFT in which a semiconductor region covers a plurality of gate electrodes, a TFT with a so-called multi-gate structure, may be used. The TFT with the multi-gate structure can also reduce off-current.

Embodiment Mode 8

Figure 25:
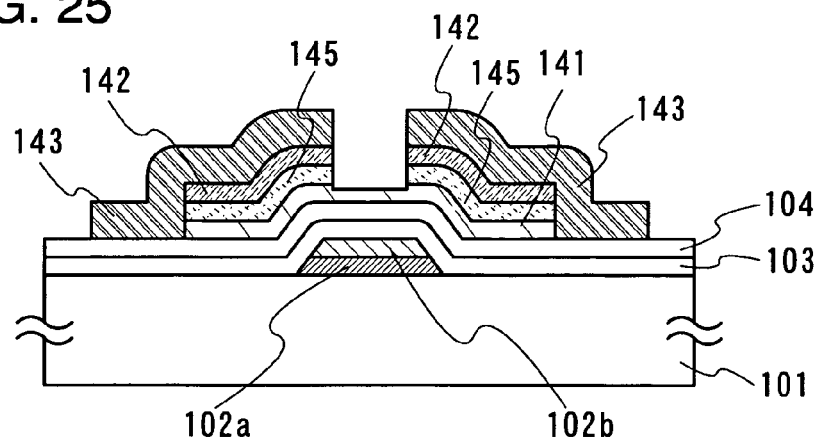
FIG. 25 is an explanatory view for showing a structure of a semiconductor device according to the present invention.

In Embodiment Modes 1 to 3, and 6, the semiconductor film having a donor-type element may have a two-layer structure formed of a semiconductor film 145 including a donor-type element at low concentration and a semiconductor film 142 including a donor-type element at high concentration, as shown in FIG. 25. By applying such a laminated structure, a TFT having an LDD region 145 can be formed as shown in FIG. 25. As a result, the relaxation effect of the electric field is increased, and a TFT having increased hot carrier resistance can be formed.

Embodiment Mode 9

Figure 26A:
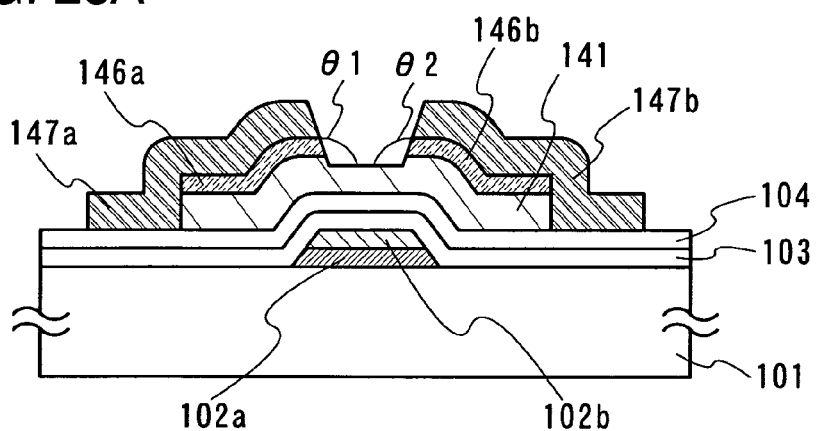
FIGS. 26A and 26B are explanatory views for showing a structure of a semiconductor device according to the present invention.

In the embodiment modes mentioned above, the source electrode and the drain electrode having perpendicular edge portions to the surface of the channel formation region is shown; however, it is not limited to this structure. As shown in FIG. 26A, the edge portion may have an angle which is more than 90° and less than 180°, preferably 95 to 135° to the surface of the channel formation region. When the angle between the source electrode and the surface of the channel formation region is θ1, and the angle between the drain electrode and the surface of the channel formation region is θ2, θ1 and θ2 may be the same or different. The source electrode and the drain electrode having such a shape can be formed by a dry etching method.

Figure 26B:
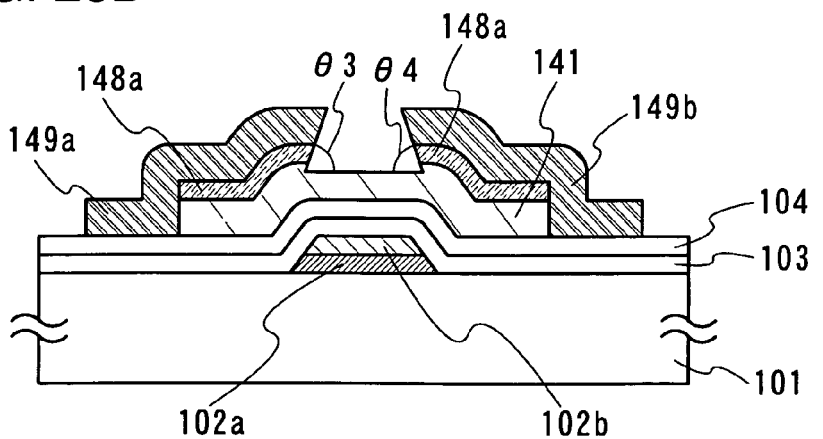

Alternatively, as shown in FIG. 26B, the edge portion may have an angle which is more than 0° and less than 90°, preferably, 45° to 85°. When the angle between the source electrode and the surface of the channel formation region is θ3, and the angle between the drain electrode and the surface of the channel formation region is θ4, the θ3 and θ4 may be the same or different. The source electrode and the drain electrode having such shapes can be formed by a wet etching method.

Embodiment Mode 10

Figure 22A:
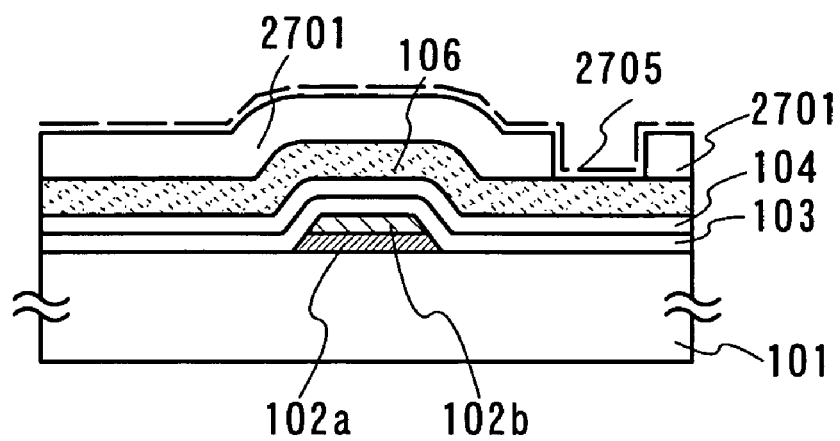
FIGS. 22A and 22B are explanatory cross-sectional views for showing a crystallization process which can be adapted to the present invention.
Figure 22B:
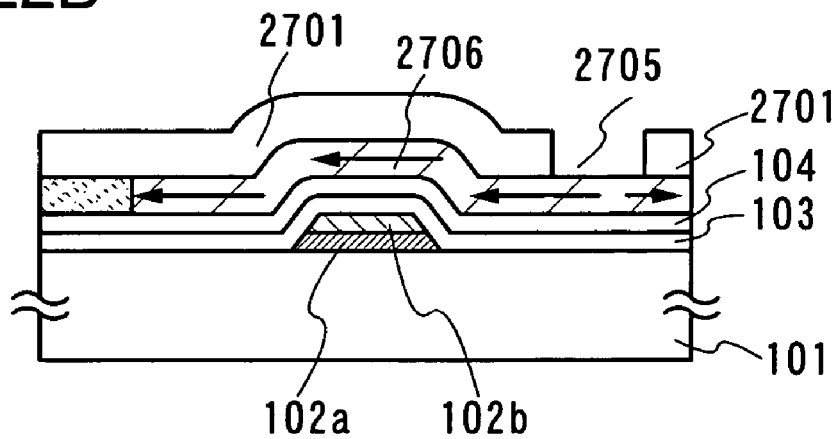

In this embodiment mode, the crystallization process of a semiconductor film which is applicable to the above embodiment mode is described with reference to FIGS. 22A and 22B and FIGS. 23A to 23D. The semiconductor film may be crystallized by forming a mask 2701 formed of an insulating film over the semiconductor film 106 as shown in FIG. 22A and forming a catalytic element layer 2705 selectively. By heating the semiconductor film, as shown by arrows in FIG. 22B, crystal growth is generated from a contact portion of the catalytic element layer and the semiconductor film to the direction parallel to the surface of the substrate. Note that crystallization is not conducted in a part which is far departed from the catalytic element layer 2705, thus an amorphous state portion is remained.

Figure 23A:
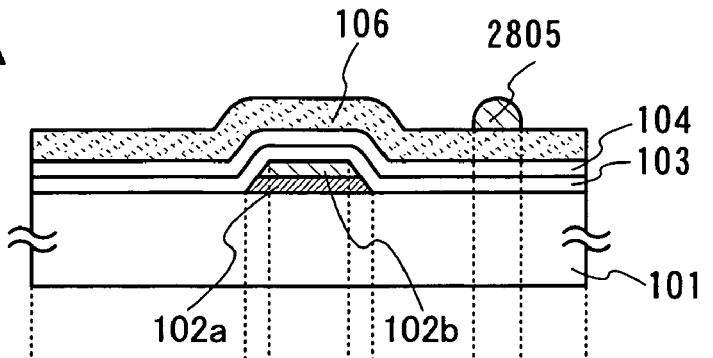
FIGS. 23A to 23D are explanatory cross-sectional and plane views for showing a crystallization process which can be adapted to the present invention.
Figure 23B:
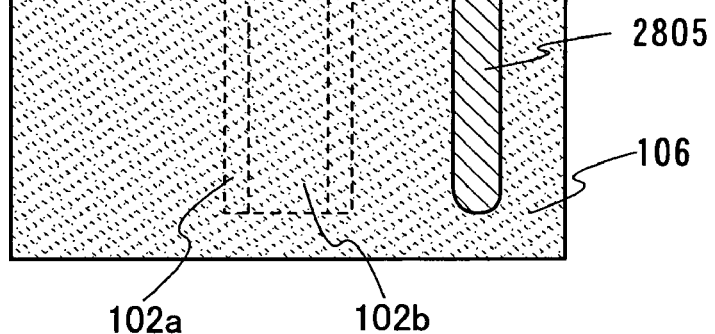
Figure 23C:
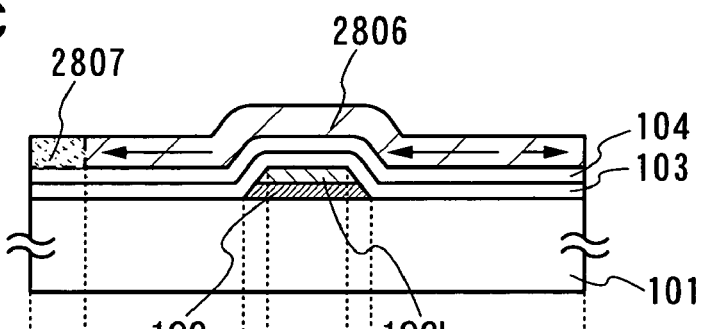
Figure 23D:
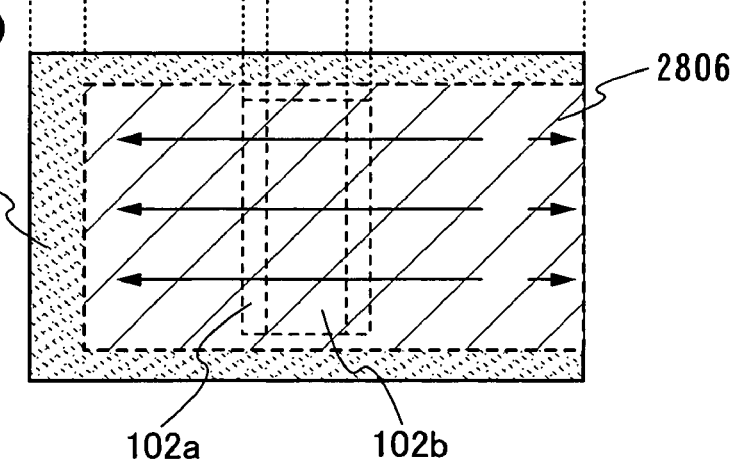

As shown in FIG. 23A, a catalytic element layer 2805 is formed selectively by a droplet discharge method to conduct the crystallization without using a mask. FIG. 23B is a top view of FIG. 23A. FIG. 23D is a top view of FIG. 23C. By crystallizing the semiconductor film, crystal growth is generated from the contact portion of the catalytic element layer and the semiconductor film to the direction parallel to the surface of the substrate. Here, crystallization is not conducted in the part which is far departed from the catalytic element layer 2705; thus, an amorphous state portion 2807 is remained.

The crystal growth to the direction parallel to the substrate is referred to as horizontal growth or lateral growth. Crystal grains with a large grain size can be formed by the horizontal growth; thus, a TFT having further higher mobility can be formed.

Example 1

In this example, a method for manufacturing an active matrix substrate and a display device having the active matrix substrate are explained with reference to FIGS. 11A to 14 and 16. In this example, a liquid crystal display device is used as the display device for illustrative purposes. FIGS. 14 and 16 are plain views for showing the active matrix substrate. FIGS. 11A to 13 show schematically longitudinal cross-section structures of a driver circuit portion taken along A-A' line and a pixel portion taken along B-B'.

A first conductive film containing aluminum as its main component is formed over a substrate 800 to have a thickness of from 50 to 100 nm. Here, a glass substrate is used as the substrate 800. A film having a thickness of 50 nm and containing aluminum as it main component and including carbon and titanium is formed by a sputtering method as the first conductive layer over the surface of the substrate 800.

A second conductive layer is formed to have a thickness of from 50 to 100 nm over the first conductive layer. As the second conductive layer, a titanium nitride film having a thickness of 50 nm is formed by a sputtering method.

As shown in FIG. 11A, gate electrodes 801 to 803 (each of the electrodes is formed by first conductive films 801a to 803a and second conductive films 801b to 803b) are formed by etching the first conductive layer and the second conductive layer with a first photomask. Here, the first conductive layer and the second conductive layer are etched by a dry etching method. The second conductive films 801b to 803b serve as protective films (cap films) for restraining generation of hillock of the first conductive films 801a to 803a containing aluminum as its main component.

A first insulating film 805 and a second insulating film 806 are formed over the surfaces of the substrate 800 and the gate electrodes 801 to 803. As the first insulating film 805, a silicon nitride film with a thickness of 50 nm is formed. As the second insulating film 806, a silicon oxynitride film (SiOxNy (x>y)) with a thickness of 100 nm is formed. The first and second insulating layers 805 and 806 are stacked by a CVD method. The first and second insulating layers 805 and 806 serve as gate insulating films. Here, the first and second insulating layers 805 and 806 are preferably formed continuously without exposing the layers to the air but only by switching a source gas.

An amorphous semiconductor film 807 having a thickness of 10 to 100 nm is formed over the first insulating film. Here, an amorphous silicon film having a thickness of 100 nm is formed by a CVD method. Then, a solution 808 including a catalytic element is coated over the surface of the amorphous semiconductor film 807. A solution including a nickel catalyst at 100 ppm is coated by a spin coating method as the solution 808. Then, the amorphous semiconductor film 807 is heated to form a crystalline semiconductor film 811 as shown in FIG. 11B. Note that the crystalline semiconductor film 811 includes a catalytic element. In this example, a crystalline silicon film including nickel is formed by heating at 650° C. for 6 minutes by RTA. And then, a channel doping process for doping a p-type or n-type impurity element at low concentration in a region to be a channel region of a TFT is entirely or selectively carried out.

Then, a semiconductor film including a donor-type element 812 with a thickness of 100 nm is formed over the surface of the crystalline semiconductor film 811 including a catalytic element. Here, an amorphous silicon film including phosphorus is formed by using a silane gas and a phosphine gas of 0.5 vol % (the flow ratio of silane to phosphine is 10/17).

Then, the crystalline semiconductor film 811 and the semiconductor film including a donor-type element 812 are heated to perform gettering of the catalytic element and activation of the donor-type element. In this example, the crystalline semiconductor film 811 and the semiconductor film including the donor-type element 812 are heated at 650° C. for 6 minutes by RTA to move the catalytic element in the crystalline semiconductor film 811 including the catalytic element to the semiconductor film including the donor-type element 812. A crystalline semiconductor film with reduced concentration of a catalytic element formed as described above is indicated by reference numeral 813 in FIG. 11C. The semiconductor film including a donor-type element to which the catalytic element is moved becomes a crystalline semiconductor film by the heating, that is, becomes a crystalline semiconductor film including a catalytic element and a donor-type element 814. In this embodiment, a crystalline silicon film including nickel and phosphorus is formed as the crystalline semiconductor film 814.

The crystalline semiconductor film 813 and the crystalline semiconductor film including a catalytic element and a donor-type element 814 are etched into desired shapes with a second photomask. The crystalline semiconductor film 813 which is etched is referred to as first semiconductor regions 821 to 823, whereas the crystalline semiconductor film including a catalytic element and a donor-type element 814 which is etched is referred to as second semiconductor regions 824 to 826.

In order to connect a gate electrode of a part of a TFT to a source electrode or a drain electrode in the driver circuit, a contact hole 850 as shown in FIG. 16 is formed by etching parts of the first insulating film 805 and the second insulating film 806 with a third photomask.

Figure 12A:
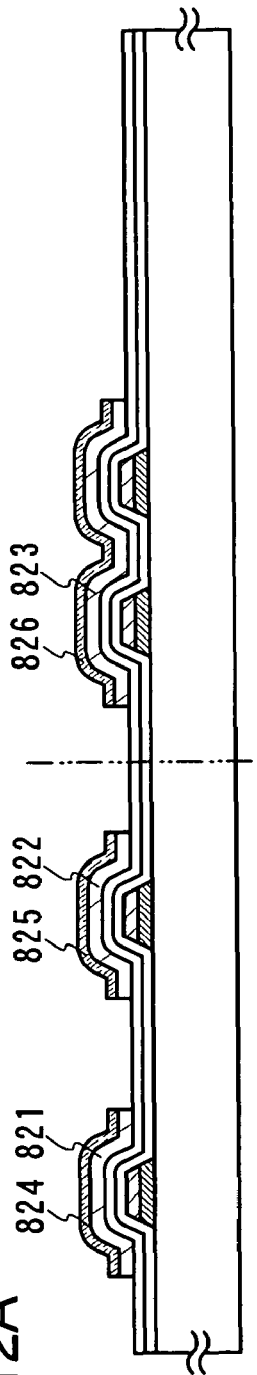
FIGS. 12A to 12C are explanatory cross-sectional views for showing a manufacturing process of a semiconductor device according to the present invention.
Figure 12B:
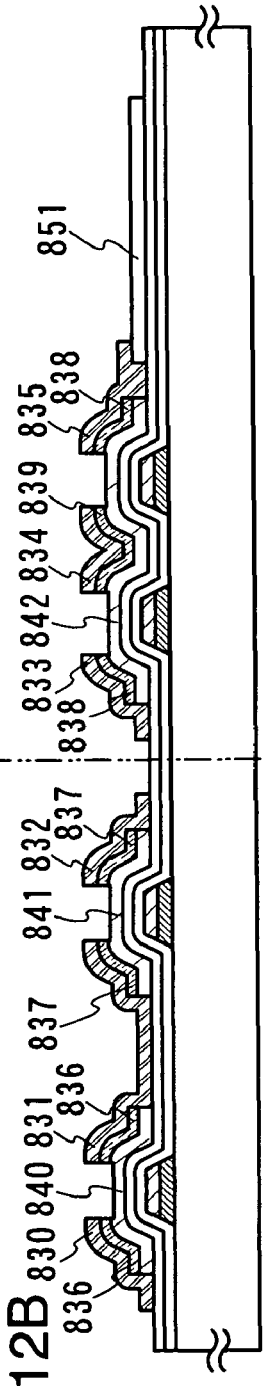

As shown in FIG. 12B, a third conductive layer serving as a pixel electrode is formed over the second insulating film 806 which is formed over the substrate. As a material for the third conductive layer, a conductive film having a light-transmitting property or a conductive film having reflectivity can be nominated. As a material for the conductive film having a light-transmitting property, an indium tin oxide (ITO), a zinc oxide, an indium zinc oxide (IZO), a zinc oxide added with gallium (GZO), an indium tin oxide including a silicon oxide (ITSO), and the like can be nominated. As a material for the conductive film having reflectivity, metal such as aluminum (Al), titanium (Ti), silver (Ag), or tantalum (Ta); a metallic material containing nitrogen in concentration which is no less than a stoichiometric composition ratio to the metal; a nitride of the metal such as titanium nitride or tantalum nitride; aluminum containing nickel of from 1 to 20 atomic %; or the like can be nominated. Then, the third conductive layer is etched into a desired shape to form a third conductive film 851. As a method for forming the third conductive film 851, a sputtering method, a vapor deposition method, a CVD method, a coating method, or the like is appropriately used. In this example, a indium tin oxide including a silicon oxide (ITSO) is formed and etched in a desired shape to have a thickness of 110 nm to form the third conductive film 851.

A fourth conductive layer with a thickness of 100 to 300 nm is formed to have contact with the first semiconductor regions 821 to 823, the second semiconductor regions 824 to 826, the second insulating film 806, and the third conductive film 851. Here, a molybdenum film is formed to have a thickness of 200 nm by a sputtering method. Fourth conductive films 830 to 835 are formed by etching the fourth conductive layer into desired shapes with a fourth photomask. In this example, a solution including phosphoric acid, acetic acid, and nitric acid (mixed acid) is used to etch the molybdenum film by a wet etching method to form the fourth conductive films 830 to 835. The fourth conductive films 830 to 835 serve as a source electrode and a drain electrode.

The second semiconductor regions 824 to 826 are etched using the fourth conductive films 830 to 835 as masks to form source regions and drain regions 836 to 839. In that case, a part of the first semiconductor regions 821 to 823 are etched. First semiconductor regions (third semiconductor regions) 840 to 842 which are formed by etching serve as channel formation regions.

Figure 12C:
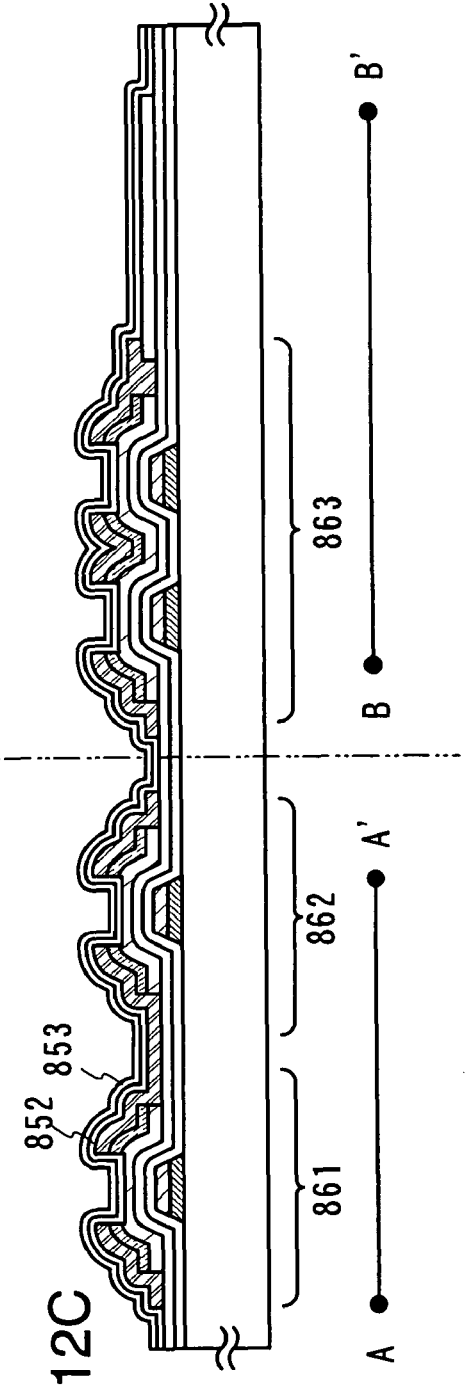

Subsequently, as shown in FIG. 12C, a third insulating film 852 and a fourth insulating film 853 are formed so as to have contact with the surfaces of the second insulating film 806, the fourth conductive films 830 to 835, and the third semiconductor regions 840 to 842. In this example, a silicon oxynitride film containing hydrogen with a film thickness of 150 nm is formed by a CVD method as the third insulating film 852. Furthermore, a silicon nitride film with a film thickness of 200 nm is formed by a CVD method as the fourth insulating film. Note that the silicon nitride film functions as a protective film for blocking impurities from outside.

A silicon nitride film and a silicon oxynitride film formed over a wiring of a connection terminal portion are etched to expose the surface of the wiring in order to connect to an external terminal.

The third semiconductor regions 840 to 842 are heated to be hydrogenated. Here, the third semiconductor regions 840 to 842 are heated at 410° C. for 1 hour in a nitrogen atmosphere, and hydrogen included in the third insulating film 852 is added to the third semiconductor regions 840 to 842 to be hydrogenated.

Refer also to FIG. 14 illustrating a plane structure of a longitudinal cross-section structure B-B' of a pixel portion shown in FIG. 12C.

According to the foregoing steps, an active matrix substrate of a liquid crystal display device composed of a driver circuit formed by n-channel type TFTs 861, 862 and a pixel portion having an n-channel TFT 863 including a double gate 803. Since the driver circuit is formed by an n-channel TFT in this example, a p-channel TFT is not required to be formed and the number of steps can be reduced.

Figure 13:
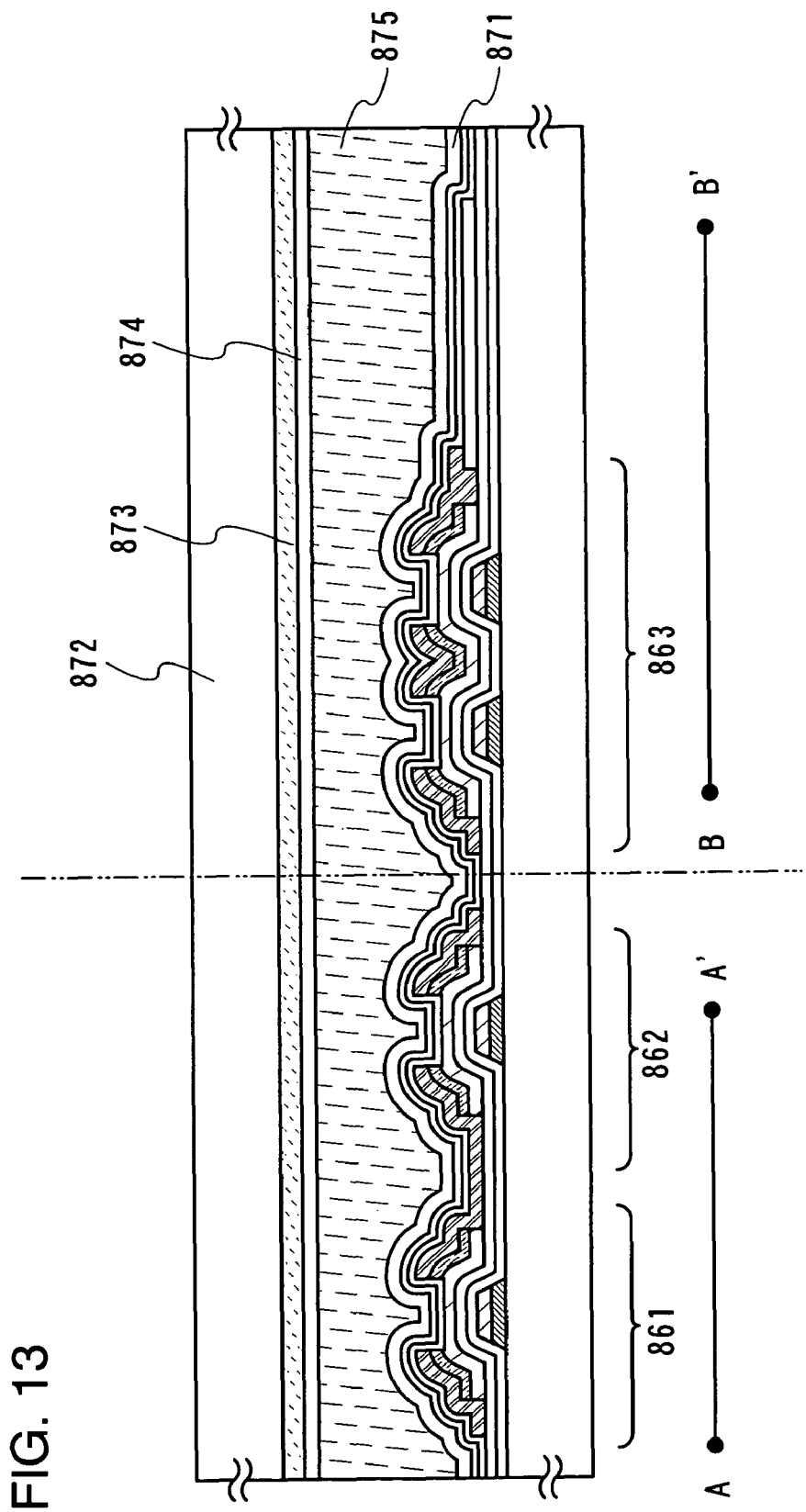
FIG. 13 is an explanatory cross-sectional view for showing a manufacturing process of a semiconductor device according to the present invention.
Figure 14:
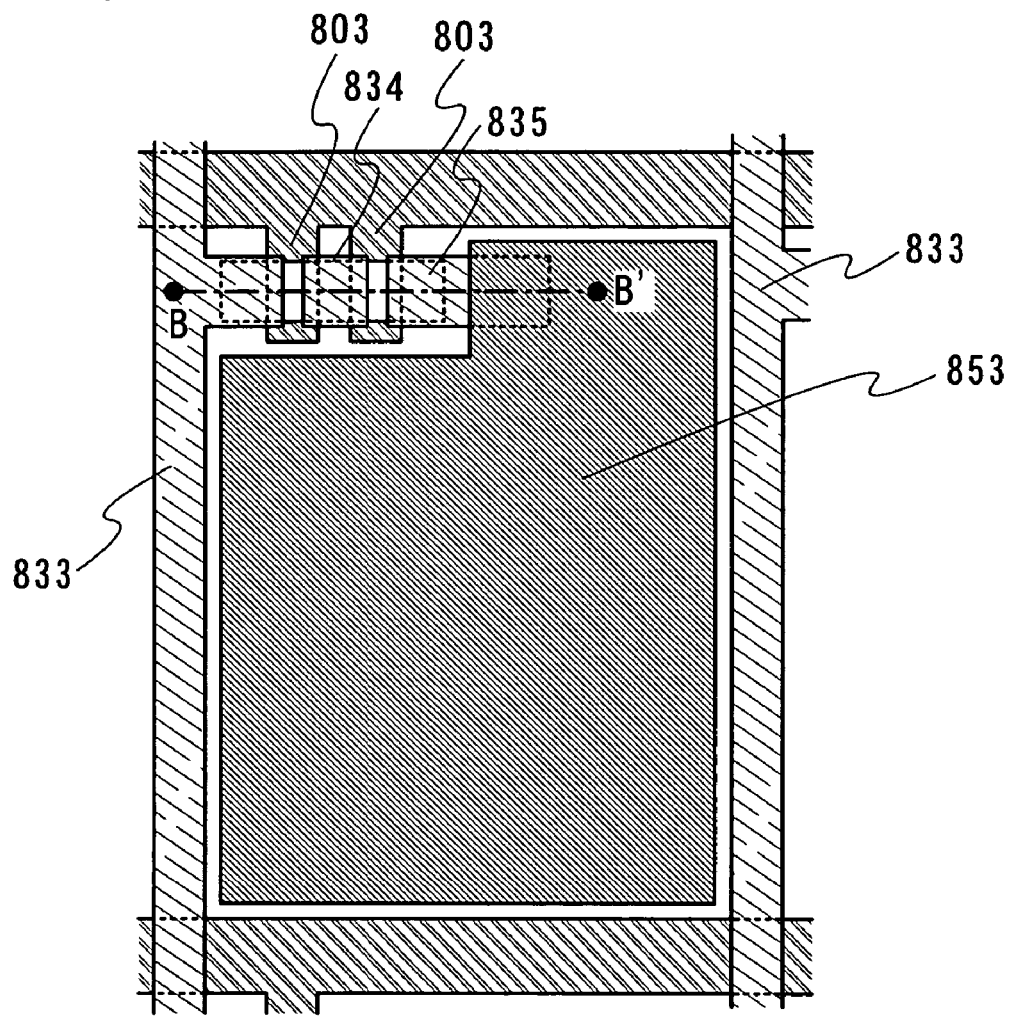
FIG. 14 is an explanatory top view for showing a structure of a semiconductor device according to the present invention.

As shown in FIG. 13, an insulating film is formed by a printing method or a spin coating method to cover the fourth insulating film 853, and rubbing treatment of the insulating film is performed to form an oriented film 871. By forming the oriented film 871 by an oblique evaporation method, the oriented film can be formed at low temperature over plastic having low heat resistance.

A second pixel electrode (opposing electrode) 873 and an oriented film 874 are formed over an opposing substrate 872. Then, a closed-loop sealing agent is formed over the opposing substrate 872. In that case, the sealing agent is formed at the periphery of a pixel portion by a droplet discharge method. And then, a liquid crystal material is delivered by drops into the inside of the closed-loop formed by a sealing agent by a dispenser (dropping manner).

The sealing agent can be mixed with filler. Further, a color filter, a shielding film (black matrix), and the like can be formed over the opposing substrate 872.

The opposing substrate 872 provided with the oriented film 874 and the second pixel electrode (opposing electrode) 873 is pasted onto the active matrix substrate in vacuo. A liquid crystal layer 875 filled with a liquid crystal material is formed by ultraviolet curing. Instead of the dispenser (dropping manner), dipping, which injects a liquid crystal material between pasted substrates by capillary phenomenon, can be used as a method for forming the liquid crystal layer 875.

According to the foregoing steps, a liquid crystal display panel can be manufactured. Further, a protective circuit for preventing electrostatic destruction, typically, a diode or the like can be provided between the connection terminal and the source wiring (gate wiring) or to the pixel portion. In that case, the diode can be operated by the same step as that used to manufacture the foregoing TFT and by connecting a gate wiring layer of the pixel portion to the drain or source wiring layer of the diode.

According to the foregoing steps, the liquid crystal display device can be formed. Further, any of Embodiment Modes 1 to 10 can be applied to this example.

Example 2

Figures 15A, 15B:
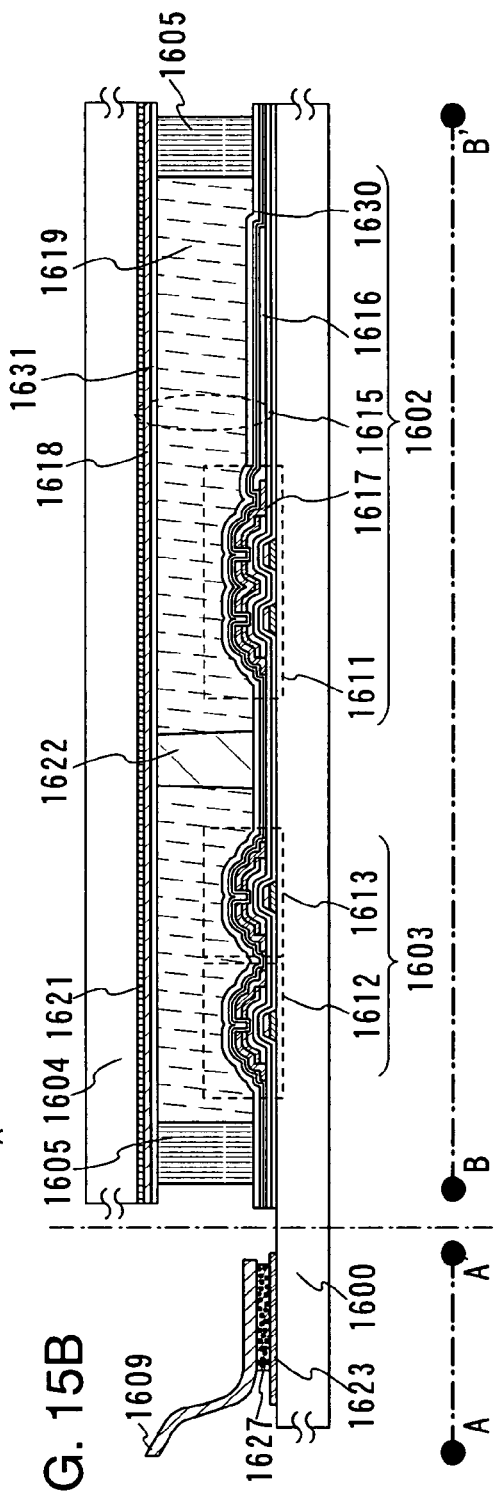
FIGS. 15A and 15B are explanatory top and cross-sectional views for showing a structure of a semiconductor device according to the present invention.

In this example, appearance of a liquid crystal display device panel corresponding to a mode of the semiconductor device according to the present invention is explained with reference to FIGS. 15A and 15B. FIG. 15A is a top view for showing a panel composed of sealed first and second substrates 1600, 1604 with a first sealing agent 1605 and a second sealing agent 1606. FIG. 15B is a cross-sectional view of FIG. 15A taken along line A-A' and B-B'. The active matrix substrate manufactured in Example 1 can be used as the first substrate 1600.

In FIG. 15A, reference numeral 1602 denotes a pixel portion which is indicated by a dotted line and 1603 denotes a scanning line driver circuit. Further, reference numeral 1601 denotes a signal line (gate line) driver circuit which is indicated by a solid line. In this example, the pixel portion 1602 and the scanning line driver circuit 1603 are provided within a region sealed with the first and second sealing agents. Reference numeral 1601 denotes a signal line (gate line) driver circuit, and a chip like signal line driver circuit is provided over the first substrate 1600.

Reference numeral 1600 denotes a first substrate; 1604, a second substrate; 1605 and 1606, a first sealing agent and a second sealing agent, respectively, each of which includes a gap material for holding a space between an enclosed space. The first substrate 1600 and the second substrate 1604 are sealed with the first sealing agent 1605 and the second sealing agent 1606. A liquid crystal material fills between the substrates.

The cross-sectional structure is explained with reference to FIG. 15B. The driver circuit and the pixel portion are formed over the first substrate 1600. The first substrate 1600 has a plurality of semiconductor elements as typified by TFTs. A color filter 1621 is provided over the surface of the second substrate 1604. The scanning line driver circuit 1603 and the pixel portion 1602 are illustrated as the driver circuits. A CMOS circuit which is a combination of an n-channel TFT 1612 and a p-channel TFT 1613 is formed as the scanning driver circuit 1603. Further, as with Example 1, the driver circuit can be formed by a single channel TFT.

In this example, the scanning line driver circuit and the TFT of the pixel portion are formed over the same substrate. Accordingly, a volume of the display device can be reduced.

A plurality of pixels is provided for the pixel portion 1602. A liquid crystal element 1615 is provided to each of the pixels. The liquid crystal element 1615 is a portion formed by stacking a first electrode 1616, a second electrode 1618, and a liquid crystal material 1619 which fills between the first electrode 1616 and the second electrode 1618. The first electrode 1616 included in the liquid crystal element 1615 is electrically connected to a TFT 1611 via a wiring 1617. Although the first electrode 1615 is formed after forming the wiring 1617 here, the wiring 1617 can be formed after forming the first electrode 1616 as explained in Example 1. The second electrode 1618 of the liquid crystal element 1615 is formed at the side of the second substrate 1604. Further, oriented films 1630, 1631 are formed over each surface of the pixel electrode.

Reference numeral 1622 is a column like spacer which is provided to control a distance (cell gap) between the first electrode 1616 and the second electrode 1618. The spacer is formed by etching an insulating film into a desired shape. Further, a spherical spacer can also be used. Various kinds of a signal and an electrical potential fed to the signal line driver circuit 1601 or the pixel portion 1602 are supplied from an FPC 1609 via a connection wiring 1623. The connection wiring 1623 and the FPC 1609 are electrically connected to an anisotropic conductive film or anisotropic conductive resin 1627. Instead of the anisotropic conductive film or the anisotropic conductive resin, a conductive paste such as solder or the like can be used.

Although not shown, a polarizing plate is fixed to one or both surfaces of the first substrate 1600 and the second substrate 1604 with an adhesive agent. As the polarizing plate, a circular polarizing plate or an elliptic polarizing plate each of which is provided with a retardation film can be used.

Example 3

Figure 19:
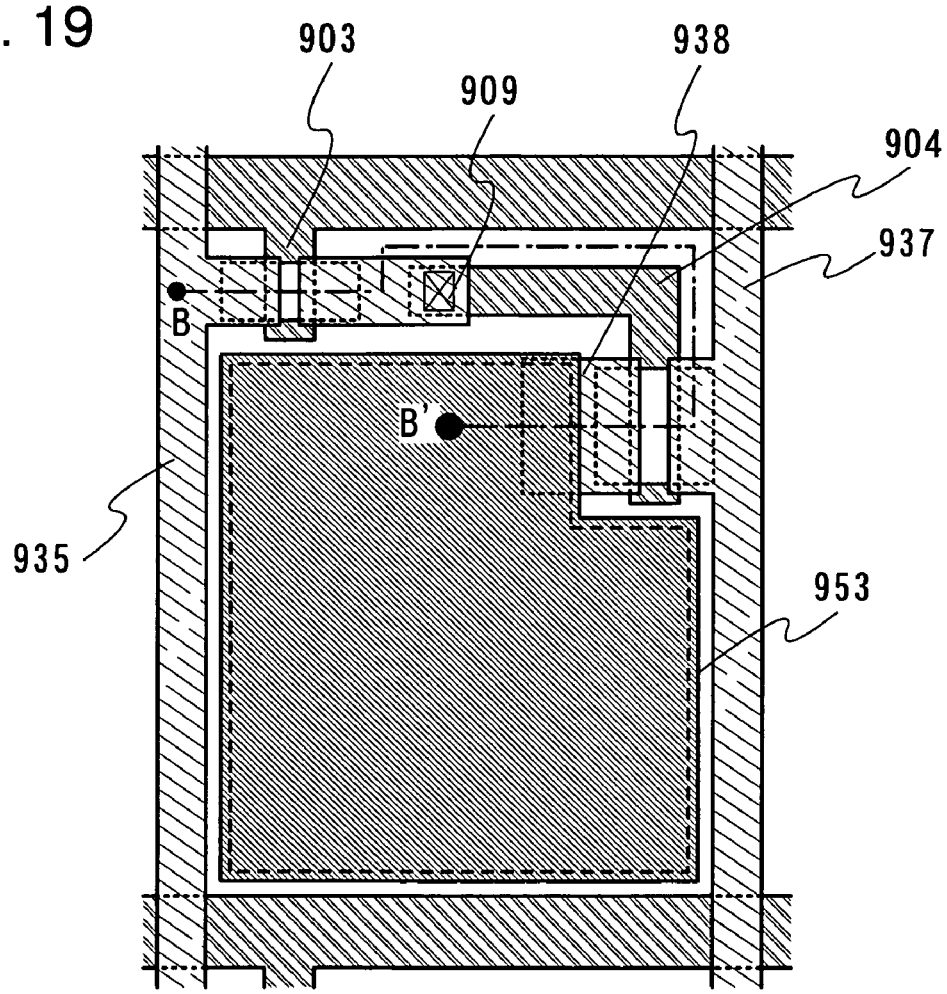
FIG. 19 is an explanatory top view for showing a structure of a semiconductor device according to the present invention.

Then, a method for manufacturing an active matrix substrate and a display device having the active matrix substrate is explained with reference to FIGS. 17A to 19. In this example, a light-emitting display device is used as the display device for illustrative purposes. FIG. 19 is a plane view of the active matrix substrate. FIGS. 17A to 18B illustrate schematically a longitudinal cross-section structure of the active matrix substrate in FIG. 19 taken along line B-B'. Although a plane view of the driver circuit is not shown, a longitudinal cross-section structure of the driver circuit is schematically shown in A-A' portions in FIGS. 17A to 17C and FIGS. 18A and 18B.

As shown in FIG. 17A, a first conductive layer with a thickness of 50 to 100 nm and a second conductive layer with a thickness of 50 to 100 nm are sequentially formed over a substrate 900 as with Example 1, and etched to form gate electrodes 901 to 904 (each of the gate electrodes is formed by a pair of a first conductive film 901a to 904a and a second conductive film 901b to 904b).

Then, a first insulating film 905 and a second insulating film 906 are formed over surfaces of the substrate 900 and gate electrodes 901 to 904.

An amorphous semiconductor film is formed to have a thickness of 10 to 100 nm over the first insulating film, and a solution containing a catalytic element is coated over the surface of the amorphous semiconductor film. The amorphous semiconductor film is heated to form a crystalline semiconductor film. Further, the crystalline semiconductor film includes a catalytic element. Then, a channel dope process for adding p-type or n-type impurity elements at a low concentration to a region which is formed to be a channel region of a TFT is carried out selectively or entirely.

A semiconductor film including a donor-type element 908 with a thickness of 100 nm is formed over a surface of a crystalline semiconductor film including a catalytic element 907. Then, the crystalline semiconductor film and the semiconductor film including a donor-type element 812 are heated and gettering of the catalytic element is performed, simultaneously, the donor-type element is activated. That is, the catalytic element in the crystalline semiconductor film 907 is moved into the semiconductor film including a donor-type element. The crystalline semiconductor film with a reduced catalytic element concentration is denoted by reference numeral 907 in FIG. 17A. The semiconductor film including a donor-type element to which the catalytic element is moved becomes a crystalline semiconductor film by heating, that is, a crystalline semiconductor film including a catalytic element and a donor-type element. The foregoing crystalline semiconductor film is denoted by reference numeral 908 in FIG. 17A.

The crystalline semiconductor films 907, 908 including the catalytic elements and the donor-type element are etched with a second photomask into desired shapes. The etched crystalline semiconductor film including a catalytic element and a donor-type element 908 is indicated by first semiconductor regions 915 to 918, whereas the etched crystalline semiconductor film 907 is indicated by second semiconductor regions 911 to 914.

As shown in FIG. 17C, first masks 920 to 923 are formed with a third photomask. The first mask 920 covers entirely the first semiconductor region 915 and the second semiconductor region 911. The first mask 921 covers entirely the first semiconductor region 917 and the second semiconductor region 913. These semiconductor regions will serve as n-channel TFTs. The first masks 922 and 923 cover a part of the first semiconductor regions 916 and 918, respectively. In that case, the first masks 922 and 923 are preferably narrower than channel lengths of TFTs to be formed. The first semiconductor regions 916 and 918 and the second semiconductor regions 912 and 914 which are covered by the first semiconductor regions 916 and 918 will serve as p-channel TFTs.

Acceptor elements are added to exposed portions of the first semiconductor regions 912, 914 to form p-type impurity regions 925, 926, 928, and 930. In that case, regions covered with the masks 922 and 923 remain as n-type impurity regions 927 and 923.

After removing the first masks 920 to 923, the first semiconductor regions 915 and 917 and the first impurity regions 916 and 918 added with acceptor-type elements are heated to activate impurity elements. Here, heating at 550° C. for 1 hour is carried out.

According to the foregoing steps, an active matrix substrate of a light-emitting display device, which is composed of the n-channel TFT 952, a driver circuit formed by the p-channel TFT 953, a switching TFT formed by an n-channel TFT, and a pixel portion having a driver TFT 955 formed by a p-channel TFT can be formed.

Then, a third conductive layer is formed. The third conductive layer is formed by stacking a reflective conductive film and a transparent conductive film. Here, a titanium nitride film and an indium tin oxide (ITSO) containing a silicon oxide are stacked by a sputtering method. And then, the third conductive layer is etched with a fourth photomask to form a third conductive film 951 serving as a pixel electrode.

Although not shown, parts of the first insulating films 905, 906 formed over a surface of the gate electrode 904 shown in FIG. 19 are etched to form a contact hole 909 and expose a part of the gate electrode 904.

As with example 1, a fourth conductive layer is formed and etched with a sixth photomask into a desired shape as shown in FIG. 18A to form fourth conductive films 931 to 938. The fourth conductive film 936 is connected to the gate electrode 904. The fourth conductive films 931 to 938 serve as source electrodes and drain electrodes.

With the use of the fourth conductive films 931 to 938 as masks, the first semiconductor regions are etched to form source regions and drain regions 941 to 948. In that case, a part of the second semiconductor regions are also etched. Third semiconductor regions which are the etched second semiconductor regions serve as channel formation regions.

As shown in FIG. 12C, a third insulating film 852 and a fourth insulating film 853 are formed over the surfaces of the third conductive film, the fourth conductive film, and the third semiconductor region. Here, a silicon oxynitride film with a thickness of 150 nm containing hydrogen is formed as the fourth insulating film by a CVD method. A silicon nitride film with a thickness of 200 nm is formed as the fifth insulating film by a CVD method. The silicon nitride film serves as a protective film for blocking impurities from the outside.

The semiconductor region is heated to be hydrogenised. Here, hydrogen included in the third insulating film is doped into the third semiconductor region and the third semiconductor region is hydrogenised at 410° C. for 1 hour in a nitrogen atmosphere.

After forming entirely a fifth insulating film, the fifth insulating film, the fourth insulating film, and the third insulating film are etched with a seventh photomask to form a fifth insulating layer 961, a fourth insulating layer 966, and a third insulating layer 965, respectively. In the case of forming the third to fifth insulating layers, a first pixel electrode 951 and a connection terminal portion are processed to be exposed.

As a material for the fifth insulating film, an inorganic insulating material such as a silicon oxide, a silicon nitride, a silicon oxynitride, an aluminum oxide, an aluminum nitride, or an aluminum oxynitride; an acrylic acid, a methacrylic acid, and derivatives of these acids; heat-resistant high molecular weight such as polyimide, aromatic polyamide, or polybenzimidazole; an organic siloxane polymer based insulating material in which silicon on hydrogen is substituted by an organic group such as methyl or phenyl as typified by inorganic siloxane polymer, alkylsiloxane polymer, alkylsilsesquioxane polymer, hydrogenated silsesquioxane polymer, hydrogenated alkylsilsesquioxane polymer, each of which has the Si—O—Si bond among compounds composed of silicon, oxygen, and hydrogen formed by using a siloxane polymer based material such as silica glass as a starting material; can be used. As a method for forming the fifth insulating film, a known method such as a CVD method, a coating method, or a printing method is used. In the case of using a coating method, the surface of the second insulating layer can be smoothed. By using a material formed by dispersing or dissolving a material absorbing visible light such as black pigment or coloring matters into an organic material for forming the fifth insulating layer, stray light of a light-emitting element to be formed is absorbed into the fifth insulating layer and contrast of each pixel can be improved. A photosensitive material is preferably used for the fifth insulating layer since it becomes possible that the fifth layer is formed to have a side face having a radius of curvature which changes continuously and that a thin layer is formed without step cut over the fifth layer. Here, the fifth insulating film is formed by coating acrylic resin by a coating method and baking the coated acrylic resin.

According to the foregoing steps, an active matrix substrate of a light-emitting display device can be formed.

An electroluminescent layer 963 is formed over edges of the third conductive film 951 and the fifth insulating layer 961 by a vapor deposition method, a coating method, a droplet discharge method, or the like. Then, a fifth conductive film 964 serving as a second pixel electrode is formed over the electroluminescent layer 963. Here, indium tin oxide containing a silicon oxide (ITSO) is formed by a sputtering method. As a result, a light-emitting element can be formed by the third conductive film, the electroluminescent layer, and the fifth conductive film. Each material for the conductive films and the electroluminescent layer each of which composes the light-emitting element is appropriately selected. Each thickness of these films and the layer is controlled.

Before forming the electroluminescent layer 963, heat treatment at 200 to 350° C. is carried out in the atmosphere to remove moisture within the fifth insulating layer 961 or moisture adsorbed to a surface of the fifth insulating layer 961. Further, heat treatment at from 200 to 400° C., preferably, 250 to 350° C. in a reduced pressure is preferably carried out to form the electroluminescent layer 963 without exposing to the air by a vapor deposition method, a droplet discharge method under an atmospheric pressure or a reduced pressure, a coating method, or the like.

The electroluminescent layer 963 can be formed by a charge injection transportation material and a light-emitting material including an organic compound or an inorganic compound, can include one or a plurality kinds of layers selected from a low molecular weight organic compound, an intermolecular weight organic compound (which does not have a subliming property but have a molecular chain length of 10 μm or less as typified by dendrimer, oligomer, or the like), and a high molecular weight organic compound, and can be combined with an inorganic compound having an electron injecting transporting property or a hole injecting transporting property.

The light-emitting layer can be formed to provide color display by forming light-emitting layers having different light emission wavelength bands in pixels, respectively. Typically, light-emitting layers corresponding to each color of R (red), G (green), and B (blue) are formed. In that case, color purity can be improved or a mirror surface of a pixel portion can be prevented by forming a structure in which a filter (colored layer) which transmits light in the emission wavelength band of the light-emitting layers is provided at a light emission side of the pixel. By providing the filter (colored layer), a circular polarized plate which has conventionally required becomes unnecessary and loss of light emitted from the light-emitting layer can be eliminated. Moreover, change in hue observed by looking obliquely the pixel portion (display screen) can be reduced.

On the other hand, a high molecular weight organic light-emitting material has higher physical strength than that of a low molecular weight organic light-emitting material, and so a light-emitting element made from a high molecular weight organic material has high durability. Since a high molecular weight organic light-emitting material can be formed into a film by coating, a light-emitting element structure using the high molecular weight organic light-emitting material is basically the same as that formed by a low molecular weight organic light-emitting material formed by stacking sequentially a cathode, an electroluminescent layer, and an anode over a substrate. However, a laminated structure which is formed in the case of using a low molecular weight organic light-emitting material is difficult to be formed as a laminated structure composed of an electroluminescent layer made from a high molecular weight organic light-emitting material. Most cases, the electroluminescent layer is formed to have two laminated layers. Specifically, a structure is composed sequentially of a substrate, an electroluminescent layer, a hole transporting layer, and an anode.

Since emission color is determined by a material for forming the light-emitting layer, a desired light-emitting element exhibiting desired light emission can be formed by selecting the material. As a high molecular weight light-emitting material which can be used for forming the light-emitting layer, polyparaphenylene vinylene based, polyparaphenylene based, polythiophene based, and polyfluorene based materials can be nominated.

In the case that a high molecular weight organic light-emitting material having a hole transporting property is interposed between an anode and a high molecular weight organic light-emitting material having a light emitting property, a hole injecting property of the anode can be improved. Generally, the one which is dissolved with an acceptor material into water is applied by a spin coating method or the like. Since the high molecular weight organic light-emitting material having the hole transporting property is insoluble in an organic solvent, the foregoing material can be stacked over the above mentioned light-emitting material having a light emitting property.

The light-emitting layer can be formed to have a structure exhibiting a single color emission or white emission. In the case of using a white light emitting material, color display can be realized by providing a filter (colored layer) transmitting light at a specified wavelength at a light emission side of a pixel.

In order to form a light-emitting layer emitting white emission, $Alq_3$, $Alq_3$ doped partly with Nile red which is a red emission coloring matter, $Alq_3$, p-EtTAZ, and TPD (aromatic diamine) are stacked sequentially by a vapor deposition method. In the case of forming a light-emitting layer by a coating method using spin coating, the foregoing material is preferably coated and baked by vacuum heating.

The light-emitting layer can be formed by a single layer. 1,3,4-oxadiazole derivatives (PBD) having an electron transporting property can be dispersed to polyvinylcarbazole (PVK) having a hole transporting property. Further, white emission can be obtained by dispersing PBD of 30 wt % as an electron transporting agent and dispersing an appropriately amount of four kinds coloring matters (TPD, coumarin 6, DCM1, and Nile red). Besides the light-emitting element exhibiting white emission, light-emitting elements exhibiting red emission, green emission, or blue emission can be manufactured by appropriately selecting a material of the light-emitting layer.

In the case that a high molecular weight organic material having a hole transporting property is interposed between an anode and a high molecular weight organic material having a light emitting property, a hole injecting property of the anode can be improved. Generally, a high molecular weight organic material having a hole transporting property dissolved in water together with an acceptor material is coated by a spin coating method. Since the high molecular weight organic material having a hole transporting property is insoluble in an organic solvent, the foregoing material can be stacked over the above mentioned light-emitting material having a light emitting property.

As a material for the light-emitting layer, a triplet excited material including metal complexes can be used besides a singlet excited light-emitting material. For example, a red luminescent pixel which has a relatively short half-brightness life is formed by a triplet excited light-emitting material among the red luminescent pixel, a green luminescent pixel, and blue luminescent pixel; and the other pixels are formed by a singlet excited light-emitting material. Since a triplet excited light-emitting material has good emission efficiency, there is an advantage of obtaining luminescence which can be obtained in the case of using a singlet excited light-emitting material at low power consumption. That is, reliability can be improved since a light-emitting element can be operated at a small amount of current in the case of applying a triplet excited light-emitting material for a red emission pixel. In order to reduce power consumption, a red luminescent pixel and a green luminescent pixel can be formed by a triplet excited light-emitting material, and a blue luminescent pixel can be formed by a singlet excited light-emitting material. By forming a green luminescent pixel which is well visible for human by a triplet excited light-emitting material, power consumption can be further reduced.

As an example of a triplet excited light-emitting material, a material using metal complexes as a dopant can be nominated. The following are known as the foregoing metal complexes: metal complexes having platinum which is the third transition series element as a central metal, metal complexes having iridium as a central metal, or the like. These compounds are not limited as a triplet excited light-emitting material. A compound having the foregoing structure and a compound having Group 8 to Group 10 elements as a central metal can be used.

The following materials for forming the foregoing electroluminescent layer are illustrative only. A light-emitting element can be formed by appropriately stacking functional each layer such as a hole injecting transporting layer, a hole transporting layer, an electron injecting transporting layer, an electron transporting layer, a light-emitting layer, an electron blocking layer, or a hole blocking layer. Further, a mixed layer or mixed junction can be formed by combining each of the foregoing layers. A layer structure of the light-emitting layer is variable. Instead of not providing a specific electron injection region or light emitting region, various changes and modifications such as providing an electrode or a dispersed luminescent material for being used only for the electron injection region or the light emitting region are permissible unless otherwise such changes and modifications depart from the scope of the present invention.

A transparent protective layer 964 for preventing moisture from penetrating into the light-emitting element is formed to cover the light-emitting element. As the transparent protective layer 964, a silicon nitride film, a silicon oxide film, a silicon oxynitride film (SiNO film (composition ratio of N>O) or SiON film (composition ratio of N<O), a thin film mainly containing carbon as its main component (for example, a DLC film or CN film), each of which is obtained by a sputtering method or a CVD method can be used.

According to the foregoing steps, a light-emitting display panel can be manufactured. A protective circuit for preventing electrostatic destruction, typically, a diode or the like can be provided between the connection terminal and the source wiring (gate wiring layer) or to the pixel portion. In that case, the diode can be operated by the same step as that of the foregoing TFT and by connecting a gate wiring layer of the pixel portion to the drain wiring layer or the source wiring layer of the diode.

Any of Embodiment Modes 1 to 10 can be applied to this example. In Examples 1 and 2, a liquid crystal display device and a light-emitting display device are, but not exclusively, explained as an example of the display device. The present invention can be appropriately applied to an active display panel such as DMD (Digital Micromirror Device), PDP (Plasma Display Panel), FED (Field Emission Display), or an electrophoresis display device (electron paper).

Example 4

A mode of a light-emitting element which is applicable to the forgoing examples is explained with reference to FIGS. 21A to 21F.

Figure 21A:
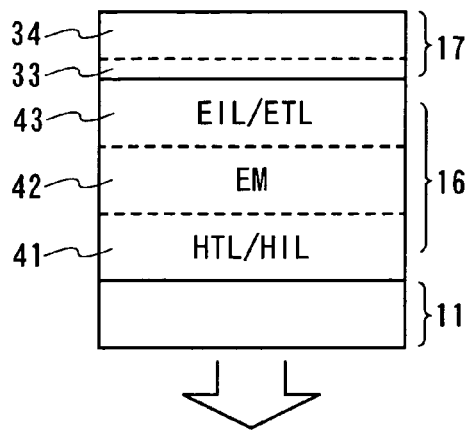
FIGS. 21A to 21F are explanatory views for showing a mode of a light-emitting element which can be adapted to the present invention.

FIG. 21A shows an example of forming a first pixel electrode 11 by a conductive film having a light transmitting property and a high work function and forming a second pixel electrode 17 by a conductive film having a low work function. The first pixel electrode 11 is made from an oxide conductive material having a light transmitting property, typically, an oxide conductive material containing a silicon oxide at a concentration of 1 to 15 atomic %. An electroluminescent layer 16 composed of a hole injecting or transporting layer 41, a light-emitting layer 42, an electron transporting or injecting layer 43 is formed over the first pixel electrode 11. The second pixel electrode 17 is composed of a first electrode layer 33 containing an alkali metal or an alkali earth metal such as LiF or MgAg and a second electrode layer 34 made from a metallic material such as aluminum. The pixel having such the structure can emit light from the first pixel electrode 11 side as indicated by arrow in the drawing.

Figure 21B:
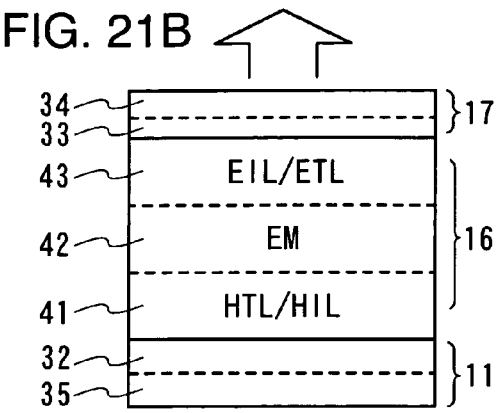

FIG. 21B shows an example of forming a first pixel electrode 11 by a conductive film having a high work function and forming a second pixel electrode 17 by a conductive film having a light transmitting property and a low work function. The first pixel electrode 11 is composed of a first electrode layer 35 made from metal such as aluminum or titanium, or metal and a metallic material containing nitrogen at a concentration of a stoichiometric composition ratio or less, and a second electrode layer 32 made from an oxide conductive material containing silicon oxide at a concentration of 1 to 15 atomic %. An electroluminescent layer 16 composed of a hole injecting or transporting layer 41, a light-emitting layer 42, an electron transporting or injecting layer 43 is formed over the first pixel electrode 11. The second pixel electrode 17 is composed of a third electrode layer 33 containing an alkali metal or an alkali earth metal such as LiF or CaF and a fourth electrode layer 34 made from a metallic material such as aluminum. By forming each the third electrode layer 33 and the fourth electrode layer 34 to have a thickness of 100 nm or less to make it possible to emit light, light can be emitted from the second electrode 17 side as indicated by arrow in the drawing.

Figure 21C:
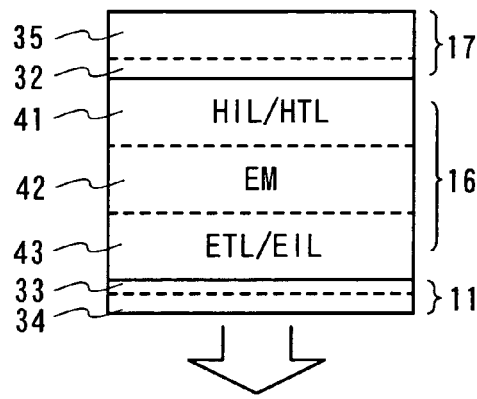

FIG. 21C shows an example of forming a first pixel electrode 11 by a conductive film having a light transmitting property and a low work function and forming a second pixel electrode 17 by a conductive film having a high work function. A structure of an electroluminescent layer is illustrated as a laminated structure formed by stacking sequentially an electron transporting or injecting layer 43, a light-emitting layer 42, and a hole injecting or transporting layer 41. The second pixel electrode 17 is composed of a second electrode layer 32 made from an oxide conductive material containing silicon oxide at a concentration of 1 to 15 atomic %, and a first electrode layer 35 made from metal such as aluminum or titanium, or metal and a metallic material containing nitrogen at a concentration of a stoichiometric composition ratio or less. The first pixel electrode 11 is composed of a third electrode layer 33 containing an alkali metal or an alkali earth metal such as LiF or CaF and a fourth electrode layer 34 made from a metallic material such as aluminum. By forming each the third electrode layer 33 and the fourth electrode layer 34 to have a thickness of 100 nm or less to make it possible to emit light, light can be emitted from the first electrode 11 side as indicated by an arrow in the drawing.

Figure 21D:
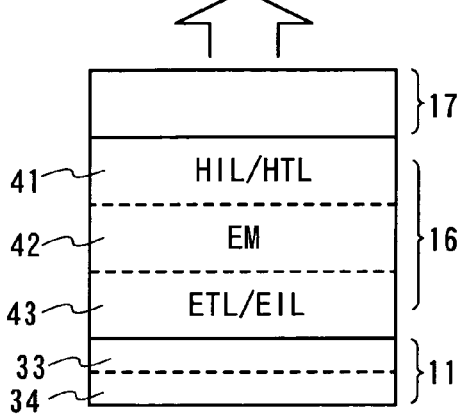

FIG. 21D shows an example of forming a first pixel electrode 11 by a conductive film having a low work function and forming a second pixel electrode 17 by a conductive film having a light transmitting property and a high work function. A structure of an electroluminescent layer is illustrated as a laminated structure formed by stacking sequentially an electron transporting or injecting layer 43, a light-emitting layer 42, and a hole injecting or transporting layer 41. The first pixel electrode 11 is formed to have the same structure as that illustrated in FIG. 21C and to have a thickness to make it possible that light generated in the electroluminescent layer can be transmitted to the first pixel electrode 11. The second pixel electrode 17 is made from an oxide conductive material containing silicon oxide at a concentration of 1 to 15 atomic %. By forming the hole injecting layer 41 by a metal oxide which is an inorganic material (typically, a molybdenum oxide or a vanadium oxide), oxygen which is introduced when forming the second electrode layer 32 is supplied and a hole injecting property is improved, accordingly, a drive voltage can be reduced in this structure. By forming the second electrode 17 by a conductive film having a light-transmitting property, light can be emitted from the second electrode 17 as indicated by an arrow.

Figure 21E:
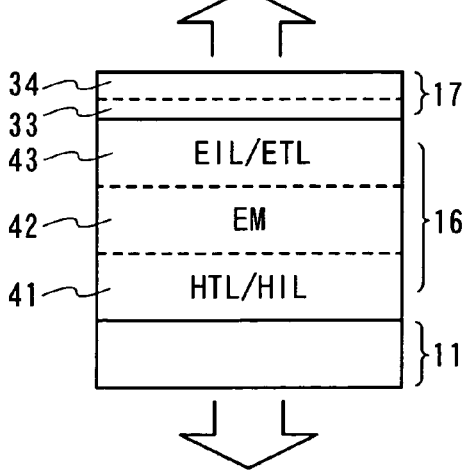

FIG. 21E shows an example of emitting light from both of a first electrode and a second electrode. A first pixel electrode 11 is formed by a conductive film having a light transmitting property and a high work function and a second pixel electrode 17 is formed by a conductive film having a light transmitting property and a low work function. Typically, the first pixel electrode 11 is made from an oxide conductive material including a silicon oxide at a concentration of 1 to 15 atomic % and the second electrode 17 is composed of a third electrode layer 33 containing an alkali metal or an alkali earth metal such as LiF or CaF with a thickness of 100 nm or less and a fourth electrode layer 34 made from a metallic material such as aluminum with a thickness of 100 nm or less. Accordingly, light can be emitted from both of the first pixel electrode 11 and the second pixel electrode 17 as indicated by an arrow in the drawing.

Figure 21F:
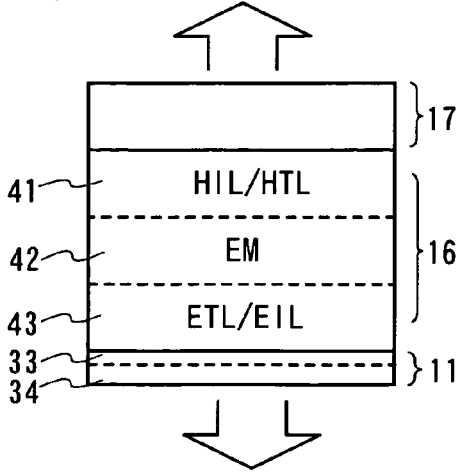

FIG. 21F shows an example of emitting light from both sides, that is, a first pixel electrode and a second pixel electrode. A first pixel electrode 11 is formed by a conductive film having a light transmitting property and a low work function and a second pixel electrode 17 is formed by a conductive film having a light transmitting property and a high work function. Typically, the first electrode 11 is composed of a third electrode layer 33 containing an alkali metal or an alkali earth metal such as LiF or CaF with a thickness of 100 nm or less and a fourth electrode layer 34 made from a metallic material such as aluminum with a thickness of 100 nm or less. The second pixel electrode 17 is made from an oxide conductive material containing a silicon oxide at a concentration of 1 to 15 atomic %.

Example 5

The above mentioned active matrix light-emitting device is considered as favorable since a TFT in each pixels enables the active matrix light-emitting device to operate at low drive voltage even if a pixel density is increased. On the other hand, a passive matrix light-emitting device provided with TFTs at row-by-row can be formed. The passive matrix light-emitting device has a high aperture ratio since a TFT is not provided in each pixel.

In a display device according to the present invention, a driving method for image display is not especially limited. For example, a dot sequential driving method, a line sequential driving method, or a plane sequential driving method can be used. Typically, a line sequential driving method is used, and time divisional gradation driving method or an area gradation driving method can be appropriately used. A video signal for being inputted to a source line of the display device can be either an analog signal or a digital signal. A driver circuit or the like can be appropriately designed according to the video signal.

As noted above, various kinds of pixel circuits can be adopted.

Example 6

In this example, the appearance of a light-emitting display panel is explained as an example of a display panel with reference to FIGS. 20A and 20B. FIG. 20A is a top view of a panel composed of sealed first and second substrates with a first sealing agent 1205 and a second sealing agent 1206. FIG. 20B is a cross-sectional view of FIG. 20A taken along A-A' and B-B'.

In FIG. 20A, reference numeral 1202 indicated by dotted line denotes a pixel portion, and 1203 denotes a scanning line (gate line) driver circuit. In this example, the pixel portion 1202 and the scanning line driver circuit 1203 are in a region sealed with the first sealing agent and the second sealing agent. Reference numeral 1201 is a signal line (source line) driver circuit which is formed by providing a chip like signal line driver circuit over a first substrate 1200. As the first sealing agent, epoxy resin having low viscosity including filler is preferably used. As the second sealing agent, epoxy resin having low viscosity is preferably used. The first sealing agent 1205 and the second sealing agent are preferably materials which do not transmit moisture and oxygen as much as possible.

A drying agent can be provided between the pixel portion 1202 and the sealing agent 1205. Further, a drying agent can be provided over a scanning line or a signal line in the pixel portion. As the drying agent, a material such as an oxide of an alkali earth metal which adsorbs water ($H_2O$) by chemical adsorption, for example, calcium oxide (CaO), barium oxide (BaO), or the like is preferably used. Besides, a material which adsorbs water by physical adsorption such as zeolite or silica gel can be used.

Resin having high moisture permeability including a granular drying agent can be fixed to the second substrate 1204. Instead of resin having high permeability, an inorganic material such as siloxane polymer, polyimide, PSG (phosphorous glass), and BPSG (phosphorous boron glass) can be used.

A drying agent can be provided in a region overlapped with the scanning line. Moreover, resin having high moisture permeability including a granular drying agent can be fixed to the second substrate. By providing these drying agents, moisture penetration into a display element can be prevented and deterioration due to the penetration can be restrained without reducing an aperture ratio. Therefore, variation of deterioration of a light-emitting element at a periphery portion and a central portion of the pixel portion 1202 can be restrained.

Reference numeral 1210 denotes a connection region for transmitting signals inputted to the signal line driver circuit 1201 and the scanning line driver circuit 1203. The connection region 1210 receives a video signal or a clock signal from an FPC (flexible printed wiring) 1209 via a connection wiring 1208.

A cross-sectional structure is explained with reference to FIG. 20B. A driver circuit and a pixel portion are formed over the first substrate 1200. The first substrate 1200 has a plurality of semiconductor elements as typified by a TFT. Further, a CMOS circuit formed by combining an n-channel TFT 1221 and a p-channel TFT 1222 is formed as the signal line driver circuit 1201.

In this example, the scanning line driver circuit and the TFT of the pixel portion are formed over one substrate. Therefore, volume of a light-emitting display device can be reduced.

The pixel portion 1202 is formed by a plurality of pixels including a switching TFT 1211, a drive TFT 1212, and a first pixel electrode (anode) 1213 formed by a conductive film having reflectivity which is electrically connected to a drain of the drive TFT 1212.

An insulator 1214 (which is also referred to as a bank, a partition wall, or the like) is formed at both edges of the first pixel electrode (anode) 1213. In order to improve coverage of a film formed over the insulator 1214, the insulator 1214 is formed to have a curved face having a curvature at its upper edge portion or its bottom edge portion. Further, the surface of the insulator 1214 can be covered by a protective film formed by an aluminum nitride film, an aluminum nitride oxide film, a thin film made from carbon as its main component, or a silicon nitride film. By using an organic material dispersed or dissolved with a material which absorbs visible light such as black pigment or a coloring matter, stray light from a light-emitting element which is formed afterward can be absorbed. As a result, contrast of each pixel is improved.

An electroluminescent layer 1215 is selectively formed by vapor deposition of an organic compound material over the first pixel electrode (anode) 1213. Moreover, a second pixel electrode (cathode) is formed over the electroluminescent layer 1215.

The electroluminescent layer 1215 can be formed to have appropriately a structure explained in Example 3.

Thus, a light-emitting element 1217 composed of the first pixel electrode (anode) 1213, the electroluminescent layer 1215, and a second pixel electrode (cathode) 1216 is formed. The light-emitting element 1217 emits light toward the second substrate 1204 side.

A protective laminated layer 1218 is formed to seal the light-emitting element 1217. The protective laminated layer is formed by a laminated layer composed of a first inorganic insulating film, a stress relieving film, and a second inorganic insulating film. Then, the protective laminated layer 1218 is bonded to the second substrate 1204 with a first sealing agent 1205 and a second sealing agent 1206. The second sealing agent is preferably delivered by drops by using a device for dropping a sealing agent. After coating the sealing agent over the active matrix substrate by delivering by drops or by discharging the sealing agent from a dispenser, the second substrate and the active matrix substrate are pasted with each other in vacuo, and sealed by hardening the sealing agent.

An antireflection film 1226 is formed to prevent outside light being reflected off the surface of the substrate. Further, either of both of a polarized plate and a retardation film can be provided between the second substrate and the antireflection film. By providing the retardation film and/or polarized plate 1225, outside light can be prevented from being reflected off the pixel electrode. In the case that the first pixel electrode 1213 and the second pixel electrode 1216 are formed by a conductive film having a light transmitting property or a conductive film having a semi-transmissive property, and the interlayer insulating film 1214 is formed by a material which absorbs visible light or an organic material dissolved or dispersed with a material which absorbs visible light, outside light is not reflected off each of the pixel electrode, accordingly, the retardation film and the polarized film are not required.

The connection wiring 1208 and the FPC 1209 are electrically connected to each other by an anisotropic conductive film or an anisotropic conductive resin 1227. Moreover, a connection of each wiring layer and a connection terminal is preferably sealed with a sealing resin. The structure can prevent penetration of moisture from a cross sectional portion into the light-emitting element to prevent deterioration of the light-emitting element due to the moisture.

Instead of the second sealing agent 1206, a space filled with an inert gas such as a nitride gas can be provided between the second substrate 1204 and the protective laminated layer 1218. Accordingly, moisture or oxygen can be efficiently prevented.

Further, a colored layer can be provided between the second substrate and the polarized plate 1225. In that case, full color display can be realized by providing a light-emitting element capable of emitting white emission in the pixel portion and by providing separately colored layers exhibiting red, green, and blue emission. Further, full color display can also be realized by providing a light-emitting element capable of emitting blue emission in the pixel portion and by providing separately a color conversion layer or the like. Moreover, light-emitting elements exhibiting red, green, and blue emission in pixel portions, respectively, and a colored layer can also be used. A display module having the foregoing structure has high color purity of each red, green, and blue emission and can provide high definition images.

A light-emitting display module can be formed by using a film substrate, a resin substrate, or the like for the first substrate 1200 or the second substrate 1204. When sealing without an opposing substrate as noted above, a display device can be further reduced its weight, size, and a thickness.

Moreover, a light-emitting display module can be formed by providing IC chips such as a controller, a memory, or a pixel driver circuit over a surface or at an edge of an FPC (flexible printed wiring) 1209 which serves as an external input terminal.

Further, any of Embodiment Modes 1 to 10 can be applied to this example. Examples of a liquid crystal display module and a light-emitting display module are illustrated as a display module. However, the present invention is not limited thereto. The present invention can be appropriately applied to a DMD (Digital Micromirror Device), a PDP (Plasma Display Panel), an FED (Field Emission Display), an electrophoretic device (electronic paper), or the like.

Example 7

As an electronic device installed with a display device as explained in the foregoing examples, a television set (also referred to as a TV, a television, or a television receiver), a camera (a video camera, a digital camera, or the like), a goggle type display, a navigation system, a sound reproduction device (a car audio, a component stereo set, or the like), a computer, a game machine, a personal digital assistant (a mobile computer, a cellular phone, a portable game machine, or a portable electronic book), an image reproduction device having a memory medium (specifically, a device which reproduces a recording medium such as a DVD (digital versatile disk), an HD DVD (High Definition DVD), or a Blue-Ray disk, and which has a display which displays images), and an electrical appliance having a display portion can be nominated. Specific examples of the electronic devices are illustrated in FIGS. 24A to 24F.

As an electronic device having a display device explained in the foregoing examples is a housing, a television set (also referred to as a TV, a television, or a television receiver), a camera such as a digital camera and a digital video camera, a cell-phone unit (also referred to as a cellular phone handset or a cellular phone), a personal digital assistant, a portable game machine, a monitor for a computer, a computer, a sound reproduction device such as a car audio, an image reproduction device having a recording medium such as a domestic game machine, or the like can be nominated. Specific examples are explained with reference to FIGS. 24A to 24F.

Figure 24A:
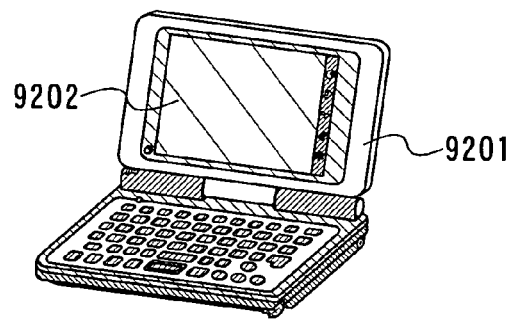
FIGS. 24A to 24F are explanatory views for showing examples of electronic devices.

A personal digital assistant shown in FIG. 24A is composed of a main body 9201, a display portion 9202, and the like. A display portion explained in Embodiment Modes 1 to 10, and Examples 1 to 8 can be applied to the display portion 9202. By using a display device which is one embodiment of the present invention, a personal digital assistant having high reliability can be provided at a low cost.

Figure 24B:
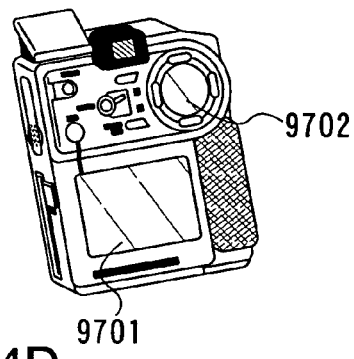

A digital video camera shown in FIG. 24B is composed of a display portion 9701, a display portion 9702, and the like. A display portion explained in Embodiment Modes 1 to 10, and Examples 1 to 8 can be applied to the display portion 9701. By using a display device which is one embodiment of the present invention, a digital video camera having high reliability can be provided at a low cost.

Figure 24C:
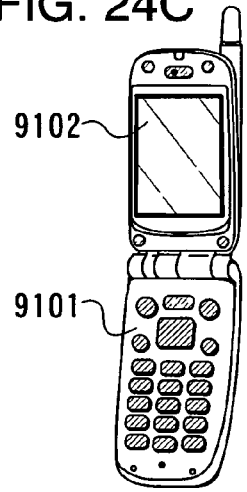

A portable terminal shown in FIG. 24C is composed of a main body 9101, a display portion 9102, and the like. A display portion explained in Embodiment Modes 1 to 10, and Examples 1 to 8 can be applied to the display portion 9102. By using a display device which is one embodiment of the present invention, a portable terminal having high reliability can be provided at a low cost.

Figure 24D:
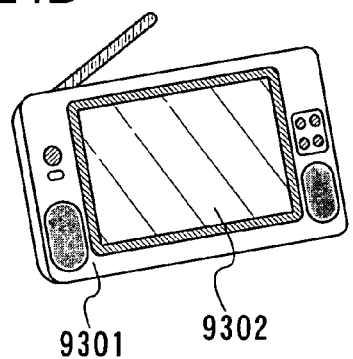

A portable television apparatus shown in FIG. 24D is composed of a main body 9301, a display portion 9302, and the like. A display portion explained in Embodiment Modes 1 to 10, and Examples 1 to 8 can be applied to the display portion 9302. By using a display device which is one embodiment of the present invention, a portable television apparatus having high reliability can be provided at a low cost. Such the television apparatus can be widely applied to a small sized television which is installed in a portable terminal such as a cellular phone, a middle sized television which is be portable, or a large sized television (for example, 40 inches or more).

Figure 24E:
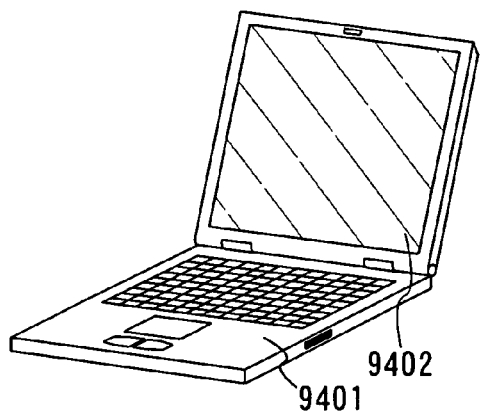

A laptop computer shown in FIG. 24E is composed of a main body 9401, a display portion 9402, and the like. A display portion explained in Embodiment Modes 1 to 10, and Examples 1 to 8 can be applied to the display portion 9402. By using a display device which is one embodiment of the present invention, a laptop computer having high reliability can be provided at a low cost.

Figure 24F:
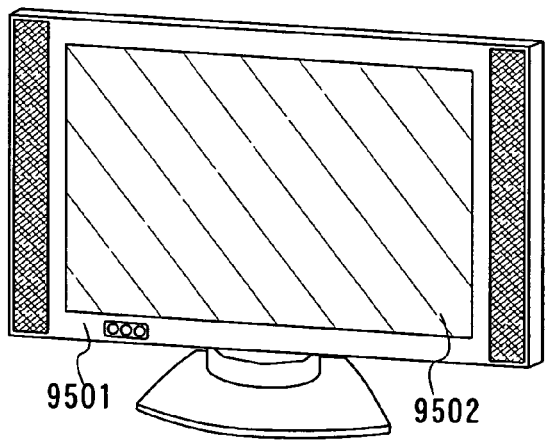

A television apparatus shown in FIG. 24F is composed of a main body 9501, a display portion 9502, and the like. A display portion explained in Embodiment Modes 1 to 10, and Examples 1 to 8 can be applied to the display portion 9502. By using a display device which is one embodiment of the present invention, a television apparatus having high reliability can be provided at a low cost.

Among the foregoing electronic devices, an electronic device using a secondary battery can reduce power consumption and can increase the life itself, and so it does not require charging the secondary battery.

Besides the foregoing electronic devices, the present invention can be used for a front or rear projector.

As noted above, an applicable range of the present invention is extremely large, and so the present invention can be applied to various kinds of electronic devices.

EXPLANATION OF REFERENCE

101: substrate; 102a: first conductive film; 102b: second conductive film; 102: gate electrode; 103: first insulating film; 104: second insulating film; 105: first semiconductor film; 106: layer including a catalytic element; 111: first crystalline semiconductor film; 112: second semiconductor film; 121: second crystalline semiconductor film; 122: third crystalline semiconductor film; 131: first semiconductor region; 132: second semiconductor region; 133: third conductive film (source electrode, drain electrode); 140: third insulating film; 141: third semiconductor region (channel formation region); 142: source region, drain region; and 144: fourth insulating film.

What is claimed is:
1. A method for manufacturing a semiconductor device comprising the steps of:
    forming a first conductive layer made from aluminum as its main component by a sputtering method over a substrate;
    forming a second conductive layer made from a material different from that used for forming the first conductive layer over the first conductive layer, the second conductive layer having a higher heat-resistance property than the heat-resistance property of the first conductive layer;
    forming a gate electrode by patterning the first conductive layer and the second conductive layer;
    forming a gate insulating film over the gate electrode;
    forming a first semiconductor film over the gate insulating film;
    crystallizing the first semiconductor film by heating the first semiconductor film after introducing a catalytic element into the first semiconductor film;
    depositing a second semiconductor film including a first impurity element over the first semiconductor film;
    heating the first semiconductor film and the second semiconductor film, thereby gettering the catalytic element and a metal element mixed into the first semiconductor film in the step of forming the first semiconductor film;
    forming an island-shaped semiconductor region by patterning the first semiconductor film and the second semiconductor film;
    forming a third conductive layer over the island-shaped semiconductor region;
    forming a source electrode and a drain electrode by patterning the third conductive layer; and
    exposing a part of the first semiconductor film and forming a source region and a drain region within the island-shaped semiconductor region by etching the second semiconductor film with the source electrode and the drain electrode as masks within the island-shaped semiconductor region,
    wherein the first conductive layer includes carbon, and
    wherein the carbon of 0.1 to 10 atomic % is included.

2. The method for manufacturing a semiconductor device according to claim 1, wherein the first impurity element is one or more selected from phosphorus, nitrogen, arsenic, antimony, and bismuth.

3. The method for manufacturing a semiconductor device according to claim 1, wherein the catalytic element is one or more selected from tungsten, molybdenum, zirconium, hafnium, niobium, tantalum, chromium, cobalt, nickel, and platinum.

4. The method for manufacturing a semiconductor device according to claim 1, wherein the second conductive layer is made from one or more of chromium, tantalum, tungsten, molybdenum, titanium, nickel, or nitride of the foregoing element.

5. An EL television having the semiconductor device manufactured according to claim 1.

6. A liquid crystal television having the semiconductor device manufactured according to claim 1.

7. The method for manufacturing a semiconductor device according to claim 1, wherein each of the source electrode and the drain electrode has an edge portion having an angle which is more than 90° and less than 180°.

8. The method for manufacturing a semiconductor device according to claim 1, wherein each of the source electrode and the drain electrode has an edge portion having an angle which is more than 0° and less than 90°.

9. The method for manufacturing a semiconductor device according to claim 1, wherein the second semiconductor film is deposited by a CVD method.

10. The method for manufacturing a semiconductor device according to claim 1, further comprising a step of:
oxidizing a side face of the first conductive layer, after forming the second conductive layer.

11. A method for manufacturing a semiconductor device comprising the steps of:
forming a first conductive layer made from aluminum as its main component by a sputtering method over a substrate;
forming a second conductive layer made from a material different from that used for forming the first conductive layer over the first conductive layer, the second conductive layer having a higher heat-resistance property than the heat-resistance property of the first conductive layer;
forming a gate electrode by patterning the first conductive layer and the second conductive layer;
forming a gate insulating film over the gate electrode;
forming a first semiconductor film over the gate insulating film;
crystallizing the first semiconductor film by heating the first semiconductor film after introducing a catalytic element into the first semiconductor film;
depositing a second semiconductor film including a first impurity element over the first semiconductor film;
heating the first semiconductor film and the second semiconductor film, thereby gettering the catalytic element and a metal element mixed into the first semiconductor film in the step of forming the first semiconductor film;
forming an island-shaped semiconductor region by patterning the first semiconductor film and the second semiconductor film;
forming a source region and a drain region by etching the second semiconductor film in the island-shaped semiconductor region; and
forming a source electrode and a drain electrode on the source region and the drain region,
wherein the first conductive layer includes carbon, and
wherein the carbon of 0.1 to 10 atomic % is included.

12. The method for manufacturing a semiconductor device according to claim 11, wherein the first impurity element is one or more selected from phosphorus, nitrogen, arsenic, antimony, and bismuth.

13. The method for manufacturing a semiconductor device according to claim 11, wherein the catalytic element is one or more selected from tungsten, molybdenum, zirconium, hafnium, vanadium, niobium, tantalum, chromium, cobalt, nickel, and platinum.

14. The method for manufacturing a semiconductor device according to claim 11, wherein the second conductive layer is made from one or more of chromium, tantalum, tungsten, molybdenum, titanium, nickel, or nitride of the foregoing element.

15. An EL television having the semiconductor device manufactured according to claim 11.

16. A liquid crystal television having the semiconductor device manufactured according to claim 11.

17. The method for manufacturing a semiconductor device according to claim 11, wherein each of the source electrode and the drain electrode has an edge portion having an angle which is more than 90° and less than 180°.

18. The method for manufacturing a semiconductor device according to claim 11, wherein each of the source electrode and the drain electrode has an edge portion having an angle which is more than 0° and less than 90°.

19. The method for manufacturing a semiconductor device according to claim 11, wherein the second semiconductor film is deposited by a CVD method.

20. The method for manufacturing a semiconductor device according to claim 11, further comprising a step of:
oxidizing a side face of the first conductive layer, after forming the second conductive layer.

21. A method for manufacturing a semiconductor device comprising the steps of:
forming a first conductive layer made from aluminum as its main component by a sputtering method over a substrate;
forming a second conductive layer made from a material different from that used for forming the first conductive layer over the first conductive layer, the second conductive layer having a higher heat-resistance property than the heat-resistance property of the first conductive layer;
forming a gate electrode by patterning the first conductive layer and the second conductive layer;
forming a gate insulating film over the gate electrode;
forming a first semiconductor film over the gate insulating film;
crystallizing the first semiconductor film by heating the first semiconductor film after introducing a catalytic element into the first semiconductor film;
depositing a second semiconductor film including a rare gas element over the first semiconductor film;
heating the first semiconductor film and the second semiconductor film, thereby gettering the catalytic element and a metal element mixed into the first semiconductor film in the step of forming the first semiconductor film;
removing the second semiconductor film;
forming a third semiconductor film having conductivity over the first semiconductor film;
forming an island-shaped semiconductor region by patterning the first semiconductor film and the third semiconductor film;
forming a third conductive layer over the island-shaped semiconductor region;
forming a source electrode and a drain electrode by etching a part of the third conductive layer; and exposing a part of the first semiconductor film, and forming a source region and a drain region within the island-shaped semiconductor region by etching the second semiconductor film with the source electrode and the drain electrode as masks, wherein the first conductive layer includes carbon, and wherein the carbon of 0.1 to 10 atomic % is included.

22. The method for manufacturing a semiconductor device according to claim 21, wherein the rare gas element is one or more selected from He, Ne, Ar, Kr, and Xe.

23. The method for manufacturing a semiconductor device according to claim 21, wherein the catalytic element is one or more selected from tungsten, molybdenum, zirconium, hafnium, niobium, tantalum, chromium, cobalt, nickel, and platinum.

24. The method for manufacturing a semiconductor device according to claim 21, wherein the second conductive layer is made from one or more of chromium, tantalum, tungsten, molybdenum, titanium, nickel, or nitride of the foregoing element.

25. An EL television having the semiconductor device manufactured according to claim 21.

26. A liquid crystal television having the semiconductor device manufactured according to claim 21.

27. The method for manufacturing a semiconductor device according to claim 21, wherein each of the source electrode and the drain electrode has an edge portion having an angle which is more than 90° and less than 180°.

28. The method for manufacturing a semiconductor device according to claim 21, wherein each of the source electrode and the drain electrode has an edge portion having an angle which is more than 0° and less than 90°.

29. The method for manufacturing a semiconductor device according to claim 21, wherein the second semiconductor film is deposited by a CVD method.

30. The method for manufacturing a semiconductor device according to claim 21, further comprising a step of:
oxidizing a side face of the first conductive layer, after forming the second conductive layer.

31. A method for manufacturing a semiconductor device comprising the steps of:
forming a first conductive layer made from aluminum as its main component by a sputtering method over a substrate;
forming a second conductive layer made from a material different from that used for forming the first conductive layer over the first conductive layer, the second conductive layer having a higher heat-resistance property than the heat-resistance property of the first conductive layer;
forming a gate electrode by patterning the first conductive layer and the second conductive layer;
forming a gate insulating film over the gate electrode;
forming a first semiconductor film over the gate insulating film;
crystallizing the first semiconductor film by heating the first semiconductor film after introducing a catalytic element into the first semiconductor film;
depositing a second semiconductor film including a rare gas element over the first semiconductor film;
heating the first semiconductor film and the second semiconductor film, thereby gettering the catalytic element and a metal element mixed into the first semiconductor film in the step of forming the first semiconductor film;
removing the second semiconductor film;
forming a third semiconductor film having conductivity over the first semiconductor film;

forming an island-shaped semiconductor region by patterning the first semiconductor film and the third semiconductor film;
forming a source region and a drain region by etching the third semiconductor film in the island-shaped semiconductor region; and
forming a source electrode and a drain electrode on the source region and the drain region,
wherein the first conductive layer includes carbon, and wherein the carbon of 0.1 to 10 atomic % is included.

32. The method for manufacturing a semiconductor device according to claim 31, wherein the rare gas element is one or more selected from He, Ne, Ar, Kr, and Xe.

33. The method for manufacturing a semiconductor device according to claim 31, wherein the catalytic element is one or more selected from tungsten, molybdenum, zirconium, hafnium, niobium, tantalum, chromium, cobalt, nickel, and platinum.

34. The method for manufacturing a semiconductor device according to claim 31, wherein the second conductive layer is made from one or more of chromium, tantalum, tungsten, molybdenum, titanium, nickel, or nitride of the foregoing element.

35. An EL television having the semiconductor device manufactured according to claim 31.

36. A liquid crystal television having the semiconductor device manufactured according to claim 31.

37. The method for manufacturing a semiconductor device according to claim 31, wherein each of the source electrode and the drain electrode has an edge portion having an angle which is more than 90° and less than 180°.

38. The method for manufacturing a semiconductor device according to claim 31, wherein each of the source electrode and the drain electrode has an edge portion having an angle which is more than 0° and less than 90°.

39. The method for manufacturing a semiconductor device according to claim 31, wherein the second semiconductor film is deposited by a CVD method.

40. The method for manufacturing a semiconductor device according to claim 31, further comprising a step of:
oxidizing a side face of the first conductive layer, after forming the second conductive layer.

41. A method for manufacturing a semiconductor device comprising the steps of:
forming a first conductive layer made from aluminum as its main component by a sputtering method over a substrate;
forming a second conductive layer made from a material different from that used for forming the first conductive layer over the first conductive layer, the second conductive layer having a higher heat-resistance property than the heat-resistance property of the first conductive layer;
forming a first gate electrode and a second gate electrode by patterning the first conductive layer and the second conductive layer;
forming a gate insulating film over the first gate electrode and the second gate electrode;
forming a first semiconductor film over the gate insulating film;
crystallizing the first semiconductor film by heating the first semiconductor film after introducing a catalytic element into the first semiconductor film;
depositing a second semiconductor film including a first impurity element over the first semiconductor film;
heating the first semiconductor film and the second semiconductor film, thereby gettering the catalytic element and a metal element mixed into the first semiconductor film in the step of forming the first semiconductor film;

forming a first island-shaped semiconductor region and a second island-shaped semiconductor region by patterning the first semiconductor film and the second semiconductor film;

doping selectively a second impurity element after covering the first island-shaped semiconductor region with a first mask and covering a part of the second island-shaped semiconductor region with a second mask;

removing the first mask and the second mask;

forming a third conductive layer over the first island-shaped semiconductor region and the second island-shaped semiconductor region;

forming a source electrode and a drain electrode, each of which has contact with the second semiconductor film of the first island-shaped semiconductor region, and a source electrode and a drain electrode, each of which has contact with the second semiconductor film of the second island-shaped semiconductor region by patterning the third conductive layer;

forming a first source region and first drain region by etching an exposed portion of the second semiconductor film of the first island-shaped semiconductor region; and forming a second source region and a second drain region by etching an exposed portion of the second semiconductor film of the second island-shaped semiconductor region, wherein the first conductive layer includes carbon, and wherein the carbon of 0.1 to 10 atomic % is included.

42. The method for manufacturing a semiconductor device according to claim 41, wherein the first impurity element is one or more selected from phosphorus, nitrogen, arsenic, antimony, and bismuth.

43. The method for manufacturing a semiconductor device according to claim 41, wherein the second impurity element is boron.

44. The method for manufacturing a semiconductor device according to claim 41, wherein the catalytic element is one or more selected from tungsten, molybdenum, zirconium, hafnium, niobium, tantalum, chromium, cobalt, nickel, and platinum.

45. The method for manufacturing a semiconductor device according to claim 41, wherein the second conductive layer is made from one or more of chromium, tantalum, tungsten, molybdenum, titanium, nickel, or nitride of the foregoing element.

46. An EL television having the semiconductor device manufactured according to claim 41.

47. A liquid crystal television having the semiconductor device manufactured according to claim 41.

48. The method for manufacturing a semiconductor device according to claim 41, wherein each of the source electrode and the drain electrode has an edge portion having an angle which is more than 90° and less than 180°.

49. The method for manufacturing a semiconductor device according to claim 41, wherein each of the source electrode and the drain electrode has an edge portion having an angle which is more than 0° and less than 90°.

50. The method for manufacturing a semiconductor device according to claim 41, wherein the second semiconductor film is deposited by a CVD method.

51. The method for manufacturing a semiconductor device according to claim 41, further comprising a step of:

oxidizing a side face of the first conductive layer, after forming the second conductive layer.

52. A method for manufacturing a semiconductor device comprising the steps of:

forming a first conductive layer made from aluminum as its main component by a sputtering method over a substrate;

forming a second conductive layer made from a material different from that used for forming the first conductive layer over the first conductive layer, the second conductive layer having a higher heat-resistance property than the heat-resistance property of the first conductive layer;

forming a first gate electrode and a second gate electrode by patterning the first conductive layer and the second conductive layer;

forming a gate insulating film over the first gate electrode and the second gate electrode;

forming a first semiconductor film over the gate insulating film;

crystallizing the first semiconductor film by heating the first semiconductor film after introducing a catalytic element into the first semiconductor film;

depositing a second semiconductor film including a first impurity element over the first semiconductor film;

heating the first semiconductor film and the second semiconductor film, thereby gettering the catalytic element and a metal element mixed into the first semiconductor film in the step of forming the first semiconductor film;

forming a first island-shaped semiconductor region and a second island-shaped semiconductor region by patterning the first semiconductor film and the second semiconductor film;

doping selectively a second impurity element after covering the first island-shaped semiconductor region with a first mask and covering a part of the second island-shaped semiconductor region with a second mask;

removing the first mask and the second mask;

forming a first source region and a first drain region by etching the second semiconductor film in the first island-shaped semiconductor region, simultaneously, forming a second source region and a second drain region by etching the second semiconductor film in the second island-shaped semiconductor region; and forming a first source electrode and a first drain electrode on the first source region and the first drain region, simultaneously, forming a second source electrode and a second drain electrode on the second source region and the second drain region, wherein the first conductive layer includes carbon, and wherein the carbon of 0.1 to 10 atomic % is included.

53. The method for manufacturing a semiconductor device according to claim 52, wherein the first impurity element is one or more selected from phosphorus, nitrogen, arsenic, antimony, and bismuth.

54. The method for manufacturing a semiconductor device according to claim 52, wherein the second impurity element is boron.

55. The method for manufacturing a semiconductor device according to claim 52, wherein the catalytic element is one or more selected from tungsten, molybdenum, zirconium, hafnium, niobium, tantalum, chromium, cobalt, nickel, and platinum.

56. The method for manufacturing a semiconductor device according to claim 52, wherein the second conductive layer is made from one or more of chromium, tantalum, tungsten, molybdenum, titanium, nickel, or nitride of the foregoing element.

57. An EL television having the semiconductor device manufactured according to claim 52.

58. A liquid crystal television having the semiconductor device manufactured according to claim 52.

59. The method for manufacturing a semiconductor device according to claim 52, wherein each of the first source electrode and the first drain electrode has an edge portion having an angle which is more than 90° and less than 180°.

60. The method for manufacturing a semiconductor device according to claim 52, wherein each of the first source electrode and the first drain electrode has an edge portion having an angle which is more than 0° and less than 90°.

61. The method for manufacturing a semiconductor device according to claim 52, wherein the second semiconductor film is deposited by a CVD method.

62. The method for manufacturing a semiconductor device according to claim 52, further comprising a step of:
  oxidizing a side face of the first conductive layer, after forming the second conductive layer.

63. A method for manufacturing a semiconductor device comprising the steps of:
  forming a first conductive layer made from aluminum as its main component by a sputtering method over a substrate;
  forming a second conductive layer made from a material different from that used for forming the first conductive layer over the first conductive layer, the second conductive layer having a higher heat-resistance property than the heat-resistance property of the first conductive layer;
  forming a first gate electrode and a second gate electrode by patterning the first conductive layer and the second conductive layer;
  forming a gate insulating film over the first gate electrode and the second gate electrode;
  forming a first semiconductor film over the gate insulating film;
  crystallizing the first semiconductor film by heating the first semiconductor film after introducing a catalytic element into the first semiconductor film;
  forming a second semiconductor film including a rare gas element over the first semiconductor film;
  heating the first semiconductor film and the second semiconductor film, thereby gettering the catalytic element and a metal element mixed into the first semiconductor film in the step of forming the first semiconductor film;
  removing the second semiconductor film;
  forming a first island-shaped semiconductor region and a second island-shaped semiconductor region by patterning the first semiconductor film;
  doping selectively a first impurity element after covering a part of the first island-shaped semiconductor region with a first mask and covering the second island-shaped semiconductor region with a second mask;
  removing the first mask and the second mask;
  doping selectively a second impurity element after covering the first island-shaped semiconductor region with a third mask and covering a part of the second island-shaped semiconductor region with a fourth mask;
  removing the third mask and the fourth mask;
  forming a third conducive layer over the first island-shaped semiconductor region and the second island-shaped semiconductor region; and
  forming a source electrode and a drain electrode, each of which has contact with the first island-shaped semiconductor region, and a source electrode and a drain electrode, each of which has contact with the second island-shaped semiconductor region by patterning the third conductive layer,
  wherein the first conductive layer includes carbon, and
  wherein the carbon of 0.1 to 10 atomic % is included.

64. The method for manufacturing a semiconductor device according to claim 63, wherein the rare gas element is one or more selected from He, Ne, Ar, Kr, and Xe.

65. The method for manufacturing a semiconductor device according to claim 63, wherein the first impurity element is one or more selected from phosphorus, nitrogen, arsenic, antimony, and bismuth.

66. The method for manufacturing a semiconductor device according to claim 63, wherein the second impurity element is boron.

67. The method for manufacturing a semiconductor device according to claim 63, wherein the catalytic element is one or more selected from tungsten, molybdenum, zirconium, hafnium, niobium, tantalum, chromium, cobalt, nickel, and platinum.

68. The method for manufacturing a semiconductor device according to claim 63, wherein the second conductive layer is made from one or more of chromium, tantalum, tungsten, molybdenum, titanium, nickel, or nitride of the foregoing element.

69. An EL television having the semiconductor device manufactured according to claim 63.

70. A liquid crystal television having the semiconductor device manufactured according to claim 63.

71. The method for manufacturing a semiconductor device according to claim 63, wherein each of the source electrode and the drain electrode has an edge portion having an angle which is more than 90° and less than 180°.

72. The method for manufacturing a semiconductor device according to claim 63, wherein each of the source electrode and the drain electrode has an edge portion having an angle which is more than 0° and less than 90°.

73. The method for manufacturing a semiconductor device according to claim 63, wherein the second semiconductor film is deposited by a CVD method.

74. The method for manufacturing a semiconductor device according to claim 63, further comprising a step of:
  oxidizing a side face of the first conductive layer, after forming the second conductive layer.

75. A method for manufacturing a semiconductor device comprising the steps of:
  forming a first conductive layer made from aluminum as its main component by a sputtering method over a substrate;
  forming a second conductive layer made from a material different from that used for forming the first conductive layer over the first conductive layer, the second conductive layer having a higher heat-resistance property than the heat-resistance property of the first conductive layer;
  forming a first gate electrode and a second gate electrode by patterning the first conductive layer and the second conductive layer;
  forming a gate insulating film over the first gate electrode and the second gate electrode;
  forming a first semiconductor film over the gate insulating film;
  crystallizing the first semiconductor film by heating the first semiconductor film after introducing a catalytic element into the first semiconductor film;
  depositing a second semiconductor film including a first impurity element over the first semiconductor film;
  heating the first semiconductor film and the second semiconductor film, thereby gettering the catalytic element and a metal element mixed into the first semiconductor film in the step of forming the first semiconductor film;

forming a first island-shaped semiconductor region and a second island-shaped semiconductor region by patterning the first semiconductor film and the second semiconductor film;
doping a second impurity element into the second island-shaped semiconductor region after covering the first island-shaped semiconductor region with a mask;
removing the mask;
forming a third conductive layer over the first island-shaped semiconductor region and the second island-shaped semiconductor region;
forming a source electrode and a drain electrode, each of which has contact with the second semiconductor film of the first island-shaped semiconductor region, and a source electrode and a drain electrode, each of which has contact with the second semiconductor film of the second island-shaped semiconductor region by patterning the third conductive layer; and
forming a source region and a drain region by etching an exposed portion of the second semiconductor film of the first island-shaped semiconductor region and an exposed portion of the second semiconductor film of the second island-shaped semiconductor region,
wherein the first conductive layer includes carbon, and
wherein the carbon of 0.1 to 10 atomic % is included.

76. The method for manufacturing a semiconductor device according to claim 75, wherein the first impurity element is one or more selected from phosphorus, nitrogen, arsenic, antimony, and bismuth.

77. The method for manufacturing a semiconductor device according to claim 75, wherein the second impurity element is boron.

78. The method for manufacturing a semiconductor device according to claim 75, wherein the catalytic element is one or more selected from tungsten, molybdenum, zirconium, hafnium, niobium, tantalum, chromium, cobalt, nickel, and platinum.

79. The method for manufacturing a semiconductor device according to claim 75, wherein the second conductive layer is made from one or more of chromium, tantalum, tungsten, molybdenum, titanium, nickel, or nitride of the foregoing element.

80. An EL television having the semiconductor device manufactured according to claim 75.

81. A liquid crystal television having the semiconductor device manufactured according to claim 75.

82. The method for manufacturing a semiconductor device according to claim 75, wherein each of the source electrode and the drain electrode has an edge portion having an angle which is more than 90° and less than 180°.

83. The method for manufacturing a semiconductor device according to claim 75, wherein each of the source electrode and the drain electrode has an edge portion having an angle which is more than 0° and less than 90°.

84. The method for manufacturing a semiconductor device according to claim 75, wherein the second semiconductor film is deposited by a CVD method.

85. The method for manufacturing a semiconductor device according to claim 75, further comprising a step of:
oxidizing a side face of the first conductive layer, after forming the second conductive layer.

86. A method for manufacturing a semiconductor device comprising the steps of:
forming a first conductive layer made from aluminum as its main component by a sputtering method over a substrate;
forming a second conductive layer made from a material different from that used for forming the first conductive layer over the first conductive layer, the second conductive layer having a higher heat-resistance property than the heat-resistance property of the first conductive layer;
forming a first gate electrode and a second gate electrode by patterning the first conductive layer and the second conductive layer;
forming a gate insulating film over the first gate electrode and the second gate electrode;
forming a first semiconductor film over the gate insulating film;
crystallizing the first semiconductor film by heating the first semiconductor film after introducing a catalytic element into the first semiconductor film;
depositing a second semiconductor film including a first impurity element over the first semiconductor film;
heating the first semiconductor film and the second semiconductor film, thereby gettering the catalytic element and a metal element mixed into the first semiconductor film in the step of forming the first semiconductor film;
forming a first island-shaped semiconductor region and a second island-shaped semiconductor region by patterning the first semiconductor film and the second semiconductor film;
doping a second impurity element into the second island-shaped semiconductor region after covering the first island-shaped semiconductor region with a mask;
removing the mask;
forming a first source region and a first drain region by etching the second semiconductor film in the first island-shaped semiconductor region, simultaneously, forming a second source region and a second drain region by etching the second semiconductor film in the second island-shaped semiconductor region; and
forming a first source electrode and a first drain electrode on the first source region and the first drain region, simultaneously, forming a second source electrode and a second drain electrode on the second source region and the second drain region,
wherein the first conductive layer includes carbon, and
wherein the carbon of 0.1 to 10 atomic % is included.

87. The method for manufacturing a semiconductor device according to claim 86, wherein the first impurity element is one or more selected from phosphorus, nitrogen, arsenic, antimony, and bismuth.

88. The method for manufacturing a semiconductor device according to claim 86, wherein the second impurity element is boron.

89. The method for manufacturing a semiconductor device according to claim 86, wherein the catalytic element is one or more selected from tungsten, molybdenum, zirconium, hafnium, niobium, tantalum, chromium, cobalt, nickel, and platinum.

90. The method for manufacturing a semiconductor device according to claim 86, wherein the second conductive layer is made from one or more of chromium, tantalum, tungsten, molybdenum, titanium, nickel, or nitride of the foregoing element.

91. An EL television having the semiconductor device manufactured according to claim 86.

92. A liquid crystal television having the semiconductor device manufactured according to claim 86.

93. The method for manufacturing a semiconductor device according to claim 86, wherein each of the first source electrode and the first drain electrode has an edge portion having an angle which is more than 90° and less than 180°.

94. The method for manufacturing a semiconductor device according to claim 86, wherein each of the first source electrode and the first drain electrode has an edge portion having an angle which is more than 0° and less than 90°.

95. The method for manufacturing a semiconductor device according to claim 86, wherein the second semiconductor film is deposited by a CVD method.

96. The method for manufacturing a semiconductor device according to claim 86, further comprising a step of:
oxidizing a side face of the first conductive layer, after forming the second conductive layer.

97. A method for manufacturing a semiconductor device comprising the steps of:
forming a first conductive layer made from aluminum as its main component by a sputtering method over a substrate;
forming a second conductive layer made from a material different from that used for forming the first conductive layer over the first conductive layer, the second conductive layer having a higher heat-resistance property than the heat-resistance property of the first conductive layer;
forming a gate electrode by patterning the first conductive layer and the second conductive layer;
forming a gate insulating film over the gate electrode;
forming a first semiconductor film over the gate insulating film;
crystallizing the first semiconductor film by heating the first semiconductor film after introducing a catalytic element into the first semiconductor film;
depositing a second semiconductor film over the first semiconductor film;
heating the first semiconductor film and the second semiconductor film, thereby gettering the catalytic element and a metal element mixed into the first semiconductor film in the step of forming the first semiconductor film; and
forming an island-shaped semiconductor region by patterning the first semiconductor film and the second semiconductor film,
wherein the first conductive layer includes carbon, and
wherein the carbon of 0.1 to 10 atomic % is included.

98. The method for manufacturing a semiconductor device according to claim 97, wherein the catalytic element is one or more selected from tungsten, molybdenum, zirconium, hafnium, niobium, tantalum, chromium, cobalt, nickel, and platinum.

99. The method for manufacturing a semiconductor device according to claim 97, wherein the second conductive layer is made from one or more of chromium, tantalum, tungsten, molybdenum, titanium, nickel, or nitride of the foregoing element.

100. An EL television having the semiconductor device manufactured according to claim 97.

101. A liquid crystal television having the semiconductor device manufactured according to claim 97.

102. The method for manufacturing a semiconductor device according to claim 97, wherein the second semiconductor film is deposited by a CVD method.

103. The method for manufacturing a semiconductor device according to claim 97, further comprising a step of:
oxidizing a side face of the first conductive layer, after forming the second conductive layer.

* * * * *